(12) United States Patent
Campiglio et al.

(10) Patent No.: US 10,620,279 B2
(45) Date of Patent: Apr. 14, 2020

(54) MAGNETORESISTANCE ELEMENT WITH INCREASED OPERATIONAL RANGE

(71) Applicant: Allegro MicroSystems, LLC, Manchester, MA (US)

(72) Inventors: Paolo Campiglio, Arcueil (FR); Jeffrey Eagen, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 219 days.

(21) Appl. No.: 15/600,186

(22) Filed: May 19, 2017

(65) Prior Publication Data

US 2018/0335484 A1    Nov. 22, 2018

(51) Int. Cl.
*G01R 33/09* (2006.01)
*G01R 33/00* (2006.01)

(52) U.S. Cl.
CPC ....... *G01R 33/093* (2013.01); *G01R 33/0005* (2013.01); *G01R 33/098* (2013.01)

(58) Field of Classification Search
CPC .. G01R 33/098; G01R 33/093; G01R 33/096; G01R 33/09
See application file for complete search history.

(56) References Cited

U.S. PATENT DOCUMENTS

| 5,282,104 A | 1/1994 | Coutellier et al. |
| 5,677,625 A | 10/1997 | Dieny |
| 5,686,838 A | 11/1997 | van den Berg |
| 5,821,517 A | 10/1998 | Fedeli et al. |
| 5,858,125 A | 1/1999 | Hasegawa |
| 5,895,727 A | 4/1999 | Hasegawa |
| 5,923,514 A | 7/1999 | Scott et al. |
| 5,933,306 A | 8/1999 | Santos et al. |

(Continued)

FOREIGN PATENT DOCUMENTS

| CN | 201622299 | 11/2010 |
| CN | 101900754 | 12/2010 |

(Continued)

OTHER PUBLICATIONS

U.S. Appl. No. 15/991,491, filed May 29, 2018, Lassalle-Balier et al.

(Continued)

*Primary Examiner* — Alesa Allgood
(74) *Attorney, Agent, or Firm* — Daly, Crowley, Mofford & Durkee, LLP

(57) ABSTRACT

A magnetoresistance element deposited upon a substrate includes a first stack portion having opposing first and second surfaces and including a first plurality of layers. The first stack portion has a first substantially linear response corresponding to an applied magnetic field over a first magnetic field strength range. The magnetoresistance element also includes a second stack portion having opposing first and second surfaces and including a second plurality of layers. The first surface of the second stack portion is disposed over the second surface of the first stack portion and the second stack portion has a second substantially linear response that is different than the first substantially linear response. The second substantially linear response corresponds to the applied magnetic field over a second magnetic field strength range.

39 Claims, 15 Drawing Sheets

(56) References Cited

U.S. PATENT DOCUMENTS

| | | |
|---|---|---|
| 6,013,365 A | 1/2000 | Dieny et al. |
| 6,026,355 A | 2/2000 | Rahman et al. |
| 6,069,476 A | 5/2000 | Vieux-Rochaz et al. |
| 6,094,330 A | 7/2000 | Criniti et al. |
| 6,141,197 A | 10/2000 | Kim et al. |
| 6,373,247 B1 | 4/2002 | Marx et al. |
| 6,429,640 B1 | 8/2002 | Daughton et al. |
| 6,462,641 B1 | 10/2002 | Dieny et al. |
| 6,473,275 B1 | 10/2002 | Gill |
| 6,490,140 B1 | 12/2002 | Mao et al. |
| 6,522,132 B1 | 2/2003 | Vieux-Rochaz et al. |
| 6,532,164 B2 | 3/2003 | Redon et al. |
| 6,549,382 B1 | 4/2003 | Gill |
| 6,556,390 B1 | 4/2003 | Mao et al. |
| 6,603,677 B2 | 8/2003 | Redon et al. |
| 6,738,236 B1 | 5/2004 | Mao et al. |
| 6,770,382 B1 | 8/2004 | Chang et al. |
| 7,095,596 B2 | 8/2006 | Schmollngruber et al. |
| 7,106,046 B2 | 9/2006 | Nagano et al. |
| 7,176,679 B2 | 2/2007 | Baragatti et al. |
| 7,288,931 B2 | 10/2007 | Granig et al. |
| 7,324,312 B2 | 1/2008 | Gill |
| 7,324,313 B2 | 1/2008 | Childress et al. |
| 7,342,753 B2 | 3/2008 | Gill |
| 7,394,247 B1 | 7/2008 | Guo et al. |
| 7,397,637 B2 | 7/2008 | Gill |
| 7,453,672 B2 | 11/2008 | Dieny et al. |
| 7,463,016 B2 | 12/2008 | Shoji |
| 7,472,004 B2 | 12/2008 | Hara et al. |
| 7,713,755 B1 | 5/2010 | Xiao et al. |
| 7,759,933 B2 | 7/2010 | Coillot et al. |
| 7,813,202 B2 | 10/2010 | Rodmacq et al. |
| 7,855,555 B2 | 12/2010 | Biziere et al. |
| 7,902,811 B2 | 3/2011 | Shoji |
| 7,944,205 B2 | 5/2011 | Fermon et al. |
| 7,944,736 B2 | 5/2011 | Dieny et al. |
| 7,999,338 B2 | 8/2011 | Zheng et al. |
| 8,093,886 B2 | 1/2012 | Okada et al. |
| 8,129,988 B2 | 3/2012 | Fermon et al. |
| 8,223,463 B2 | 7/2012 | Katada et al. |
| 8,279,666 B2 | 10/2012 | Dieny et al. |
| 8,487,701 B2 | 7/2013 | Boujamaa et al. |
| 8,513,944 B2 | 8/2013 | Rodmacq et al. |
| 8,542,072 B2 | 9/2013 | Dieny et al. |
| 8,624,590 B2 | 1/2014 | Dieny |
| 8,669,122 B2 | 3/2014 | Viala et al. |
| 8,779,764 B2 | 7/2014 | Meguro et al. |
| 8,836,317 B2 | 9/2014 | Kasajima |
| 8,847,589 B2 | 9/2014 | Walther et al. |
| 9,529,060 B2 | 12/2016 | Fermon et al. |
| 9,804,234 B2 | 10/2017 | Dressler et al. |
| 9,812,637 B2 | 11/2017 | Fermon et al. |
| 9,922,673 B2 | 3/2018 | Campiglio et al. |
| 2001/0030839 A1 | 10/2001 | Zhong et al. |
| 2002/0030489 A1 | 3/2002 | Lenssen et al. |
| 2002/0054463 A1 | 5/2002 | Mukoyama et al. |
| 2002/0061421 A1 | 5/2002 | Dieny |
| 2002/0105827 A1* | 8/2002 | Redon ............... B82Y 10/00 365/173 |
| 2002/0158626 A1 | 10/2002 | Shay et al. |
| 2002/0171417 A1 | 11/2002 | Schodlbauer |
| 2002/0186513 A1 | 12/2002 | Heinonen et al. |
| 2003/0020471 A1 | 1/2003 | Kohlstedt |
| 2003/0031894 A1 | 2/2003 | Lin et al. |
| 2003/0053266 A1 | 3/2003 | Dieny et al. |
| 2003/0053270 A1 | 3/2003 | Gill |
| 2003/0070497 A1 | 4/2003 | Kikuchi et al. |
| 2003/0184918 A1 | 10/2003 | Lin et al. |
| 2003/0218840 A1 | 11/2003 | Apel et al. |
| 2003/0226409 A1 | 12/2003 | Steele et al. |
| 2003/0235016 A1 | 12/2003 | Gill |
| 2004/0008454 A1 | 1/2004 | Gill |
| 2004/0056647 A1 | 3/2004 | Stauth et al. |
| 2004/0056654 A1 | 3/2004 | Goldfine et al. |
| 2004/0170055 A1* | 9/2004 | Albert ............... G11C 11/16 365/173 |
| 2004/0207035 A1 | 10/2004 | Witcraft et al. |
| 2004/0263157 A1 | 12/2004 | Sudo et al. |
| 2006/0038407 A1 | 2/2006 | Shelley et al. |
| 2006/0077598 A1 | 4/2006 | Taylor et al. |
| 2006/0091993 A1 | 5/2006 | Shoji |
| 2006/0114098 A1 | 6/2006 | Shoji |
| 2006/0152859 A1 | 7/2006 | Childress et al. |
| 2006/0193089 A1 | 8/2006 | Li et al. |
| 2006/0214656 A1 | 9/2006 | Sudo et al. |
| 2006/0267056 A1 | 11/2006 | Ju et al. |
| 2007/0019338 A1 | 1/2007 | Childress et al. |
| 2007/0019341 A1 | 1/2007 | Mizuno et al. |
| 2007/0044370 A1 | 3/2007 | Shoji |
| 2007/0063237 A1 | 3/2007 | Huai et al. |
| 2007/0064350 A1 | 3/2007 | Gill |
| 2007/0076332 A1 | 4/2007 | Shoji et al. |
| 2007/0164734 A1 | 7/2007 | Shimizu et al. |
| 2007/0230067 A1 | 10/2007 | Jogo et al. |
| 2007/0230068 A1 | 10/2007 | Gill |
| 2008/0031035 A1 | 2/2008 | Rodmacq et al. |
| 2008/0098167 A1 | 4/2008 | Rodmacq et al. |
| 2008/0151615 A1 | 6/2008 | Rodmacq et al. |
| 2008/0316655 A1 | 12/2008 | Shoji |
| 2009/0015252 A1* | 1/2009 | Raberg ............... B82Y 25/00 324/252 |
| 2009/0015972 A1 | 1/2009 | Dieny et al. |
| 2009/0021249 A1 | 1/2009 | Kumar et al. |
| 2009/0087589 A1 | 4/2009 | Guo et al. |
| 2009/0115405 A1 | 5/2009 | Guo et al. |
| 2009/0189601 A1 | 7/2009 | Okada et al. |
| 2009/0192755 A1 | 7/2009 | Sheiretov et al. |
| 2009/0289694 A1 | 11/2009 | Rieger et al. |
| 2009/0290053 A1 | 11/2009 | Hammerschmidt |
| 2010/0027168 A1 | 2/2010 | Chou et al. |
| 2010/0039734 A1 | 2/2010 | Hara et al. |
| 2010/0045277 A1 | 2/2010 | Goldfine et al. |
| 2010/0060263 A1 | 3/2010 | Granig et al. |
| 2010/0149689 A1 | 6/2010 | Tsuchiya et al. |
| 2010/0327857 A1 | 12/2010 | Hoshiya et al. |
| 2011/0025320 A1 | 2/2011 | Ohta et al. |
| 2011/0062537 A1 | 3/2011 | Oh et al. |
| 2011/0068786 A1 | 3/2011 | Ohta et al. |
| 2011/0133728 A1 | 6/2011 | Tokunaga |
| 2011/0140217 A1 | 6/2011 | Nguyen et al. |
| 2011/0163739 A1 | 7/2011 | Ono et al. |
| 2011/0169488 A1 | 7/2011 | Mather |
| 2012/0112741 A1 | 5/2012 | Meguro et al. |
| 2012/0286382 A1 | 11/2012 | Jan et al. |
| 2014/0110803 A1 | 4/2014 | Apalkov et al. |
| 2015/0108972 A1 | 4/2015 | Zimmer et al. |
| 2015/0192648 A1 | 7/2015 | Campiglio et al. |
| 2015/0192649 A1 | 7/2015 | Dressler et al. |
| 2015/0194597 A1 | 7/2015 | Fermon et al. |
| 2016/0161574 A1 | 6/2016 | Zimmer |
| 2016/0359103 A1 | 12/2016 | Fermon et al. |

FOREIGN PATENT DOCUMENTS

| | | |
|---|---|---|
| DE | 19 810 838 | 9/1999 |
| DE | 19 843 348 | 3/2000 |
| DE | 10 222 467 | 12/2003 |
| DE | 10 257 253 | 2/2004 |
| DE | 10 2005 024 879 | 12/2006 |
| DE | 10 2005 042 307 | 3/2007 |
| DE | 102006010652 A | 9/2007 |
| DE | 10 2006 019 483 | 10/2007 |
| DE | 10 2008 030 334 | 1/2010 |
| EP | 0 779 632 | 6/1997 |
| EP | 0 863 406 | 9/1998 |
| EP | 1 323 856 | 7/2003 |
| EP | 1 510 787 | 3/2005 |
| EP | 1 617 472 | 1/2006 |
| EP | 1 666 894 | 6/2006 |
| EP | 1 672 321 | 6/2006 |
| EP | 1 777 440 | 4/2007 |
| EP | 1 918 678 | 5/2008 |
| EP | 1 947 469 | 7/2008 |

(56) References Cited

FOREIGN PATENT DOCUMENTS

| FR | 2 727 778 | 6/1996 |
|---|---|---|
| FR | 2 729 790 | 7/1996 |
| FR | 2 752 302 | 2/1998 |
| FR | 2 773 395 | 7/1999 |
| FR | 2 774 774 | 8/1999 |
| FR | 2 814 592 | 3/2002 |
| FR | 2 817 998 | 6/2002 |
| FR | 2 817 999 | 6/2002 |
| FR | 2 830 621 | 4/2003 |
| FR | 2 876 800 | 4/2006 |
| FR | 2 889 348 | 2/2007 |
| FR | 2 932 315 | 12/2009 |
| JP | 2000-055997 | 2/2000 |
| JP | 2000-055999 | 2/2000 |
| JP | 2000-056000 | 2/2000 |
| JP | 2001-230471 | 8/2001 |
| JP | 2002-082136 | 3/2002 |
| JP | 2002-267692 | 9/2002 |
| JP | 2002-328140 | 11/2002 |
| JP | 2003-315091 | 11/2003 |
| JP | 2006-179566 | 7/2006 |
| JP | 2006-214910 | 8/2006 |
| JP | 2007-101253 | 4/2007 |
| JP | 2007-108069 | 4/2007 |
| JP | 2009-014544 | 1/2009 |
| JP | 2009-527745 | 7/2009 |
| JP | 2010-080008 | 4/2010 |
| WO | WO 94/15223 | 7/1994 |
| WO | WO 01/67085 | 9/2001 |
| WO | WO 02/084680 | 10/2002 |
| WO | WO 03/032338 | 4/2003 |
| WO | WO 03/104829 | 12/2003 |
| WO | WO 03/107018 | 12/2003 |
| WO | WO 2004/048986 | 6/2004 |
| WO | WO 2004/068152 | 8/2004 |
| WO | WO 2004/068158 | 8/2004 |
| WO | WO 2005/020242 | 3/2005 |
| WO | WO 2005/028993 | 3/2005 |
| WO | WO 2006/136577 | 12/2006 |
| WO | WO 2007/095971 | 8/2007 |
| WO | WO 2007/148028 | 12/2007 |
| WO | WO 2007/148029 | 12/2007 |
| WO | WO 2008/012309 | 1/2008 |
| WO | WO 2008/015354 | 2/2008 |
| WO | WO 2009/001160 | 12/2008 |
| WO | WO 2009/001162 | 12/2008 |
| WO | WO 2009/007324 | 1/2009 |
| WO | WO 2009/110892 | 9/2009 |
| WO | WO 2010/001077 | 1/2010 |
| WO | WO 2010/026948 | 3/2010 |
| WO | WO 2010/066976 | 6/2010 |
| WO | WO 2010/084165 | 7/2010 |
| WO | WO 2010/113820 | 10/2010 |
| WO | WO 2010/116102 | 10/2010 |
| WO | WO 2010/136527 | 12/2010 |
| WO | WO 2011/007767 | 1/2011 |

OTHER PUBLICATIONS

U.S. Appl. No. 15/613,313, filed Jun. 5, 2017, Klebanov, et al.
U.S. Appl. No. 15/248,500, filed Aug. 26, 2016, Campiglio.
U.S. Appl. No. 16/047,342, filed Jul. 27, 2018, Campiglio et al.
PCT International Search Report and Written Opinion dated Nov. 30, 2018 for International Application No. PCT/US2018/028238; 11 Pages.
U.S. Appl. No. 16/507,538, filed Jul. 10, 2019, Rémy Lassalle-Balier, et al.
Communication pursuant to Article 94(3) EPC dated Sep. 2, 2019 for European Application No. 16728493.4; 5 pages.
Childress et al; "Spin-Valve and Tunnel-Valve Structures with In Situ In-Stack Bias;" IEEE Transactions on Magnetics, vol. 38, No. 5; Sep. 2002; pp. 2286-2288; 3 Pages.
Coehoorn, Lecture Notes; "Novel Magnetoelectronic Materials and Devices;" Jan. 2003; pp. 33-84; 52 Pages.
Fermon et al.; "Optimised GMR Sensors for Low and High Frequencies Applications;" Elsevier, Sensors and Actuators, Jan. 2006; 4 Pages.
Noziéres et al.; Blocking Temperature Distribution and Long-Term Stability of Spin-Vavle Structures with Mn-Based Antiferromagnets; Journal of Applied Physics, vol. 87, No. 8; Apr. 15, 2000; pp. 3920-3925; 6 Pages.
U.S. Appl. No. 14/452,783.
Office Action dated Dec. 31, 2015 for U.S. Appl. No. 14/452,783; 14 pages.
Response to Office Action filed Apr. 20, 2016 for U.S. Appl. No. 14/452,783; 13 pages.
U.S. Notice of Allowance dated Jul. 6, 2016 corresponding to U.S. Appl. No. 14/452,783; 13 Pages.
U.S. $2^{nd}$ Notice of Allowance dated Oct. 7, 2016 corresponding to U.S. Appl. No. 14/452,783; 9 Pages.
Corrected Notice of Allowability dated Oct. 27, 2016 regarding U.S. Appl. No. 14/452,783; 3 pages.
PCT Search Report and Written Opinion of the ISA dated Jun. 2, 2015; for PCT Pat. App. No. PCT/US2015/010417; 13 pages.
Letter from A.A. Thornton dated Feb. 24, 2017 regarding amended claims for EP Pat. Appl. No. 15701862.3; 6 pages.
Amended Claims regarding A.A. Thornton letter dated Feb. 24, 2017 for EP Pat. Appl. No. 15701862.3; 9 pages.
U.S. Appl. No. 14/529,564.
Non-Final Office Action dated Jun. 17, 2015 for U.S. Appl. No. 14/529,564; 16 pages.
Response to Office Action filed Nov. 17, 2015 for U.S. Appl. No. 14/529,564; 19 pages.
Final Office Action dated Feb. 4, 2016 for U.S. Appl. No. 14/529,564; 22 pages.
Response to Final Office Action dated Feb. 4, 2016 for U.S. Appl. No. 14/529,564; Respone filed May 3, 2016; 17 pages.
Advisory Action dated May 20, 2016 for U.S. Appl. No. 14/529,564; 4 pages.
Office Action dated Jun. 23, 2016; for U.S. Appl. No. 14/529,564; 17 pages.
Response to Office Action dated Jun. 23, 2016 for U.S. Appl. No. 14/529,564; Response Filed Sep. 12, 2016; 25 pages.
Response to Notice of Non-Compliant Amendment filed on Jan. 6, 2017 for U.S. Appl. No. 14/529,564; 2 pages.
Office Communication dated May 3, 2017 for U.S. Appl. No. 14/529,564; 4 pages.
Response to Office Communication dated May 3, 2017 filed on May 4, 2017 for U.S. Appl. No. 14/529,564; 3 pages.
Final Office Action dated Aug. 10, 2017 for U.S. Appl. No. 14/529,564; 19 pages.
Response to Final Office Action dated Aug. 10, 2017 for U.S. Appl. No. 14/529,564; Response filed Oct. 24, 2017; 11 pages.
Advisory Action dated Nov. 1, 2017 for U.S. Appl. No. 14/529,564; 3 pages.
Supplemental Response to Final Office Action dated Nov. 2, 2017 for U.S. Appl. No. 14/529,564; 11 pages.
Notice of Allowance dated Nov. 21, 2017 for U.S. Appl. No. 14/529,564; 8 pages.
PCT Search Report and Written Opinion of the ISA dated Jun. 2, 2015; for PCT Pat. App. No. PCT/US2015/010422; 12 pages.
PCT International Preliminary Report on Patentability dated Jul. 21, 2016; for PCT Pat. App. No. PCT/US2015/010422; 9 pages.
Letter from A.A. Thornton & Co. dated Feb. 21, 2017 in reply to Office Communication dated Aug. 17, 2016 for EP Appl. No. EP15701863.1; 5 pages.
Amended Tracked Claims regarding A.A. Thornton & Co. letter dated Feb. 21, 2017 for EP Appl. No. EP15701863.1; 8 pages.
DCMD Instruction Letter dated Nov. 14, 2018 for JP Pat. Appl. No. 2016-545937; 2 pages.
DCMD Proposed Amendments to Claims from Instruction Letter dated Nov. 14, 2018 for JP Pat. Appl. No. 2016-545937; 9 pages.
Yuasa and Hara Letter dated Dec. 26, 2018 for JP Pat. Appl. No. 2016-545937; 2 pages.
Notice of Reasons for Rejection (with English Translation) dated Dec. 11, 2018 for JP Pat. Appl. No. 2016-545937; 8 pages.

(56) References Cited

OTHER PUBLICATIONS

Claims now on File dated Dec. 11, 2018 for JP Pat. Appl. No. 2016-545937; 6 pages.
Office Action dated Apr. 14, 2017 for U.S. Appl. No. 15/165,322, filed May 26, 2016; 24 pages.
Response to Office Action filed May 30, 2017 for U.S. Appl. No. 15/165,322; 23 pages.
Notice of Allowance dated Jul. 14, 2017 for U.S. Appl. No. 15/165,322, filed May 26, 2016; 14 pages.
PCT International Search Report and Written Opinion dated Aug. 10, 2016 corresponding to International Application No. PCT/US2016/034237; 21 Pages.
PCT International Preliminary Report dated Dec. 14, 2017 corresponding to International Application No. PCT/US2016/034237; 16 Pages.
Taiwan Office Action (With English Translation) dated Feb. 16, 2017 for TW Appl. No. 105117391; 23 pages.
Amended Claims from DCMD Instruction Letter dated Apr. 7, 2017 to Foreign Associate for TW Pat. Appl. No. 105117391; 7 pages.
Response to European Official Communication (with Amended Claims) dated Jan. 30, 2018 for European Application No. 16728493.4 as filed on Aug. 8, 2018; 13 Pages.
Amended Claims for European Application No. 16728493.4 as filed on Aug. 8, 2018; 6 Pages.
Japanese Voluntary Amendment (with the current Claims on file) filed on May 21, 2019 for JP Pat. Application No. 2017-563135; 16 pages.
Response to U.S. Non-Final Office Action dated Jun. 14, 2019 for U.S. Appl. No. 15/991,491; Response filed Aug. 29, 2019; 11 Pages.
U.S. Non-Final Office Action dated Jun. 14, 2019 for U.S. Appl. No. 15/991,491; 15 Pages.
U.S. Advisory Action dated Nov. 1, 2019 for U.S. Appl. No. 15/991,491; 5 Pages.
Response to U.S. Final Office Action dated Sep. 26, 2019 and U.S. Advisory Action dated Nov. 1, 2019 for U.S. Appl. No. 15/991,491; Response filed Nov. 1, 2019; 15 Pages.
PCT International Search Report and Written Opinion of the ISA dated Sep. 26, 2019 for International Application No. PCT/US2019/037629; 13 Pages.
U.S. Final Office Action dated Sep. 26, 2019 for U.S. Appl. No. 15/991,491; 10 Pages.
Response to U.S. Final Office Action dated Sep. 26, 2019 for U.S. Appl. No. 15/991,491; Response filed Oct. 21, 2019; 15 Pages.
U.S. Non-Final Office Action dated Dec. 10, 2019 for U.S. Appl. No. 15/991,491; 13 Pages.
PCT International Preliminary Report dated Nov. 28, 2019 for International Application No. PCT/US2018/028238; 7 Pages.
Response to Office Action dated Jan. 13, 2020 for European Application No. 16728493.4; 13 pages.
Response to U.S. Non-Final Office Action dated Dec. 10, 2019 for U.S. Appl. No. 15/991,491; Response filed Mar. 5, 2020; 17 Pages.

* cited by examiner

MAGNETORESISTANCE ELEMENT WITH INCREASED OPERATIONAL RANGE

BACKGROUND

As is known in the art, magnetic field sensing elements can be used in a variety of applications. In one example application, a magnetic field sensing element can be used to detect motion (e.g., rotation) of an object, such as a gear or ring magnet. A magnetic field affected by motion of the object may be detected by one or more magnetic field sensing elements, such as Hall effect elements and/or magnetoresistance elements, which provide a signal (i.e., a magnetic field signal) in response to an applied magnetic field. Motion of the object may, for example, result in variations in an air gap between the object (or target features of the object) and the magnetic field sensing elements, which may result in variations in the applied magnetic field to which the magnetic field sensing elements are exposed, and in the magnetic field signals provided by the magnetic field sensing elements in response to the applied magnetic field. Such magnetic field signals can be processed to detect position, proximity, speed and/or direction of motion of the object, for example.

Various parameters characterize the performance of magnetic field sensing elements and circuits or sensors that use magnetic field sensing elements. With regard to magnetic field sensing elements, the parameters include sensitivity, which corresponds to a change in a resistance of a magnetoresistance element or a change in an output voltage from a Hall effect element, for example, in response to an applied magnetic field (e.g., a magnetic field as may be affected by motion of a ferromagnetic object). Additionally, with regard to magnetic field sensing elements, the parameters include linearity, which corresponds to a degree to which the resistance of the magnetoresistance element or the output voltage from the Hall effect element varies linearly (i.e., in direct proportion) to the applied magnetic field.

Magnetoresistance elements are known to have a relatively high sensitivity compared, for example, to Hall effect elements. Magnetoresistance elements are also known to have moderately good linearity, but over a restricted or limited range of magnetic fields, more restricted in range than a range over which Hall effect elements can operate. It is known that in the restricted range of magnetic fields (i.e., in a so-called "linear region" or "linear range" of a magnetoresistance element), the resistance of a magnetoresistance element is typically indicative of an applied magnetic field to which the magnetoresistance element is exposed. It is also known that outside the restricted range of magnetic fields (i.e., in so-called "saturation regions"), the resistance of a magnetoresistance element is typically not indicative of the applied magnetic field. As a result of the foregoing, an operational range of a magnetoresistance element (i.e., a range in which the magnetoresistance element has a resistance that is indicative of an applied magnetic field) is typically limited to the restricted range of magnetic fields (i.e., the linear range of the magnetoresistance element). Additionally, an operational range of a circuit or sensor (e.g., a magnetic field sensor) using the magnetoresistance element (i.e., a range in which the circuit or sensor using the magnetoresistance element is capable of generating a signal indicative of the applied magnetic field) may be limited to the operational range of the magnetoresistance element.

For at least the above reasons, the fundamental usage for conventional magnetoresistance elements, and circuits or sensors using conventional magnetoresistance elements, has typically been limited to applications in which sensing is needed over a restricted range of magnetic fields (e.g., low strength magnetic fields) and the relatively high sensitivity characteristics of magnetoresistance elements are desired.

SUMMARY

Described herein are concepts, systems, circuits and techniques related to magnetoresistance elements with increased operational ranges. More particularly, in one aspect, a magnetoresistance element according to the disclosure is deposited upon a substrate and includes at least first and second material stack portions (also referred to herein as simply "stack portions"). The first stack portion has opposing first and second surfaces and includes a first plurality of layers. Additionally, the first stack portion has a first substantially linear response corresponding to an applied or a detected magnetic field (e.g., a local and/or an external magnetic field) over a first magnetic field strength range. The second stack portion has opposing first and second surfaces and includes a second plurality of layers. The first surface of the second stack portion is disposed over the second surface of the first stack portion and the second stack portion has a second substantially linear response that is different than the first substantially linear response of the first stack portion. The second substantially linear response corresponds to the applied magnetic field over a second magnetic field strength range. In embodiments, the applied magnetic field includes a local magnetic field and an external magnetic field, and the local magnetic field (e.g., as may be generated by a magnet provided on the substrate on which the magnetoresistance element is deposited) may be used to bias the magnetoresistance element and influence at least one of the first and second substantially linear responses of the magnetoresistance element.

As used herein, with regard to the magnetoresistance element, the term "substantially linear response" is used to describe a response characteristic of the magnetoresistance element that has a maximum deviation from linearity that is within a predetermined percentage of linear. The predetermined percentage of linear may, for example, depend on accuracy required by a system or apparatus (e.g., a magnetic field sensor) in which the magnetoresistance element may be provided. In one embodiment, the predetermined percentage of linear is about ten percent of linear, e.g., about ten percent of sensitivity seen by the magnetoresistance element at a magnetic field of about zero Oersteds, for example, assuming that the magnetoresistance element has a maximum sensitivity at the magnetic field of about zero Oersteds. In embodiments, the substantially linear response occurs over a range of magnetic fields having an associated magnetic field strengths (i.e., over a magnetic field strength range). Additionally, in embodiments, the range of magnetic field strengths has first and second opposing ends, with the first and second ends corresponding to points at which the substantially linear region has an average slope that deviates from the predetermined percentage of linear (e.g., upon entering a saturation region).

The magnetoresistance element may include one or more of the following features individually or in combination with other features. The first substantially linear response of the first stack portion may result in the magnetoresistance element having a first sensitivity level to changes in magnetic field strength when the applied magnetic field is within the first magnetic field strength range. The second substantially linear response of the second stack portion may result in the magnetoresistance element having a second sensitivity level to changes in magnetic field strength that is reduced in comparison to the first sensitivity level when the applied magnetic field is within the second magnetic field strength range.

The first magnetic field strength range may include a negative magnetic field. The second magnetic field strength range may include a positive magnetic field. The first magnetic field strength range may overlap with one or more portions of the second magnetic field strength range (i.e., the first magnetic field strength range may comprise one or more magnetic field strengths which the second magnetic field strength range also comprises). Each of the layers of the first stack portion may have a respective thickness and the thickness of at least one of the layers of the first stack portion may be selected to result in the first stack portion having the first substantially linear response. Each of the layers of the second stack portion may have a respective thickness and the thickness of at least one of the layers of the second stack portion may be selected to result in the second stack portion having the second substantially linear response. An ordering of the first plurality of layers in the first stack portion may be selected to result in the first stack portion having the first substantially linear response. Additionally, an ordering of the second plurality of layers in the second stack portion may be selected to result in the second stack portion having the second substantially linear response.

In embodiments, the first and second plurality of layers may include a same number of layers. Additionally, in embodiments, the first and second plurality of layers may include a different number of layers. The first stack portion may include a first pinned layer structure, a first spacer layer disposed over the first pinned layer structure, and a first free layer structure disposed over the first spacer layer. The first spacer layer may be comprised of a first material having a first thickness. The first material and the first thickness may be selected to result in the first stack portion having the first substantially linear response. The second stack portion may include a second pinned layer structure, a second spacer layer disposed over the second pinned layer structure, and a second free layer disposed over the second spacer layer. The second spacer layer may include a second material having a second thickness. The second material and the second thickness may be selected to result in the second stack portion having the second substantially linear response.

The first and second spacer layers may be comprised of Ruthenium (Ru). The second selected thickness of the second spacer layer is in a range between about 1.6 nanometers (nm) to about 1.8 nm, about 2.2 nm to about 2.4 nm, about 2.9 nm to about 3.1 nm, or about 3.5 nm to about 3.7 nm. The first selected thickness of the first spacer layer may be about 1.3 nm. The second selected thickness of the second spacer layer may be about 1.7 nm. The first and second pinned layer structures of the first and second stack portions may include one respective pinned layer. Additionally, the first and second pinned layer structures each include a respective synthetic antiferromagnetic (SAF) structure. The magnetoresistance element may be one of a giant magnetoresistance (GMR) element, a magnetic tunnel junction (MTJ) element and a tunneling magnetoresistance (TMR) element. Additionally, the magnetoresistance element may be provided in a magnetic field sensor.

In one aspect, a magnetic field sensor includes a magnetoresistance element configured to generate first and second substantially linear responses to an applied magnetic field. The first and second substantially linear responses have substantially zero offset with respect to an expected response of the magnetoresistance element at an applied magnetic field strength of about zero Oersteds. In embodiments, the first and second substantially linear responses result in the magnetoresistance element having substantially no offset, for example, when experiencing an applied magnetic field having a magnetic field strength of about zero Oersteds, with the linear range of the magnetoresistance element substantially evenly distributed about zero Oersteds.

In another aspect, a magnetic field sensor includes means for generating first and second substantially linear responses to an applied magnetic field. The first and second substantially linear responses have substantially zero offset with respect to an expected response at an applied magnetic field strength of about zero Oersteds.

The magnetic field sensor may include one or more of the following features individually or in combination with other features. The means for generating first and second substantially linear responses may be a magnetoresistance element and the expected response may be an expected response of the magnetoresistance element. The magnetoresistance element may include a first stack portion having opposing first and second surfaces and including a first plurality of layers. The magnetoresistance element may include a second stack portion having opposing first and second surfaces and including a second plurality of layers. The first surface of the second stack portion may be disposed over the second surface of the first stack portion. The first stack portion may have the first substantially linear response and the second stack portion may have the second substantially linear response. The second substantially linear response may be different than the first substantially linear response. The first substantially linear response may correspond to the applied magnetic field over a first magnetic field strength range. The second substantially linear response may correspond to the applied magnetic field over a second magnetic field strength range.

The above and below described magnetoresistance elements and magnetic field sensors according to the disclosure have been found to have an increased operational range in comparison to an operational range of conventional magnetoresistance elements, for example, due to the magnetoresistance elements having at least first and second stack portions with respective first and second substantially linear responses. As noted above, the first substantially linear response corresponds to an applied magnetic field over a first magnetic field strength range. As also noted above, the second substantially linear response is different from the first substantially linear response and corresponds to the applied magnetic field over a second magnetic field strength range.

Magnetoresistance elements according to the disclosure have also been found to have the increased operational range without sacrificing (i.e., reducing) sensitivity at relatively small or reduced magnetic fields within the increased operational range. As is known, in high precision applications such as automobiles, for example, in which one or more magnetoresistance elements may be used detect motion of an object (e.g., a ring magnet or ferromagnetic gear), for example, magnetic fields with a high enough signal-to-noise ratio (SNR) may be needed to account for proper switching of the magnetoresistance elements (e.g., proper switching of an output of the magnetoresistance elements or of a sensor including the magnetoresistance elements, e.g., through a post algorithm process) to distinguish between features (e.g., gear teeth) of the object (i.e., to properly detect a target feature). The high enough SNR may depend on type of application, for example, for high precisions applications the high enough SNR may be about 25 dB. At relatively large or "far" air gaps between the magnetoresistance elements and the object being sensed by the magnetoresistance elements (e.g., an air gap greater than about 2.5 mm from sensor face to the object or target), for example, an applied magnetic field sensed by the magnetoresistance elements may be relatively small, the SNR may be relatively low and sensitivity can be critical (e.g., for distinguishing between features of the object). At relatively small or "close" air gaps (e.g., an air gap less than about 1 mm from sensor face to the object or target), the applied magnetic field is generally large enough to dominate noise (i.e., the SNR is relatively high at close air gaps), making proper switching less of an issue at small air gaps than at large air gaps.

In embodiments, the at least first and second substantially linear responses of the magnetoresistance elements according to the disclosure provide for a piecewise linear effect in which the magnetoresistance elements have at least a first sensitivity level to changes in magnetic field strength when an applied magnetic field is below a first threshold or within a first magnetic field strength range (e.g., at close air gaps where magnetic field strength and SNR are relatively high) and a second sensitivity level to changes in magnetic field strength that is reduced in comparison to the first sensitivity level when the applied magnetic field is above a second threshold or within a second magnetic field strength range (e.g., at far air gaps where magnetic field strength and SNR are relatively low). The foregoing may greatly expand the operational range of the magnetoresistance elements, particularly where clipping may occur (e.g., at relatively high magnetic field strengths). The foregoing may also provide for greater offset drift toleration. As is known, magnetoresistance elements are generally subject to an offset, which is characterized by a resistance of the magnetoresistance elements not being representative of a nominal (or zero) magnetic field when the magnetoresistance elements experience a zero magnetic field. As is also known, the offset is undesirable.

Additional example advantages associated with magnetoresistance elements according to the disclosure are discussed further below.

BRIEF DESCRIPTION OF THE DRAWINGS

The foregoing features of the disclosure, as well as the disclosure itself may be more fully understood from the following detailed description of the drawings, in which:

FIG. 14A is a block diagram of an example bridge arrangement that may include magnetoresistance elements according to the disclosure.

DETAILED DESCRIPTION

Figure 1:
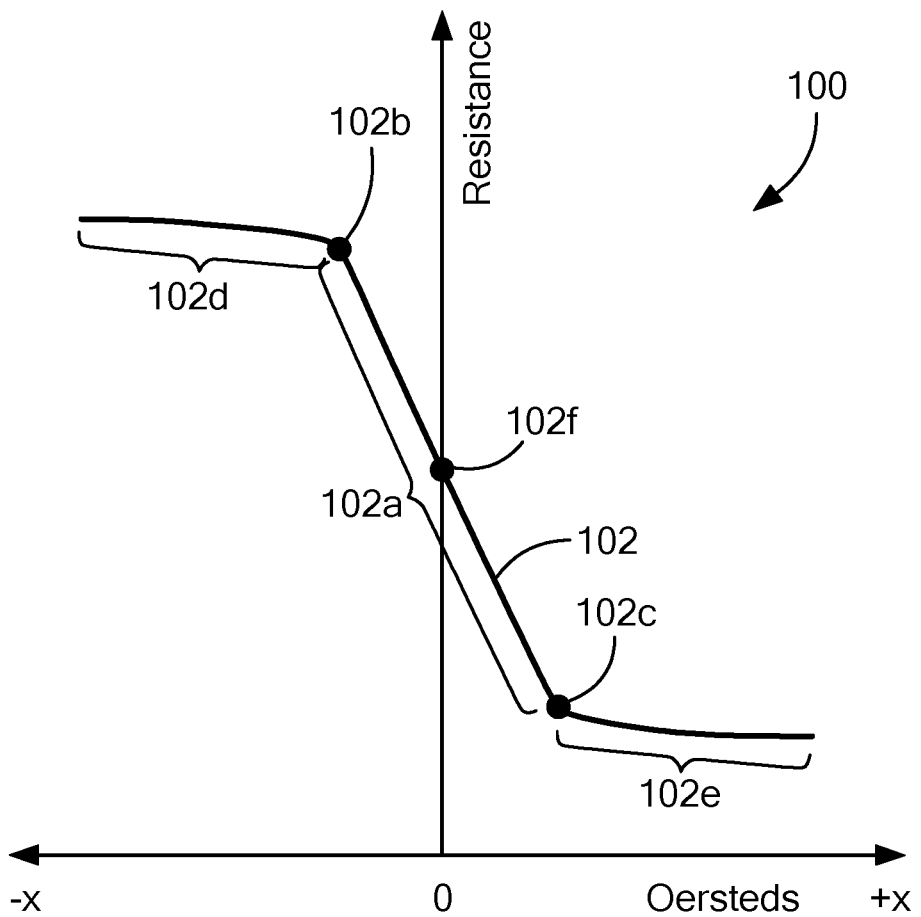
FIG. 1 is a plot illustrating an example response characteristic of an ideal prior art magnetoresistance element.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

For convenience, certain concepts and terms used in the specification are provided. As used herein, the term "magnetic field sensing element" is used to describe a variety of electronic elements that can sense a magnetic field. One example magnetic field sensing element is a magnetoresistance or magnetoresistive (MR) element. The magnetoresistance element generally has a resistance that changes in relation to a magnetic field experienced by the magnetoresistance element.

As is known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). As used herein, the term "magnetoresistance element" may refer, without exclusivity, to any or all of these types of magnetoresistance elements. Depending on the device type and other application requirements, magnetoresistance elements may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

The magnetoresistance element may be a single element or, alternatively, may include two or more magnetoresistance elements arranged in various configurations, e.g., a half bridge or full (Wheatstone) bridge.

As is known, magnetoresistance elements (e.g., GMR, TMR) tend to have axes of maximum sensitivity parallel to a substrate on which they are formed or otherwise provided.

As used herein, the term "magnetic field sensor" is used to describe a circuit that uses one or more magnetic field sensing elements, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a motion (e.g., rotation) detector that senses passing ferromagnetic articles, for example, magnetic domains of a ring magnet or features of a ferromagnetic target (e.g., gear teeth) where the magnetic field sensor is used in combination with a back-biased magnet or other magnet, and a magnetic field sensor that senses a magnetic field density of a magnetic field.

Referring to FIG. 1, a plot 100 shows a curve 102 (i.e., a transfer curve) representative of an example response characteristic of a prior art ideal magnetoresistance (MR) element as it is exposed to magnetic fields of varying strengths. The magnetic fields may, for example, be local and/or external magnetic fields (i.e., applied magnetic fields) which may be generated by one or more sources.

The plot 100 has a horizontal axis with a scale in magnetic field strength units (e.g., Oersteds (Oe)) and a vertical axis with a scale in resistance units (e.g., Ohms (Ωs)). Positive magnetic field strength units (e.g., +X) may correspond to a magnetic field experienced by the MR element in a first direction, such as in response to a first direction of motion (e.g., rotation) by an object. Additionally, negative magnetic field strength units (e.g., -X) may correspond to a magnetic field experienced by the MR element in a second direction that is opposite from the first direction, such as in response to a second direction of motion by the object that is opposite from the first direction of motion of the object.

As illustrated, the curve 102 has a linear region 102a (i.e., a single linear region) between an upper saturation point 102b and a lower saturation point 102c in which an electrical resistance of the MR element characterized by curve 102 generally changes linearly (i.e., in direct proportion) to changes in magnetic field strength of the magnetic field experienced by the MR element. In the linear region 102a, which corresponds to an operational range (or dynamic range) of the MR element, the resistance of the MR element is generally indicative of the magnetic field strength of the magnetic field. Additionally, in the linear region 102a, a signal produced by a circuit or sensor including the MR element may also be indicative of the strength of the magnetic field. For the prior art ideal MR element, the linear region 102a of curve 102 is substantially centered about a crossing of the vertical and horizontal axes of plot 100, i.e., when the MR element experiences a nominal (or zero) magnetic field, the resistance of the of the MR element may be a value between that of the saturation regions 102d, 102e in the plot shown, as indicated by point 102f, and the MR element is not subject to an offset error.

As also illustrated, the curve 102 has first and second so-called "saturation regions" 102d, 102e in which the resistance of the MR element no longer changes (or changes very little) in response to changes in the magnetic field and curve 102 correspondingly substantially levels off. A temporary large magnetic field experienced by the MR element may, for example, saturate the MR element, and place the MR element in one of the saturation regions 102d, 102e.

In saturation region 102d in which the magnetic field has a negative magnetic field strength (-X), for example, the resistance of the MR element remains substantially constant at a minimum resistance value (or within a minimum resistance range). Additionally, in saturation region 102e in which the magnetic field has a positive magnetic field strength (+X), the resistance of the MR element remains substantially constant at a maximum resistance value (or within a maximum resistance range). In other words, in the saturation regions 102d, 102e, the resistance of the MR element remains substantially constant independent of changes in the magnetic field and the MR element has substantially no signal response. It follows that in the saturation regions 102d, 102e the resistance of the MR element is generally not indicative of the magnetic field strength of the magnetic field. Additionally, in the saturation regions 102d, 102e, a signal (e.g., an output signal) produced by a circuit or sensor including the MR element may also not be indicative of the magnetic field strength of the magnetic field. For example, the signal produced by the circuit or sensor may be clipped on both sides of the linear region 102a (i.e., in saturation regions 102d, 102e), or clipped on one side of the linear region 102a (i.e., in either saturation region 102d or 102e) with an offset, and remain substantially constant independent of changes in the magnetic field in saturation regions 102d, 102e.

As a result of the foregoing, detection accuracy of the MR element and the circuit or sensor may be substantially reduced when the MR element is operating in the saturation regions 102d, 102e. It follows that the MR element and the circuit or sensor are typically limited to sensing magnetic fields in the linear region 102a over a restricted range of magnetic fields. For at least the above reason, it may be desirable to extend or increase the linear region 102a (i.e., operational range) of the MR element and reduce or limit operation of the MR element in the saturation regions 102d, 102e.

It is understood that the above-described linear region 102a and saturation regions 102d, 102e are representative of an ideal linear region and ideal saturation regions, respectively, and the response of real MR elements (e.g., prior art MR element 200, shown in FIG. 2, as will be discussed) may vary. For example, the linear region of a real (i.e., non-ideal) MR element is generally not perfectly linear. Additionally, real MR elements are also generally responsive to temperature changes and are subject to an offset error.

Referring to FIGS. 2-5, example prior art non-ideal MR elements (i.e., real MR elements) and response curves associated with the prior art MR elements are shown. It should be appreciated that the example prior art MR elements described below are but several of many potential configurations of prior art MR elements. Additionally, it should be appreciated that the example response curves described below are but several of many representative response curves of the prior art MR elements.

Figure 2:
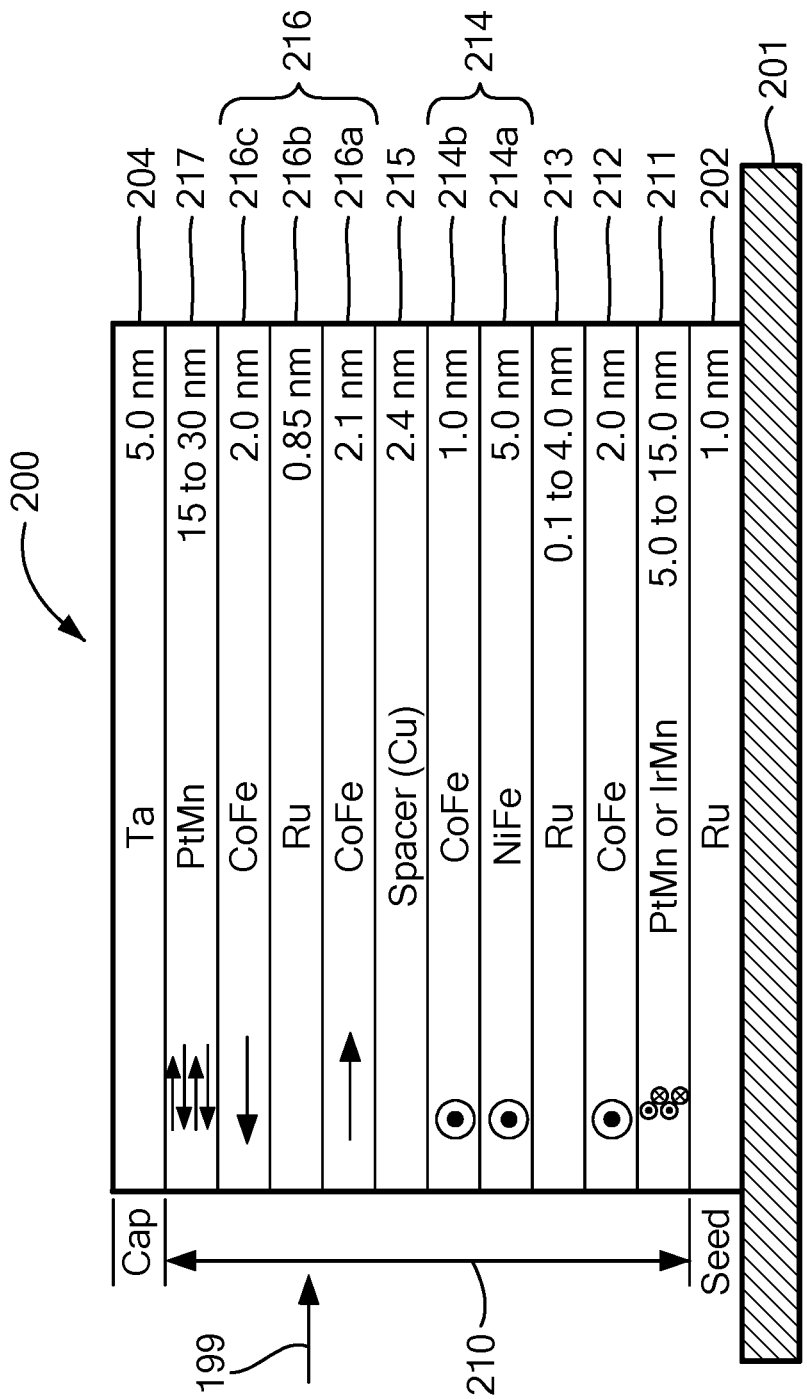
FIG. 2 is a block diagram showing layers of an example prior art magnetoresistance element.

Referring now to FIG. 2, a first example prior art MR element 200 (e.g., a so-called "double pinned MR element") that is representative of a real (i.e., non-ideal) MR element, is deposited or otherwise provided upon a substrate 201 (e.g., a Silicon substrate) and includes a plurality of layers (here, twelve layers). The plurality of layers include a nonmagnetic seed layer 202 disposed over the substrate 201, a material stack 210 (or stack portion) disposed over the nonmagnetic seed layer 202 and a nonmagnetic cap layer 204 disposed over the material stack 210.

The material stack 210 includes an antiferromagnetic pinning layer 211 disposed over the nonmagnetic seed layer 202, a ferromagnetic pinned layer 212 disposed over the antiferromagnetic pinning layer 211 and a nonmagnetic spacer layer 213 disposed over the ferromagnetic pinned layer 212. The material stack 210 also includes a free layer structure 214 disposed over the nonmagnetic spacer layer 213, a nonmagnetic spacer layer 215 disposed over the free layer 214 and a pinned layer structure 216 disposed over the nonmagnetic spacer layer 215. The free layer 214 includes a first ferromagnetic free layer 214a and a second ferromagnetic free layer 214b disposed over the first ferromagnetic free layer 214a. Additionally, the pinned layer structure 216 includes a first ferromagnetic pinned layer 216a, a second ferromagnetic pinned layer 216c, and a nonmagnetic spacer layer 216b disposed therebetween.

The material stack 210 additionally includes an antiferromagnetic pinning layer 217 disposed over the pinned layer structure 216 and the cap layer 204 disposed over the pinning layer 217 (e.g., to protect the MR element 200).

Each of the plurality of layers in the prior art MR element 200 includes one or more respective materials (e.g., magnetic materials) and has a respective thickness, as shown. Materials of the layers are shown by atomic symbols. Additionally, thicknesses of the layers are shown in nanometers (nm).

In general, magnetic materials can have a variety of magnetic characteristics and can be classified by a variety of terms, including, but not limited to, ferromagnetic, antiferromagnetic, and nonmagnetic. Detailed descriptions of the variety of types of magnetic materials are not made herein. However, let it suffice here to say, that a ferromagnetic material (e.g., CoFe) is a material in which magnetic moments of atoms within the material tend to, on average, align to be both parallel and in a same direction, resulting in a nonzero net magnetic magnetization of the material. Additionally, a nonmagnetic or diamagnetic material (e.g., Ta, Cu or Ru) is a material which tends to present an extremely weak magnetization that is opposite and substantially proportional to a magnetic field to which the material is exposed, and does not exhibit a net magnetization. Further, an antiferromagnetic material (e.g., PtMn) is a material in which magnetic moments of atoms within the material tend to, on average, align to be parallel but in opposite directions, resulting in a zero net magnetization.

Within some of the plurality of layers in prior art MR element 200, arrows are shown that are indicative of magnetization directions of the layers when the MR element 200 experiences a nominal (or zero) applied magnetic field. Arrows coming out of the page are indicated as dots within circles and arrows going into the page are indicated as crosses within circles.

Detailed descriptions of the various magnetization directions are not made herein. However, let it suffice here to say that, as is known in the art, some MR elements (e.g., GMR and TMR elements) operate with spin electronics (i.e., electron spins) where the resistance of the MR elements is related to the magnetization directions of certain layers in the MR elements.

The MR element 200 has a maximum response axis to magnetic fields which is parallel to a surface of the substrate 201 over which the MR element 200 is deposited, as indicated by arrow 199. Additionally, the MR element 200 has a resistance that changes in response to the applied magnetic field in a direction of the maximum response axis of the MR element 200 over a limited range of magnetic field strengths, as shown in plot 300 of FIG. 3, as will be discussed.

Figure 3:
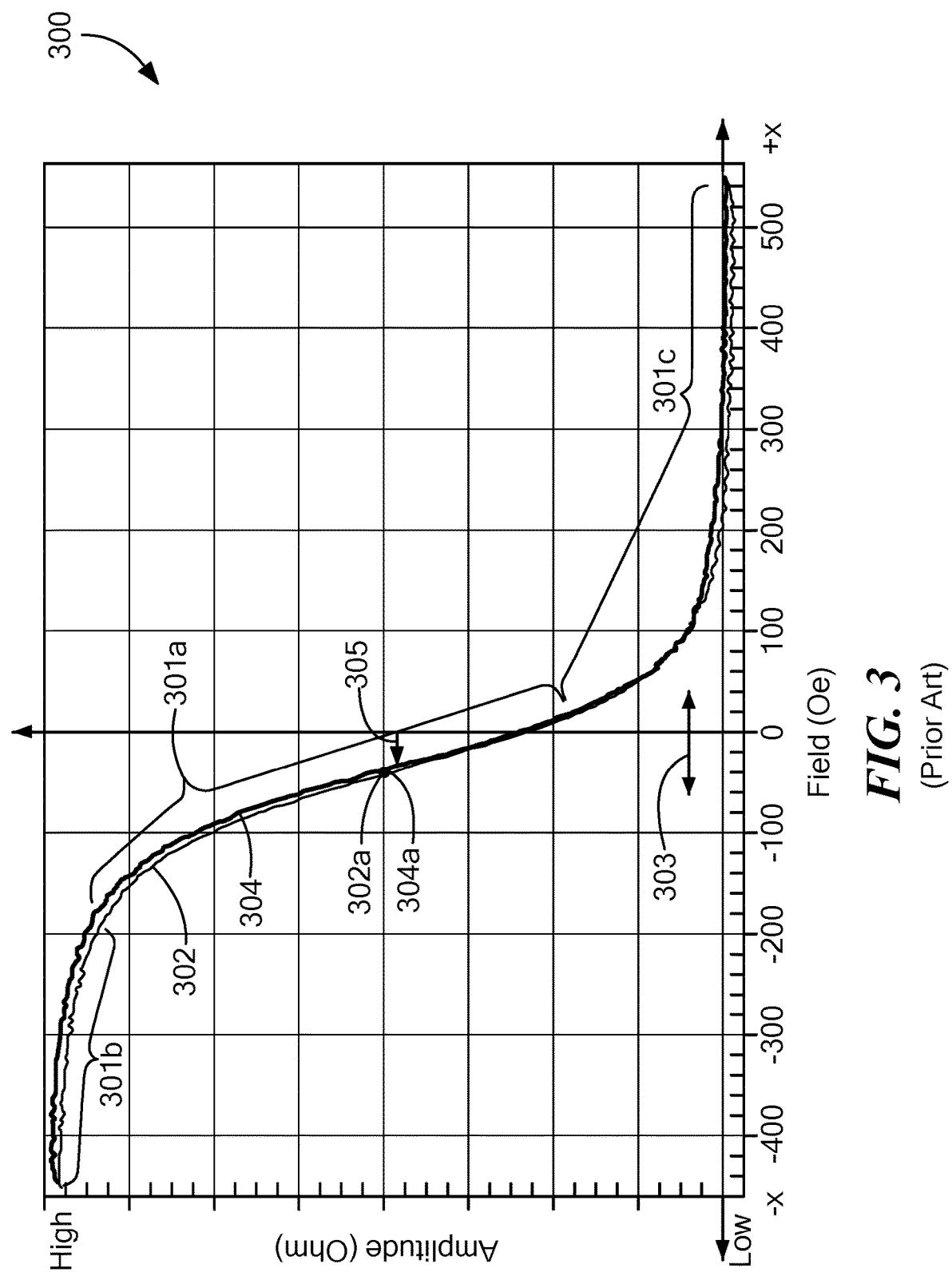
FIG. 3 is a plot illustrating example response characteristics of the prior art magnetoresistance element of FIG. 2.

Referring now to FIG. 3, a plot 300 shows curves 302, 304 representative of example response characteristics of the MR element 200 of FIG. 2 as it is exposed to magnetic fields of varying strengths in a transverse direction relative to the maximum response axis 199 of the MR element 200. The plot 300 has a horizontal axis with a scale in magnetic field strength units (e.g., Oersteds (Oe)) and a vertical axis with a scale in resistance units (e.g., Ohms (Os)). Similar to plot 100 shown in FIG. 1, positive magnetic field strength units (e.g., +X) in plot 300 may correspond to a magnetic field experienced by the MR element 200 in a first direction, such as in response to a first direction of motion (e.g., rotation) by an object. Additionally, negative magnetic field strength units (e.g., −X) in plot 300 may correspond to a magnetic field experienced by the MR element 200 in a second direction that is opposite from the first direction, such as in response to a second direction of motion by the object that is opposite from the first direction of motion of the object.

Curve 302 corresponds to a response characteristic of the MR element 200 as it is exposed to a magnetic field that sweeps from a positive magnetic field strength value (e.g., 500 Oe) to a negative magnetic field strength value (e.g., −450 Oe), e.g., resulting from the object moving from the first direction of motion to the second direction of motion. Additionally, curve 304 corresponds to a response characteristic of the MR element 200 as it exposed to a magnetic field that sweeps from a negative magnetic field strength value (e.g., −450 Oe) to a positive magnetic field strength value (e.g., 500 Oe), e.g., resulting from the object moving from the second direction of motion to the first direction of motion.

As illustrated, the curves 302, 304 have a substantially linear region 301a (i.e., a single linear region) and first and second saturation regions 301b, 301c. In the linear region 301a, which corresponds to an operational range of the MR element 200 characterized by curves 302, 304, the MR element 200 has a resistance that generally changes in proportion to changes in magnetic field strength of the applied magnetic field, here over a magnetic field strength range 303 (e.g., from about −60 Oe to about 40 Oe). In other words, in the linear region 301a, the MR element 200 has a substantially linear response (i.e., a single substantially linear response) corresponding to the applied magnetic field within the magnetic field strength range 303.

Additionally, in the saturation regions 301b, 301c, which are separated from each other by the substantially linear region 301a, the resistance of the MR element 200 remains substantially constant independent of changes in magnetic field strength of the applied magnetic field. In other words, in the saturation regions 301b, 301c, the MR element 200 has a resistance that is substantially unresponsive to changes in magnetic field strength. In particular, in saturation region 301b, the resistance of the MR element 200 remains substantially constant at a maximum resistance value (or within a maximum resistance range). Additionally, in saturation region 301c, the resistance of the MR element 200 remains substantially constant at a minimum resistance value (or within a minimum resistance range). It follows that in the saturation regions 301b, 301c the resistance of the MR element 200 is generally not indicative of the magnetic field strength of the magnetic field. As a result of the foregoing, the prior art MR element 200 is typically limited to measuring or sensing the magnetic field in the linear region 301a over magnetic field strength range 303 (i.e., a limited range of magnetic fields), which limits signal input.

As also illustrated, unlike curve 102 of the ideal MR element shown in FIG. 1, curves 302, 304 of the MR element 200 (i.e., a real MR element) are not symmetrical about a magnetic field of about zero Oersteds. In particular, curves 302, 304 are horizontally offset (i.e., not substantially centered) with respect to an intersection of the vertical and horizontal axes of plot 300, as indicated by arrow 305. It follows that the linear region 301a of MR element 200 is not symmetrical about the magnetic field of about zero Oersteds and, thus, the range of magnetic field strengths to which the MR element 200 is responsive (here, range 303) is also offset. As a result of this offset, the MR element 200 has a resistance which is offset with respect to an expected resistance of the MR element 200 in the linear or operational range (i.e., linear region 301a) of the MR element 200. Additionally, a signal (e.g., an output signal) generated by a circuit or a sensor in which the MR element 200 may be provided may be subject to an offset error if the offset of the MR element 200 is not taken into account and corrected (e.g., through offset correction circuitry in the circuit or sensor).

In general, the offset can be caused by design and manufacturing constraints and defects in layers and/or materials which form the MR element 200. As one example, the offset can be caused by a misalignment of one or more portions (i.e., layers) of the pinned layer structure 216 of MR element 200 with respect to one or more portions (i.e., layers) of the free layer structure 214 of MR element 200. The offset can also be caused by temperature excursions which may result in a change in a response of the MR element 200 at room temperature and/or magnetic field strength variation. The effect of temperature can, for example, be characterized as a temperature coefficient in units of resistance per degree temperature.

Figure 4:
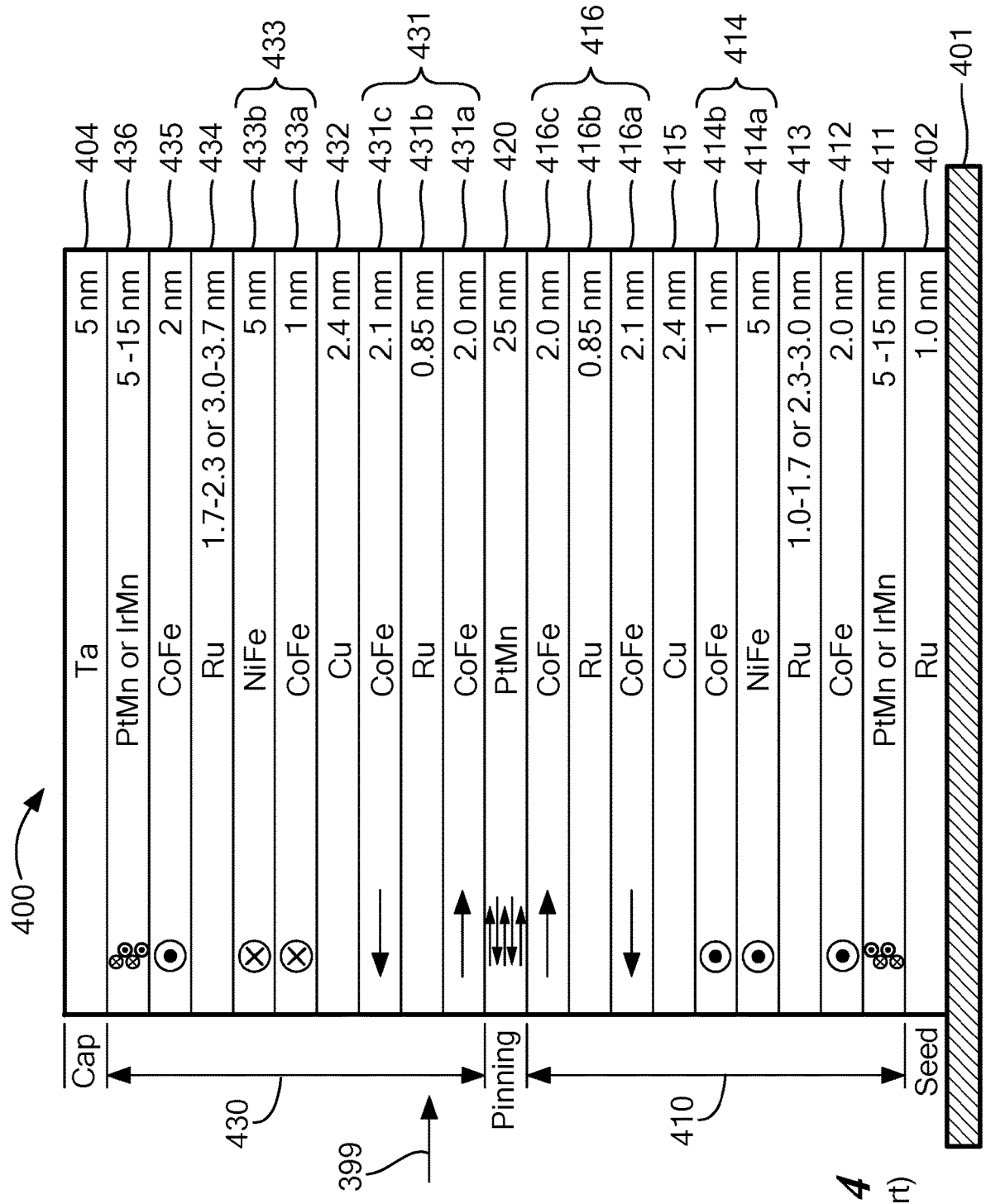
FIG. 4 is a block diagram showing layers of another example prior art magnetoresistance element.

Referring now to FIG. 4, a second example prior art MR element 400 (e.g., a so-called "dual spin valve MR element") is deposited or otherwise provided upon a substrate 401 and includes a plurality of layers. The plurality of layers include a nonmagnetic seed layer 402 disposed over the substrate 401, a first material stack portion 410 (also sometimes referred to herein as "a first stack portion") disposed over the nonmagnetic seed layer 402 and an antiferromagnetic pinning layer 420 disposed over the first material stack portion 410. The MR element 400 also includes a second material stack portion 430 (also sometimes referred to herein as "a second stack portion") disposed over the antiferromagnetic pinning layer 420 and a nonmagnetic cap layer 404 disposed over the second material stack portion 430.

The first stack portion 410, which contains a similar ordering or arrangement of layers as the stack portion 210 of the prior art MR element 200 of FIG. 2 (less a second antiferromagnetic pinning layer, e.g., 217, shown in FIG. 2), includes an antiferromagnetic pinning layer 411 disposed over the nonmagnetic seed layer 402 and a ferromagnetic pinned layer 412 disposed over the antiferromagnetic pinning layer 411. The first stack portion 410 also includes a nonmagnetic spacer layer 413 disposed over the ferromagnetic pinned layer 412 and a free layer structure 414 disposed over the nonmagnetic spacer layer 413. The free layer structure 414 includes a first ferromagnetic free layer 414a and a second ferromagnetic free layer 414b disposed over the first ferromagnetic free layer 414a.

The first stack portion 410 further includes a nonmagnetic spacer layer 415 disposed over the free layer structure 414 and a pinned layer structure 416 disposed over the nonmagnetic spacer layer 415. The pinned layer structure 416 includes a first ferromagnetic pinned layer 416a, a second ferromagnetic pinned layer 416c and a nonmagnetic spacer layer 416b disposed therebetween.

The second stack portion 430, which is similar to the first stack portion 410 but includes layers that are in a substantially reverse order or arrangement as the layers which are shown in first stack portion 410 with respect to the seed layer 402, includes a pinned layer structure 431 disposed over the antiferromagnetic pinning layer 420, a nonmagnetic spacer layer 432 disposed over the pinned layer structure 431 and a free layer structure 433 disposed over the nonmagnetic spacer layer 432. The pinned layer structure 431 includes a first ferromagnetic pinned layer 431a, a second ferromagnetic pinned layer 431c and a nonmagnetic spacer layer 431b disposed therebetween. Additionally, the free layer structure 433 includes a first ferromagnetic free layer 433a and a second ferromagnetic free layer 433b disposed over the first ferromagnetic free layer 433a.

The second stack portion 430 also includes a nonmagnetic spacer layer 434 disposed over the free layer structure 433, a ferromagnetic pinned layer 435 disposed over the nonmagnetic spacer layer 434 and an antiferromagnetic pinning layer 436 disposed over the ferromagnetic pinned layer 435. A nonmagnetic cap layer 204 is disposed over the antiferromagnetic pinning layer 436.

Similar to prior art MR element 200 shown in FIG. 2, each of the layers in prior art MR element 400 includes one or more respective materials (e.g., magnetic materials) and has a respective thickness, as shown. Materials of the layers are shown by atomic symbols. Additionally, thicknesses of the layers are shown in nanometers.

Additionally, similar to prior art MR element 200 shown in FIG. 2, within some of the plurality of layers in prior art MR element 400, arrows are shown that are indicative of magnetization directions of the layers when the MR element 700 experiences a nominal (or zero) applied magnetic field. Arrows coming out of the page are indicated as dots within circles and arrows going into the page are indicated as crosses within circles.

Detailed descriptions of the various magnetization directions are not made herein. However, let it suffice here to say that, as is known in the art, some MR elements (e.g., GMR and TMR elements) operate with spin electronics (i.e., electron spins) where the resistance of the MR elements is related to the magnetization directions of certain layers in the MR elements.

The MR element 400 has a maximum response axis to magnetic fields which is parallel to a surface of the substrate 401 over which the MR element 400 is deposited, as indicated by arrow 399. Additionally, the MR element 400 has an electrical resistance that changes generally in proportion to an applied magnetic field in a direction of the maximum response axis of the MR element 400 over a limited range of magnetic field strengths, as shown in plot 500 of FIG. 5, as will be discussed.

Figure 5:
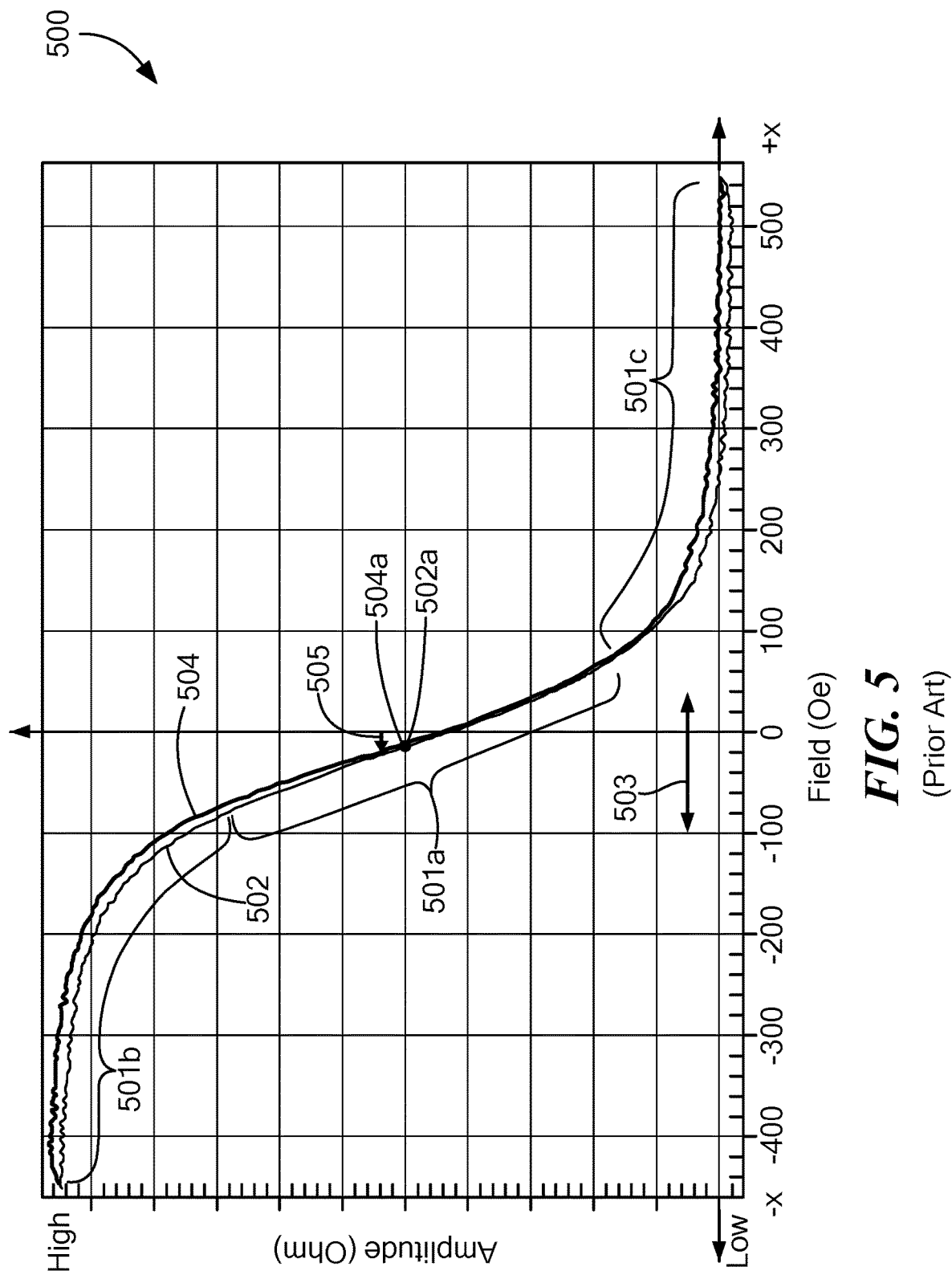
FIG. 5 is a plot illustrating example response characteristics of the prior art magnetoresistance element of FIG. 4.

Referring now to FIG. 5, a plot 500 shows curves 502, 504 representative of example response characteristics of the MR element 400 of FIG. 4 as it is exposed to magnetic fields of varying strengths in a transverse direction relative to the maximum response axis 399 of the MR element 400. The plot 500 has a horizontal axis with a scale in magnetic field strength units (e.g., Oersteds) and a vertical axis with a scale in resistance units (e.g., Ohms (Os)).

Curve 502 corresponds to a response characteristic of the MR element 400 as it is exposed to a magnetic field that sweeps from a positive magnetic field strength value (e.g., 550 Oe) to a negative magnetic field strength value (e.g., −450 Oe), e.g., resulting from an object sensed by the MR element 400 moving from a first direction of motion to a second direction of motion that is opposite from the first direction of motion. Additionally, curve 504 corresponds to a response characteristic of the MR element 400 as it exposed to a magnetic field that sweeps from a negative magnetic field strength value (e.g., −450 Oe) to a positive magnetic field strength value (e.g., 550 Oe), e.g., resulting from the object moving from the second direction of motion to the first direction of motion.

As illustrated, the curves 502, 504 have a substantially linear region 501a (i.e., a single substantially linear region) and first and second saturation regions 501b, 501c. In the linear region 501a, which corresponds to an operational range of the MR element 400 characterized by curves 502, 504, the MR element 400 has a resistance that generally changes in proportion to changes in magnetic field strength of the applied magnetic field, here over a magnetic field strength range 503 (e.g., from about −100 Oe to about 40 Oe). In other words, the MR element 400 has a substantially linear response to the applied magnetic field in the linear region 501a. As also illustrated, the MR element has a single sensitivity level (i.e., rate of change in resistance) in the linear region 501.

In the saturation regions 501b, 501c, the resistance of the MR element 400 remains substantially constant independent of changes in magnetic field strength. In other words, the MR element 400 has a resistance that is substantially unresponsive to changes in magnetic field strength in the saturation regions 501b, 501c. In particular, in saturation region 501b, the resistance of the MR element 400 remains substantially constant at a maximum resistance value (or within a maximum resistance range). Additionally, in saturation region 501c, the resistance of the MR element 400 remains substantially constant at a minimum resistance value (or within a minimum resistance range). It follows that since the resistance of the prior art MR element 400 is not indicative of the magnetic field in saturation regions, MR element 400 is limited to measuring or sensing the applied magnetic field in the linear region 501a over the magnetic field strength range 503 (i.e., a limited range of magnetic fields).

As is also illustrated, similar to curves 302, 304 of MR element 200 (i.e., a non-ideal MR element) shown in FIG. 3, curves 502, 504 of MR element 400 (i.e., also a real MR element) are not symmetrical about a magnetic field of about zero Oersteds. In particular, curves 502, 504 are horizontally offset with respect to an intersection of the vertical and horizontal axes of plot 500, as indicated by arrow 505. It follows that the linear region 501a of MR element 400 is not symmetrical about the magnetic field of about zero Oersteds and, thus, the range of magnetic field strengths to which the MR element 400 is responsive (here, range 503) is also offset, albeit less offset than curves 302, 304 of MR element 200. As a result of this offset, the MR element 400 has a resistance which is offset with respect to an expected resistance of the MR element 400 in the linear or operational range (i.e., linear region 501a) of the MR element 400. Additionally, a signal (e.g., an output signal) generated by a circuit or a sensor in which the MR element 400 may be provided may be subject to an offset error if the offset of the MR element 400 is not taken into account and corrected (e.g., through offset correction circuitry in the circuit or sensor).

Referring to FIGS. 6-13, example embodiments of MR elements according to the disclosure and response curves associated with MR elements according to the disclosure are shown. It should be appreciated that the example MR elements described below are but several of many potential configurations of MR elements in accordance with the concepts, systems, circuits and techniques described herein. Additionally, it should be appreciated that the example response curves described below are but several of many representative response curves of the MR elements.

Figure 6:
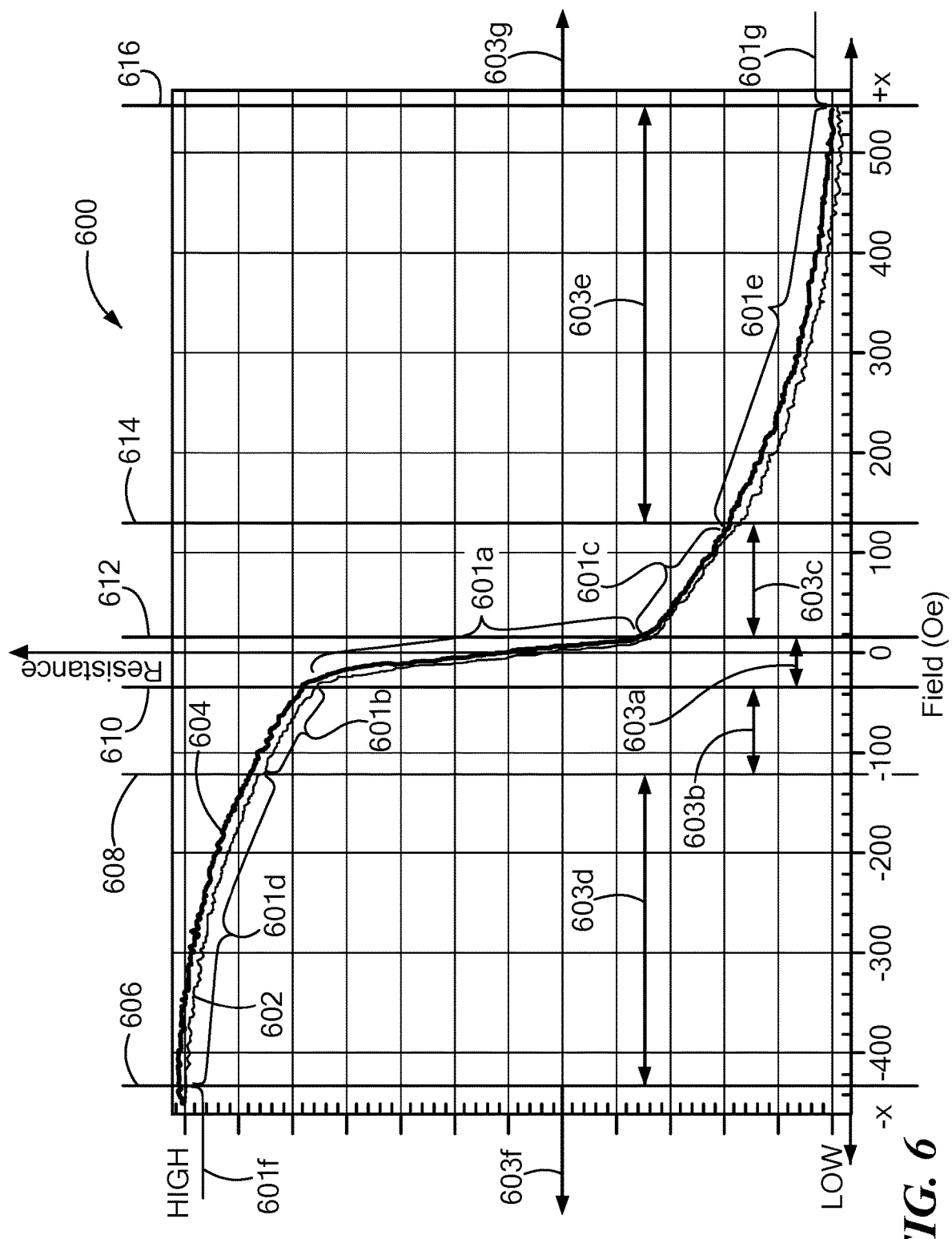
FIG. 6 is a plot illustrating response characteristics of an example magnetoresistance element according to the disclosure.

Referring now to FIG. 6, a plot 600 shows curves 602, 604 representative of example response characteristics of an example MR element according to the disclosure, the structure of which MR element will be described further in connection with figures below. Curves 602, 604 correspond to response characteristics of the MR element (e.g., 700, shown in FIG. 7, with layer 713 of the MR element having a thickness of about 3.3 nm and layer 734 of the MR element having a thickness of about 2.0 nm) as it is exposed to a magnetic field of varying strengths in a transverse direction relative to a maximum response axis of the MR element (e.g., 699, shown in FIG. 7). It is understood that the applied magnetic field (e.g., a local and/or external magnetic field) may be generated in various ways, for example, depending on the type of circuit or sensor in which the MR element is provided and its application.

The plot 600 has a horizontal axis with a scale in magnetic field strength units (e.g., Oersteds (Oe)) and a vertical axis with a scale in resistance units (e.g., Ohms (Os)). The plot 600 also includes lines 606, 608, 610, 612, 614, 616 which are representative of boundaries of various regions or sub-regions in which the MR element may operate.

In the illustrated embodiment, curves 602, 604 have a first substantially linear region 601a and a second substantially linear region (here, a second substantially linear region including a plurality of substantially linear sub-regions 601b, 601c, 601d, 601e) (e.g., piecewise or discrete linear regions). Additionally, curves 602, 604 have a first saturation region 601f and a second saturation region 601g. The MR element characterized by curves 602, 604 has a respective response (or responses) to the magnetic field to which the MR element is exposed in each of the substantially linear and saturation regions. Additionally, each of the substantially linear and the saturation regions is associated with a particular magnetic field threshold, or range of magnetic field strengths of the applied magnetic field.

In particular, in first substantially linear region 601a, the MR element has a first substantially linear response (i.e., experiences a first substantially linear change in resistance) to the applied magnetic field over a first magnetic field strength range 603a. Additionally, in the second substantially linear region (i.e., sub-regions 601b, 601c, 601d, 601e), the MR element has a second substantially linear response (or responses) to the applied magnetic field over a second magnetic field strength range (i.e., sub-ranges 603b, 603c, 603d, 603e). Further, in first and second saturation regions 601f, 601g, the MR element has substantially no response to the applied magnetic field over third and fourth magnetic field strength ranges 603f, 603g, i.e., the MR element is saturated and the resistance of the MR element no longer changes (or changes very little) in response to changes in the magnetic field.

In embodiments, the MR element also has a respective substantially linear response in each of the sub-regions 601b, 601c, 601d, 601e of the second substantially linear region, with the substantially linear responses of the MR element in the sub-regions 601b, 601c, 601d, 601e comprising the second substantially linear response of the second substantially linear region. In particular, in sub-region 601b, the MR element may have a fifth substantially linear response to the applied magnetic field over sub-range 603b of the second magnetic field strength range. Additionally, in sub-region 601c, the MR element may have a sixth substantially linear response to the applied magnetic field over sub-range 603c of the second magnetic field strength range. Additionally, in sub-region 601d, the MR element may have a seventh substantially linear response to the applied magnetic field over sub-range 603d of the second magnetic field strength range. Further, in sub-region 601e, the MR element may have an eighth substantially linear response to the applied magnetic field over sub-range 603e of the second magnetic field strength range.

In embodiments, each of the substantially linear responses (e.g., fifth, sixth, seventh, etc.) of the various sub-regions 601b, 601c, 601d, 601e in the second substantially linear region of the MR element are different from each other. Additionally, in embodiments, two or more of the substantially linear responses of the sub-regions 601b, 601c, 601d, 601e are the same as or similar to each other. For example, in embodiments, the fifth and sixth substantially linear responses of the MR element may be the same as or similar to each other, but different than the seventh substantially linear response of the MR element. Additionally, in embodiments, the seventh and eighth substantially linear responses of the MR element may be the same as or similar to each other, but different than the fifth and sixth substantially linear responses of the MR element.

As illustrated, sub-region 601b of the second substantially linear region is contiguous with sub-region 601d of the second substantially linear region. Additionally, sub-region 601c of the second substantially linear region is contiguous with sub-region 601e of the second substantially linear region. However, sub-regions 601b, 601d are non-contiguous with sub-regions 601c, 601e. It follows that in the illustrated embodiment the second substantially linear region includes a plurality of non-contiguous sub-regions. It is understood that in other embodiments the second substantially linear region may include a plurality of contiguous sub-regions (or a single sub-region).

As also illustrated, the MR element characterized by curves 602, 604 has an associated sensitivity level (or levels) to the applied magnetic field in each of the substantially linear regions and the saturation regions. As discussed above, with regard to MR elements, sensitivity corresponds to a change in the resistance of an MR element in response to an applied magnetic field. In embodiments, the respective responses (e.g., first, second, third, etc. substantially linear responses) of the MR element to the magnetic field result in the MR element having the sensitivity levels.

In particular, in first substantially linear region 601a, the MR element has a first sensitivity level (i.e., a first rate of change in resistance) to changes in magnetic field strength of the applied magnetic field over the first magnetic field strength range 603a. Additionally, in the second substantially linear region (i.e., sub-regions 601b, 601c, 601d, 601e), the MR element has a second sensitivity level to changes in magnetic field strength of the applied magnetic field over the second magnetic field strength range (i.e., sub-ranges 603b, 603c, 603d, 603e). Further, in first and second saturation regions 601f, 601g, the MR element has third and fourth respective sensitivity levels to changes in magnetic field strength of the applied magnetic field over third and fourth magnetic field strength ranges 603f, 603g.

In embodiments, the MR element also has a respective sensitivity level to changes in magnetic field strength of the applied magnetic field in each of the sub-regions 601b, 601c, 601d, 601e of the second substantially linear region, with the sensitivity levels of the MR element in the sub-regions 601b, 601c, 601d, 601e comprising the second sensitivity level of the second substantially linear region. In particular, in sub-region 601b, the MR element may have a fifth sensitivity level to changes in magnetic field strength of the applied magnetic field over sub-range 603b of the second magnetic field strength range. Additionally, in sub-region 601c, the MR element may have a sixth sensitivity level to changes in magnetic field strength of the applied magnetic field over sub-range 603c of the second magnetic field strength range. Additionally, in sub-region 601d, the MR element may have a seventh sensitivity level to changes in magnetic field strength of the applied magnetic field over sub-range 603d of the second magnetic field strength range. Further, in sub-region 601e, the MR element may have an eighth sensitivity level to changes in magnetic field strength of the applied magnetic field over sub-range 603e of the second magnetic field strength range.

In embodiments, the first magnetic field strength range 603a associated with first substantially linear region 601a corresponds to relatively "low" strength applied magnetic fields (here, between about −20 Oe and +20 Oe). Additionally, in embodiments, magnetic field strength sub-ranges 603b, 603c associated with sub-regions 601b, 601c of the second substantially linear region, respectively, correspond to relatively "medium" strength magnetic fields that are greater in magnetic field strength than the "low" strength magnetic fields associated with the first magnetic field strength range 603a of first substantially linear region 601a. In the illustrated embodiment, magnetic field strength sub-range 603b comprises negative magnetic field strength values (here, between about −20 Oe and about −120 Oe) and magnetic field strength sub-range 603c comprises positive magnetic field strength values (here, between about 20 Oe and about 125 Oe).

Additionally, in embodiments, the magnetic field strength sub-ranges 603d, 603e associated with sub-regions 601d, 601e of the second substantially linear region, respectively, correspond to relatively "high" strength magnetic fields that are greater in magnetic field strength than the "medium" strength magnetic fields associated with magnetic field strength sub-ranges 603b, 603c of sub-regions 601b, 601c of the second substantially linear region. In embodiments, the "high" strength magnetic fields are not large enough to saturate the MR element. In the illustrated embodiment, the magnetic field strength sub-range 603d comprises negative magnetic field strength values (here, between about −120 Oe and about −430 Oe) and magnetic field strength sub-range 603e comprises positive magnetic field strength values (here, between about 125 Oe and about 550 Oe).

Further, in embodiments, the third and fourth magnetic field strength ranges 603f, 603g associated with saturation regions 601f, 601g, respectively, correspond to magnetic fields that are greater in magnetic field strength than the "high" strength magnetic fields associated with magnetic field strength sub-ranges 603d, 603e of sub-regions 601d, 601e of the second substantially linear region. The magnetic fields associated with the third and fourth magnetic field strength ranges 603f, 603g, unlike the magnetic fields associated with the magnetic field strength sub-ranges 603d, 603e of the second magnetic field strength range, are large enough to saturate the MR element such that the resistance of the MR element remains substantially constant in the presence of changes in the applied magnetic field. In the illustrated embodiment, the magnetic field strength range-range 603d comprises negative magnetic field strength values (here, between about −120 Oe and about −430 Oe) and magnetic field strength sub-range 603e comprises positive magnetic field strength values (here, between about 130 Oe and about 550 Oe).

In the example embodiment shown, the first sensitivity level of the MR element in first substantially linear region 601a is different than (here, greater than) the second sensitivity level of the MR element in the second substantially linear region (i.e., sub-regions 601b, 601c, 601d, 601e). Additionally, the second sensitivity level of the MR element in the second substantially linear region is different than (here, greater than) the third and fourth sensitivity levels of the MR element in saturation regions 601f, 601g.

Further, in the example embodiment shown, the fifth and sixth sensitivity levels of the MR element in sub-regions 601b, 601c of the second substantially linear region are different than (here, greater than) the seventh and eighth sensitivity levels of the MR element in sub-regions 601d, 601e of the second substantially linear region. Further, the seventh and eighth sensitivity levels of the MR element in sub-regions 601d, 601e of the second substantially linear region are different than (here, greater than) the third and fourth sensitivity levels of the MR element in saturation regions 601f, 601g.

In other words, the MR element characterized by curves 602, 604 is more responsive (i.e., experiences a greater change in resistance, and has a higher sensitivity) to applied magnetic fields in the first magnetic field strength range 603a associated with first substantially linear region 601a than it is to applied magnetic fields in the second magnetic field strength range (i.e., sub-ranges 603b, 603c, 603d, 603e) associated with the second substantially linear region (i.e., sub-regions 601b, 601c, 601d, 601e). Additionally, the MR element is more responsive to applied magnetic fields in the second magnetic field strength range than it is to applied magnetic fields in the third and fourth magnetic field strength ranges 603f, 603g associated with saturation regions 601f, 601g.

Further, in the example embodiment shown, the MR element is more responsive to applied magnetic fields in the sub-ranges 603b, 603c associated with sub-regions 601b, 601c of the second substantially linear region than it is to applied magnetic fields in sub-ranges 603d, 603e associated with sub-regions 601d, 601e of the second substantially linear region. Further, the MR element is more responsive to applied magnetic fields in the sub-ranges 603d, 603e associated with sub-regions 601d, 601e of the second substantially linear region than it is to applied magnetic fields in the third and fourth magnetic field strength ranges 603f, 603g associated with saturation regions 601f, 601g.

In embodiments, the first substantially linear response of the MR element in first substantially linear region 601a corresponds to a substantially linear response of a selected stack portion of the MR element. For example, the first substantially linear response may correspond to a substantially linear response of a second stack portion (e.g., 730, shown in FIG. 7) of the MR element. Similarly, in embodiments, the second substantially linear response of the MR element in the second substantially linear region (i.e., sub-regions 601b, 601c, 601d, 601e) may correspond to a substantially linear response of a second stack portion (e.g., 730, shown in FIG. 7) of the MR element.

Additionally, in embodiments, the first substantially linear response of the MR element in first substantially linear region 601a corresponds to a substantially linear response of a selected stack portion of the MR element, but with other stack portions of the MR element also contributing to the first substantially linear response. For example, the first substantially linear response may correspond to a substantially linear response of a second stack portion (e.g., 730, shown in FIG. 7) of the MR element, but with a first stack portion (e.g., 710, shown in FIG. 7) of the MR element also contributing to at least a portion of the first substantially linear response. Similarly, in embodiments, the second substantially linear response of the MR element in the second substantially linear region (i.e., sub-regions 601b, 601c, 601d, 601e) may correspond to a substantially linear response of the first stack portion of the MR element, but with the second stack portion of the MR element also contributing to at least a portion of the second substantially linear response. The foregoing may, for example, be due to the second stack portion still being responsive to applied magnetic fields over the first magnetic field strength range 603a associated with the first substantially linear region 601a, but with a sensitivity level that is substantially reduced compared to a sensitivity level of the second stack portion over the second magnetic field strength range (i.e., sub-ranges 603b, 603c, 603d, 603e) associated with the second substantially linear region (i.e., sub-regions 601b, 601c, 601d, 601e).

The first substantially linear region 601a and the second substantially linear region (i.e., sub-regions 601b, 601c, 601d, 601e) correspond to an operational range of the MR element characterized by curves 602, 604 in the illustrated embodiment. In other words, the operational range of the MR element, which corresponds to a range of magnetic fields in which the MR element has a resistance that is indicative of a magnetic field strength of the magnetic field to which the MR element is exposed, includes a plurality of substantially linear regions (e.g., piecewise or discrete linear regions). Each of the substantially linear regions has a respective substantially linear response to the applied magnetic field, as discussed above. This is in contrast the prior art MR elements discussed in connection with figures above (e.g., 400, shown in FIG. 4), which have an operational range with a single substantially linear region and a single substantially linear response over the substantially linear region. One example result of the foregoing is the operational range of the MR element characterized by curves 602, 604 may have an increased operational range compared, for example, to an operational range of the prior art MR elements, particularly where clipping may occur at much larger magnetic field strength levels of an applied magnetic field.

Another example result of the foregoing is that the operational range of the MR element characterized by curves 602, 604 includes a plurality of sensitivity levels corresponding to the plurality of substantially linear responses of the MR element. This may, for example, provide for the MR element having a first sensitivity level at relatively "low" strength fields (e.g., where SNR is relatively "low") and a second sensitivity level that is different than the first sensitivity level at magnetic fields that are greater than the "low" strength magnetic fields (e.g., where SNR is relatively "high"), but not in saturation.

In embodiments, the sensitivity levels (e.g., first, second, third, etc.) and/or magnetic field strength ranges (e.g., first, second, third, etc.) associated with each of the above-described substantially linear regions and saturation regions may be adjusted through selection of one or more characteristics (e.g., construction and/or dimensions) of the MR element characterized by curves 602, 604, as will be described further in connection with figures below.

Figure 7:
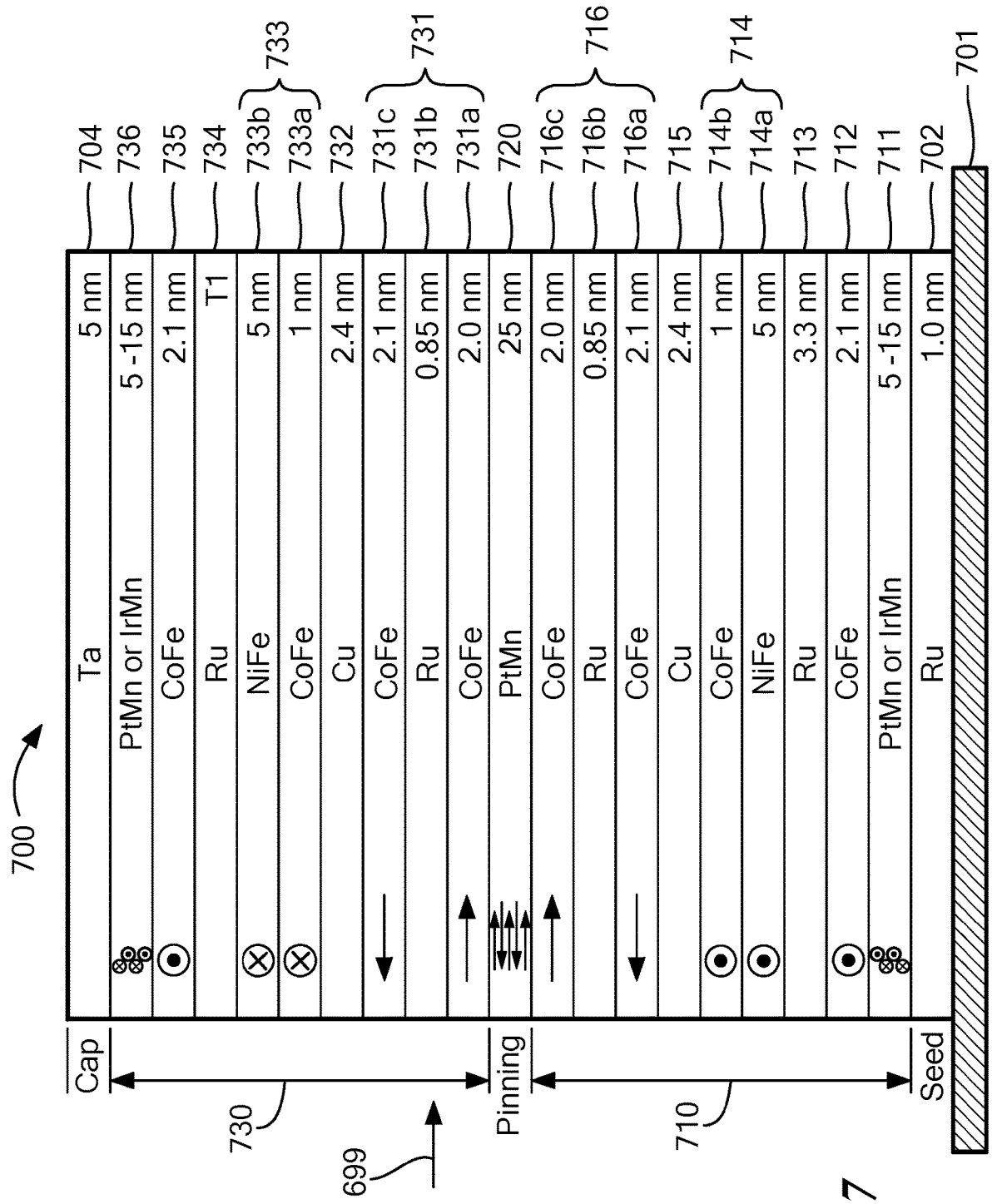
FIG. 7 is a block diagram showing layers of a first example magnetoresistance element according to the disclosure.

Referring now to FIG. 7, a first example magnetoresistance (MR) element 700 according to the disclosure is shown. The MR element 700 is deposited upon a substrate 701 (e.g., a Si Substrate) and includes a first material stack portion (also sometimes referred to herein as "a first stack portion") 710 and a second material stack portion (also sometimes referred to herein as "a second stack portion") 730. The first stack portion 710 has first and second opposing surfaces, with the first surface of the first stack portion 710 disposed over a seed layer 702 (e.g., a non-magnetic seed layer) and the seed layer 702 disposed between the first stack portion 710 and the substrate 701. Additionally, the second stack portion 730 has first and second opposing surfaces, with the first surface of the second stack portion 730 disposed over a pinning layer 720 (e.g., an antiferromagnetic pinning layer) and the pinning layer 720 disposed between the second stack portion 730 and the first stack portion 710. A cap layer 704 (e.g., a non-magnetic cap layer) is disposed over the second surface of the second stack portion 730.

The first stack portion 710, which has a first substantially linear response corresponding to an applied magnetic field over a first magnetic field strength range, as will be discussed further below, includes a first plurality of layers (here, 9 layers). The first plurality of layers includes a pinning layer 711, a pinned layer 712 and a spacer layer 713. The first stack portion 710 also includes a free layer structure 714, a spacer layer 715 and a pinned layer structure 716. The first free layer structure 714 includes a first free layer 714*a* and a second free layer 714*b*. Additionally, the pinned layer structure 716 includes first pinned layer 716*a*, second pinned layer 716*c* and spacer layer 716*b*.

The pinning layer 711 is disposed over the seed layer 702 and the pinned layer 712 is disposed over the pinning layer 711. Additionally, the spacer layer 713 is disposed over the pinned layer 712 and the free layer structure 714 is disposed over the spacer layer 713. Further, the spacer layer 715 is disposed over the free layer structure 714 and the pinned layer structure 716 is disposed over the spacer layer 715.

In embodiments, pinning layer 711 may be an antiferromagnetic pinning layer and pinned layer 712 may be a ferromagnetic pinned layer, and spacer layer 713 may be a nonmagnetic spacer layer. Additionally, in embodiments, free layer structure 714 may be a substantially unbiased free layer, spacer layer 715 may be a nonmagnetic spacer layer and pinned layer structure 716 include a synthetic antiferromagnetic (SAF) pinned layer structure or layer. First free layer 714*a* of free layer structure 714 may be a ferromagnetic free layer and second free layer 714*b* of free layer structure 714 may be a ferromagnetic free layer. Additionally, first pinned layer 716*a* of pinned layer structure 716 may be ferromagnetic pinned layer, second pinned layer 716*c* of pinned layer structure 716 may be a ferromagnetic pinned layer, and spacer layer 716*b* of pinned layer structure 716 may be a nonmagnetic spacer layer. In embodiments, at least one of first pinned layer 716*a* and second pinned layer 716*c* comprises a same or similar material as second free layer 714*b*.

In the illustrated embodiment, pinning layer 711 is shown as including PtMn or IrMn and pinned layer 712 is shown as including CoFe. Additionally, spacer layer 713 is shown as including Ru, first free layer 714*a* is shown as including NiFe and second free layer 714*b* is shown as including CoFe. Further, spacer layer 715 is shown as including Cu, first pinned layer 716*a* is shown as including CoFe, spacer layer 716*b* is shown as including Ru and second pinned layer 716*c* is shown as including CoFe. However, it is understood that each of the above-described layers in the first stack portion 710 may include materials, or compositions of materials, that are different than that which is shown, as will be described further below.

In the illustrated embodiment, pinning layer 711 is also shown as having a thickness between about 5 nm and about 15 nm and pinned layer 712 is shown as having a thickness of about 2.1 nm. Additionally, spacer layer 713 is shown as having a thickness of about 3.3 nm, first free layer 714*a* is shown as having a thickness of about 5 nm and second free layer 714*b* is shown as having a thickness of about 1 nm. Further, spacer layer 715 is shown as having a thickness of about 2.4 nm, first pinned layer 716*a* is shown as having a thickness of about 2.1 nm, spacer layer 716*b* is shown as having a thickness of about 0.85 nm and second pinned layer 716*c* is shown as having a thickness of about 2.0 nm. However, it is understood that each of the above-described layers may have a layer thickness that is different than that which is shown, as will be described further below.

The second stack portion 730, which has a second substantially linear response that is different than the first substantially linear response of the first stack portion 710, as will be discussed further below, includes a second plurality of layers (here, 9 layers), i.e., a same number of layers as the first plurality of layers of first stack portion 710 in the illustrated embodiment. The second plurality of layers includes a pinned layer structure 731, a spacer layer 732 and a free layer structure 733. The second plurality of layers also includes a spacer layer 734 and a pinned layer 735. The pinned layer structure 731 includes a first pinned layer 731*a*, a second pinned layer 731*c* and a spacer layer 731*b*. Additionally, the free layer structure 733 includes a first free layer 733*a* and a second free layer 733*b*.

The pinned layer structure 731 is deposited over the pinning layer 720 and the spacer layer 732 is disposed over the pinned layer structure 731. Additionally, the free layer structure 733 is disposed over the spacer layer 732 and the spacer layer 734 is disposed over the free layer structure 733. Further, the pinned layer 735 is disposed over the spacer layer 734 and the pinning layer 736 is disposed over the pinned layer 735.

In embodiments, the pinned layer structure 731 may include an SAF pinned layer structure or layer and the spacer layer 732 may be a nonmagnetic spacer layer. Additionally, in embodiments, the first pinned layer 731*a* of pinned layer structure 731 may be ferromagnetic pinned layer, the second pinned layer 731*c* of pinned layer structure 731 may be a ferromagnetic pinned layer, and the spacer layer 731*b* of pinned layer structure 731 may be a nonmagnetic spacer layer. Further, in embodiments, the first free layer 733*a* of free layer structure 733 may be a ferromagnetic free layer and the second free layer 733*b* of free layer structure 733 may be a ferromagnetic free layer. In embodiments, the spacer layer 734 may be a nonmagnetic spacer layer, the pinned layer 735 may be a ferromagnetic pinned layer and the pinning layer 736 may be an antiferromagnetic pinning layer.

In the illustrated embodiment, the first pinned layer 731*a* is shown as including CoFe, spacer layer 731*b* is shown as including Ru and the second pinned layer 731*c* is shown as including CoFe. Additionally, spacer layer 732 is shown as including Cu, first free layer 733*a* is shown as including CoFe and second free layer 733*b* is shown as including NiFe. Further, spacer layer 734 is shown as including Ru, pinned layer 735 is shown as including CoFe and pinning layer 736 is shown as including PtMn or IrMn. However, similar to the layers in the first stack portion 710 of MR element 700, it is understood that each of the above-described layers in the second stack portion 730 of MR element 700 may include materials, or compositions of materials, that are different than that which is shown, as will be described further below.

In the illustrated embodiment, the first pinned layer 731a is shown as having a thickness of about 2.0 nm, spacer layer 731b is shown as including having a thickness of about 0.85 nm, and the second pinned layer 731c is shown as having a thickness of about 2.1 nm. Additionally, spacer layer 732 is shown as having a thickness of about 2.4 nm, first free layer 733a is shown as having a thickness of about 1 nm and second free layer 733b is shown as having a thickness of about 5 nm. Further, spacer layer 734 has a thickness T1 in one of four example ranges, e.g., about 1.6 nm to about 1.8 nm, about 2.2 nm to about 2.4 nm, about 2.9 nm to about 3.1 nm, or about 3.5 nm to about 3.7 nm. As one example, spacer layer 734 may have a thickness T1 of about 2.0 nm. Additionally, pinned layer 735 is shown as having a thickness of about 2.1 nm and pinning layer 736 is shown as having a thickness of between about 5 nm and about 15 nm. However, similar to the layers in the first stack portion 710 of MR element 700, it is understood that each of the above-described layers in the second stack portion 730 of MR element 700 may have a layer thickness that is different than that which is shown, as will be described further below.

Within some of the plurality of layers in MR element 700, arrows are shown that are indicative of magnetization directions of the layers when the MR element 700 experiences a nominal (or zero) applied magnetic field. Arrows coming out of the page are indicated as dots within circles and arrows going into the page are indicated as crosses within circles.

Detailed descriptions of the various magnetization directions are not made herein. However, let it suffice here to say that, as is known in the art, some MR elements (e.g., GMR and TMR elements) operate with spin electronics (i.e., electron spins) where the resistance of the MR elements is related to the magnetization directions of certain layers in the MR elements.

The MR element 700 has a maximum response axis to magnetic fields which is parallel to a surface of the substrate 701 over which the MR element 700 is deposited, as indicated by arrow 699.

As noted above, the first stack portion 710 of MR element 700 has a first substantially linear response corresponding to an applied magnetic field over a first magnetic field strength range. Additionally, as noted above, the second stack portion 730 has a second substantially linear response that is different than the first substantially linear response of the first stack portion 710. The second substantially linear response corresponds to the applied magnetic field over a second magnetic field strength range.

In embodiments, the first substantially linear response of the first stack portion 710 results in the MR element 700 having a first sensitivity level (i.e., a first rate of change in resistance) to changes in magnetic field strength in response to the applied magnetic field being within the first magnetic field strength range. Additionally, in embodiments the second substantially linear response of the second stack portion 730 results in the MR element 700 having a second sensitivity level (i.e., a second rate of change in resistance) to changes in magnetic field strength in response to the applied magnetic field being within the second magnetic field strength range. In embodiments, the first magnetic field strength range overlaps with one or more portions of the second magnetic field strength range, i.e., the first magnetic field strength range includes one or more magnetic field strengths that the second magnetic field strength range also comprises. Additionally, in embodiments at least one of the first and second magnetic field strength ranges includes one or more sub-ranges (e.g., 603b, 603c, 603d, 603e, shown in FIG. 6), and the first and/or second substantially linear responses associated with the first and second magnetic field strength ranges includes corresponding sub-regions (e.g., 601b, 601c, 601d, 601e, shown in FIG. 6).

The first and second stack portions 710, 730 each have at least one characteristic (e.g., construction and/or dimensions) selected to result in the first and second stack portions 710, 730 having the first and second substantially linear responses, respectively.

For example, one or more parameters associated with the construction of the first and second stack portions 710, 730 may comprise the at least one characteristic selected to result in the first and second stack portions 710, 730 having the first and second substantially linear responses. Illustrative construction parameters include materials, layer thickness, and an ordering of one or more of the layers (e.g., antiferromagnetic layers, pinned layers and/or non-magnetic layers) of the first and second stack portions 710, 730. The construction parameters may also include a number of layers in the first and second stack portions 710, 730.

In the illustrated embodiment, each of the layers in the first and second stack portions 710, 730 is shown as including one or more materials. In embodiments, materials of one or more of the layers in the first stack portion 710 are selected to result in the first stack portion having the first substantially linear response. Additionally, in embodiments, materials of one or more of the layers in the second stack portion 730 are selected to result in the second stack portion having the second substantially linear response. For example, the material(s) of spacer layer 713 in the first stack portion 710 (here, Ruthenium (Ru)) and/or the material(s) of spacer layer 715 in the first stack portion 710 (here, Copper (Cu)) may be selected to result in the first stack portion 710 having the first substantially linear response. Additionally, the material(s) of spacer layer 732 in the second stack portion 730 (here, Cu) and/or the material(s) of spacer layer 734 in the second stack portion 730 (here, Ru) may be selected to result in the second stack portion 730 having the second substantially linear response. A spacer layer comprising Ru, for example, may provide for antiferromagnetic coupling or ferromagnetic coupling between surrounding layers, which may provide for the first and/or second substantially linear responses, as will be discussed further below.

It is understood that the material(s) of layers other than spacer layers 713, 715 in the first stack portion 710 and spacer layers 732, 734 in the second stack portion 730 may be selected to result in the first and second stack portions 710, 730 having the first and second substantially linear responses.

In the illustrated embodiment, each of the layers in the first and second stack portions 710 is also shown having a respective thickness. In embodiments, the thickness of at least one of the layers of the first stack portion 710 is selected to result in the first stack portion having the first substantially linear response. Additionally, in embodiments, the thickness of at least one of the layers of the second stack portion 730 is selected to result in the second stack portion having the second substantially linear response. For example, spacer layer 713 in the first stack portion 710 may have a first selected thickness (here, about 3.3 nm) to result in the first stack portion 710 having the first substantially linear response. Additionally, spacer layer 734 in the second stack portion 730 may have a second selected thickness that is different than the first selected thickness to result in the second stack portion 730 having the second substantially linear response that is different than the first substantially linear response. In the example embodiment shown, spacer layer 734 has a thickness selected to be in one of four example ranges, e.g., about 1.6 nanometers (nm) to about 1.8 nm, about 2.2 nm to about 2.4 nm, about 2.9 nm to about 3.1 nm, or about 3.5 nm to about 3.7 nm.

In embodiments, the example ranges are determined by measuring a transfer curve associated with the MR element at different thicknesses (e.g., Ru thicknesses) of the spacer layer 734, and selecting a thickness (or thicknesses) T1 of the spacer layer 734 to achieve a particular substantially linear response (e.g., a first and/or a second substantially linear response). A spacer layer 734 having a thickness T1 in a first one of the ranges (e.g., about 1.6 nm to about 1.8 nm) may, for example, have a different peak position at about 90 degrees with respect to the maximum response axis 699 of the MR element 700 and/or a different slope at about 0 degrees with respect to the maximum response axis 699 than a spacer layer 734 having a thickness T1 in a second one of the ranges (e.g., about 2.2 nm to about 2.4 nm).

It is understood that thicknesses of layers other than spacer layer 713 in the first stack portion 710 and spacer layer 734 in the second stack portion 730 may be selected to result in the first and second stack portions 710, 730 having the first and second substantially linear responses. It is also understood that the thicknesses of certain layers in the first and second stack portions 710, 730 may be selected to provide a desired amount and/or type of magnetic coupling between adjacent layers in the first and second stack portions 710, 730. For example, the thickness of the spacer layer 713 in the first stack portion 710 may be selected to provide a desired amount of magnetic coupling between pinned layer 712 and free layer structure 714 in the first stack portion 710. Additionally, the thickness of the spacer layer 713 may be selected to provide a desired type of magnetic coupling between the pinned layer 712 and the free layer structure 714, i.e., ferromagnetic coupling or antiferromagnetic coupling, or between ferromagnetic and antiferromagnetic coupling.

Here, the coupling is shown to be ferromagnetic coupling, but, by selection of the thickness of the spacer layer 713, the coupling can be antiferromagnetic or between ferromagnetic and antiferromagnetic coupling. In other words, in the absence of an applied magnetic field it is possible for a magnetization direction of the free layers 714a, 714b in the free layer structure 714 to be rotated either as shown (out of the page) or into the page, depending upon a selected thickness of the spacer layer 713. Additionally, by selection of the thicknesses of the spacer layers 732, 734, the coupling between layers adjacent to the spacer layers 732, 734 can be antiferromagnetic or between ferromagnetic and antiferromagnetic coupling.

As another example, spacer layer 716b in the first stack portion 710 may have a first thickness (e.g., 0.85 nm) selected to provide a first magnetic coupling between surrounding layers (e.g., layers 716a, 716c) having a first coupling strength, and spacer layer 713 may have a second thickness (e.g., 3.3 nm) selected to provide a second magnetic coupling between surrounding layers (e.g., layers 712, 714) having a second coupling strength that is different than (e.g., less than) the first coupling strength. Ru may, for example, be well suited for the spacer layer 716b and the spacer layer 713 since it allows antiferromagnetic coupling or ferromagnetic coupling between surrounding layers according to the Ru thickness. In other words, the materials and thicknesses of layers in the first and second stack portions 710, 730 may be selected to achieve a particular magnetic coupling (or coupling strength) between surrounding layers.

In embodiments, the first and second substantially linear responses are based, at least in part, upon the magnetic couplings occurring in the first and second stack portions 710, 730. In embodiments, the magnetic couplings are the main (or a main) factor determining the first and second substantially linear responses. Additionally, in embodiments, an annealing process used to manufacture the MR element 700 may affect the magnetic couplings, especially an angle at which the coupling occurs.

In the illustrated embodiment, the first plurality of layers in the first stack portion 710 and the second plurality of layers in the second stack portion 730 are additionally shown arranged in a particular ordering. In embodiments, an ordering of the first plurality of layers in the first stack portion 710 corresponds to the at least one characteristic selected to result in the first stack portion 710 having the first substantially linear response. Additionally, in embodiments an ordering of the second plurality of layers in the second stack portion 730 corresponds to the at least one selected to result in the second stack portion 730 having the second substantially linear response. For example, due to the presence of the spacer layer 716b between the first and second pinned layers 716a, 716c in the pinned layer structure 716 of first stack portion 710, the first pinned layer 716a tends to couple antiferromagnetically with the second pinned layer 716c. As a result, the first pinned layer 716a has a magnetization direction that points in a direction that is different than a magnetization direction in which a magnetic field of the second pinned layer 716b points. In other words, an ordering of the spacer layer 716b and the first and second pinned layers 716a, 716c may affect a type of coupling (e.g., antiferromagnetic or ferromagnetic) which may occur between the first and second pinned layers 716a, 716c, and the coupling may result in the first stack portion 710 having the first substantially linear response.

In general, it has been found that the arrangement and orientation of the ferromagnetic and non-ferromagnetic layers of the MR element 700 can affect the way the MR element 700 responds to the applied magnetic field. Additionally, different orientations of the ferromagnetic and non-ferromagnetic layers of the MR element 700 can produce different types of MR elements. In one embodiment, the MR element 700 is one of a giant magnetoresistance (GMR) element, a magnetic tunnel junction (MTJ) element and a tunneling magnetoresistance (TMR) element.

In the illustrated embodiment, the first plurality of layers in the first stack portion 710 and the second plurality of layers in the second stack portion 730 are also shown including a particular number of layers (here, nine layers). In embodiments, the number of layers provided in the first plurality of layers corresponds to the at least one characteristic selected to result in the first stack portion having the first substantially linear response. Additionally, in embodiments the number of layers provided in the second plurality of layers corresponds to the at least one characteristic selected to result in the second stack portion having the second substantially linear response.

In some embodiments, the first plurality of layers includes a same number of layers as the second plurality of layers, as shown in FIG. 7, for example. In other embodiments, the first plurality of layers includes a different number of layers than the second plurality of layers. An example MR element according to the disclosure comprising first and second stack portions having respective first and second pluralities of layers with a different number of layers is shown and described below in connection with FIG. 12, for example.

In general, it has been found that the materials, layer thicknesses, an ordering and a number of layers in the first and second stack portions 710, 730 can affect the manner in which the first and second stack portions 710, 730 of the MR element 700 respond to an applied magnetic field.

For example, in one embodiment the materials of spacer layer 713 in first stack portion 710 are selected to affect the manner in which the MR element 700 responds to the applied magnetic field, and provide for the various subregions 601b, 601c, 601d, 601e of the second substantially linear region shown in FIG. 6, for example. In the illustrated embodiment, for example, Ru was selected as a material for spacer layer 713 since with Ru it is possible to establish a relatively good coupling between free layer 714 and bias portions (e.g., layer 711 and/or layer 712) of the first stack portion 710. With materials other than Ru selected for spacer layer 713, the coupling may be reduced (or lost), which may result in a narrower first substantially linear region 601a than that which is shown in FIG. 6, for example. In embodiments, the thickness of the Ru in spacer layer 713 may also affect the manner in which the MR element 700 responds to the applied magnetic field. For example, in some embodiments the coupling through the Ru in spacer layer 713 is oscillating between ferromagnetic (F) and antiferromagnetic (AF) and for some thicknesses of Ru the coupling is close to zero. The type of the coupling (AF vs F) may not determine the linear range of a linear region (e.g., linear region 601a), but an amplitude of the coupling may determine (or at least impact) the linear range. As one example, if the thickness of the Ru in spacer layer 713 in first stack portion 710 provides for a coupling strength that is similar to a coupling strength obtained through spacer layer 734 in second stack portion 730, the first and second stack portions 710, 730 may behave in a same or similar way and the desired piecewise response may not be provided. However, if one of spacer layers 713, 734 has a thickness (and/or material) that provides for a coupling amplitude that is lower than the other, the piecewise response may appear. In one embodiment, the lower the coupling amplitude, the narrower the magnetic field strength range 603a of linear region 601a, for example. In embodiments in which there is substantially no coupling, there is a steep transition (i.e., a steep slope or increased sensitivity) in linear region 601a.

While MR element 700 is shown as having particular layers formed from particular materials, it is understood that the MR element 700 is illustrative of one example configuration of an MR element according to the disclosure. Other layers and materials can, for example, be provided in the MR element 700. Additionally, one or more of the above-described layers of MR element 700 may include a plurality of layers (or sub-layers) in some embodiments. Additionally, in some embodiments, one or more other layers (not shown) can be interposed between the layers of MR element 700.

In embodiments, the MR element 700 is provided in a magnetic field sensor (e.g., 1500, shown in FIG. 15, as will be discussed below) or another sensing circuit. As discussed above, a magnetic field sensor is used to describe a circuit that uses a magnetic field sensing element, generally in combination with other circuits. In embodiments, the MR element 700 and the other circuits of the magnetic field sensor can be integrated upon a common substrate (here, substrate 701).

Additional aspects of MR elements according to the disclosure are described below.

Figure 8:
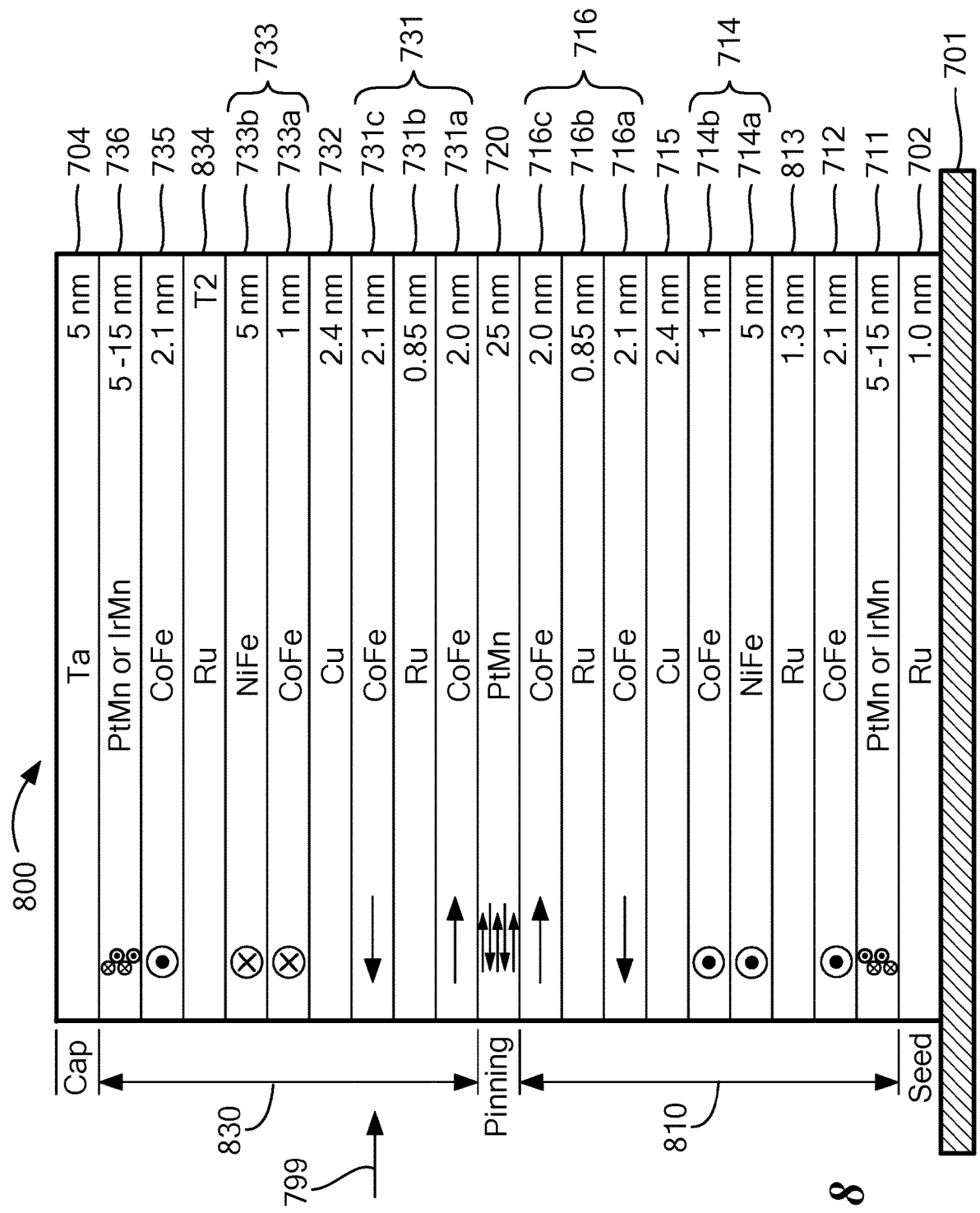
FIG. 8 is a block diagram showing layers of a second example magnetoresistance element according to the disclosure.

Referring now to FIG. 8, in which like elements of FIG. 7 are provided having like reference designations, a second example MR element 800 according to the disclosure includes a first stack portion 810 and a second stack portion 830. The first stack portion 810 has first and second opposing surfaces, with first surface of the first stack portion 810 disposed over seed layer 702 and the seed layer 702 disposed between the first stack portion 810 and the substrate 701 on which the MR element 800 is deposited on. Additionally, the second stack portion 830 has first and second opposing surfaces, with the first surface of the second stack portion 830 disposed over pinning layer 720 and the pinning layer 720 disposed between the first stack portion 810 and the second stack portion 830. Cap layer 704 is disposed over the second surface of the second stack portion 830.

The first stack portion 810 includes a first plurality of layers (here, 9 layers). The first plurality of layers includes pinning layer 711, pinned layer 712 and a spacer layer 813. The first stack portion 810 also includes free layer structure 714, spacer layer 715 and pinned layer structure 716. The first free layer structure 714 includes first free layer 714a and second free layer 714b. Additionally, the pinned layer structure 716 includes first pinned layer 716a, second pinned layer 716c and spacer layer 716b.

The pinning layer 711 is disposed over the seed layer 702 and the pinned layer 712 is disposed over the pinning layer 711. Additionally, spacer layer 813 is disposed over the pinned layer 712 and free layer structure 714 is disposed over the spacer layer 813. Further, spacer layer 715 is disposed over the free layer structure 714 and pinned layer structure 716 is disposed over the spacer layer 715. Spacer layer 813, which may be similar to spacer layer 713 of MR element 700 shown in FIG. 7 but having a thickness that is different than a thickness of the spacer layer 713, may be a nonmagnetic spacer layer.

The second stack portion 830 includes a second plurality of layers (here, 9 layers), i.e., a same number of layers as the first plurality of layers of first stack portion 810 in the illustrated embodiment. The second plurality of layers includes pinned layer structure 731, spacer layer 732 and free layer structure 733. The second plurality of layers also includes spacer layer 834 and pinned layer 735. The pinned layer structure 731 includes first pinned layer 731a, second pinned layer 731c and spacer layer 731b. Additionally, free layer structure 733 includes first free layer 733a and second free layer 733b.

The pinned layer structure 731 is disposed over the pinning layer 720 and the spacer layer 732 is disposed over the pinned layer structure 731. Additionally, the free layer structure 733 is disposed over the spacer layer 732 and the spacer layer 834 is disposed over the free layer structure 733. Further, the pinned layer 735 is disposed over the spacer layer 834 and the pinning layer 736 is disposed over the pinned layer 735. Spacer layer 834, which may be similar to spacer layer 734 of MR element 700 shown in FIG. 7 but having a thickness that is different than a thickness of the spacer layer 734, may be a nonmagnetic spacer layer comprising one or more nonmagnetic materials (e.g., Ru).

Similar to first stack portion 710 in MR element 700 of FIG. 7, the first stack portion 810 in MR element 800 has a first substantially linear response corresponding to an applied magnetic field over a first range of magnetic field strengths (i.e., a first magnetic field strength range). Additionally, similar to second stack portion 730 in MR element 700 of FIG. 7, the second stack portion 830 in MR element 800 has a second substantially linear response that is different than the first substantially linear response, the second substantially linear response corresponding to the applied magnetic field over a second range of magnetic field strengths (i.e., a second magnetic field strength range). In embodiments, the first magnetic field strength range overlaps with one or more portions of the second magnetic field strength range. The MR element 800 has a maximum response axis to the applied magnetic field which is parallel to the substrate surface (e.g., a first surface of the substrate 801) over which the MR element 800 is disposed, as indicated by arrow 799.

The first stack portion 810 has at least one characteristic selected to result in the first stack portion 810 having the first substantially linear response. Additionally, the second stack portion 830 has at least one characteristic selected to result in the second stack portion 830 having the second substantially linear response. The at least one characteristic may include: materials, layer thickness and an ordering of one or more of the layers in the first and second stack portions 810, 830. Additionally, the at least one characteristic may also include a number of layers in the first and second stack portions 810, 830.

In the illustrated embodiment, the thickness of spacer layer 813 in first stack portion 810 may, for example, correspond to the at least one characteristic selected to result in the first stack portion 810 having the first substantially linear response. For example, the spacer layer 813 may have a thickness selected (here, about 1.3 nm) to result in the first stack portion 810 having a first predetermined bias (e.g., a "strong" bias) which, in turn, may result in the first stack portion 810 having the first substantially linear response.

Additionally, in the illustrated embodiment, the thickness T2 of spacer layer 834 in second stack portion 830 may correspond to the at least one characteristic selected to result in the second stack portion 830 having the second substantially linear response. For example, the spacer layer 834 may have a thickness selected (e.g., about 1.7 nm) to result in the second stack portion 830 having a second predetermined bias (e.g., a "very weak" bias) which, in turn, may result in the second stack portion 830 having the second substantially linear response.

In embodiments, the first stack portion 810 of MR element 800 has a first substantially linear response that is different than the first substantially linear response of first stack portion 710 of MR element 700, e.g., due to the at least one characteristic selected to result in the first stack portion 810 having the first substantially linear response. For example, in the illustrated embodiment, spacer layer 813 of first stack portion 810 having a different thickness than spacer layer 713 of first stack portion 710 may result in the first stack portion 810 of MR element 800 having a first substantially linear response that is different than the first substantially linear response of first stack portion 710 of MR element 700.

Additionally, the first stack portion 810 having a first substantially linear response that is different than the first substantially linear response of first stack portion 710 of MR element 700 may, for example, result in the first stack portion 810 having a first sensitivity level (i.e., rate of change in resistance) to changes in magnetic field strengths over a first range of magnetic field strengths that is different than a first sensitivity level of the first stack portion 710 over a similar range of magnetic fields strengths as the first range of magnetic field strengths. In embodiments, the first stack portion 810 may have a first sensitivity level that is substantially the same as a first sensitivity level of the first stack portion 710, but over a different range of magnetic field strengths, for example. As discussed above, in embodiments, the first range of magnetic field strengths may be based upon the at least one characteristic selected to result in the first stack portion (e.g., 810) having the first substantially linear response.

Additionally, in embodiments, the second stack portion 830 of MR element 800 has a second substantially linear response that is different than the second substantially linear response of second stack portion 730 of MR element 700 due to the at least one characteristic selected to result in the second stack portion 830 having the second substantially linear response. For example, in the illustrated embodiment, spacer layer 834 of second stack portion 830 of MR element 800 having a thickness T2 that is different from a thickness T1 of spacer layer 734 of second stack portion 730 of MR element 700 may result in the second stack portion 830 of MR element 800 having a second substantially linear response that is different than the second substantially linear response of second stack portion 730 of MR element 700.

In one embodiment, first stack portion 710 of MR element 700 has a first coupling strength and the first stack portion 810 of MR element 800 has a second coupling strength that is different from (e.g., larger than) the first coupling strength. The foregoing may be due to the first stack portion 810 of MR element 800 having one or more characteristics that are different from one or more characteristics of the first stack portion 710 of MR element 700. For example, as illustrated, spacer layer 813 of first stack portion 810 has a thickness that is different from spacer layer 713 of first stack portion 710. In embodiments, such may result in the second coupling strength of the first stack portion 810 of MR element 800 being larger than the first coupling strength of the first stack portion 710 of MR element 700. The larger coupling strength of the first stack portion 810 may, for example, result in the MR element 800 having a plurality of substantially linear sub-regions that are different from a like plurality of substantially linear regions or sub-regions of MR element 700. For example, with respect to the curves 602, 604 shown in FIG. 6, the MR element 800 may have second and third substantially linear regions (e.g., 601b, 601c) with magnetic field strength sub-ranges (e.g., 603b, 603d) that are different from (e.g., larger than) magnetic field strength sub-ranges associated with second and third substantially linear regions of the MR element 700. Additionally, the MR element 800 may have fourth and fifth substantially linear regions (e.g., 601d, 601e) with magnetic field strength sub-ranges (e.g., 603d, 603e) that are different from (e.g., larger than) magnetic field strength sub-ranges associated with fourth and fifth substantially linear regions of the MR element 700. Further, the MR element 800 may have a first sensitivity level over a first magnetic field strength sub-range (e.g., 603a) that is different from (e.g., larger than) a first sensitivity level over the MR element 700 over a corresponding first magnetic field strength sub-range.

In one embodiment, the second coupling strength of the first stack portion 810 of MR element 800 corresponds to a coupling strength of about 200 Oe, which may be representative of a very strong coupling strength. One example result of the second coupling strength of first stack portion 810 of MR element 800 being so strong is that many thicknesses of spacer layer 834 in second stack portion 830 of MR element 800, especially thicknesses of above about 2.3 nm in some embodiments, may provide for the MR element 800 having a substantially piecewise linear response. MR element 800 may, for example, have a relatively narrow first substantially linear region (e.g., 601a) and a relatively high first sensitivity level over a first magnetic field strength sub-range (e.g., 603a) when spacer layer 834 has a thickness of about 2.4 nm, 3.1 nm, 3.6 nm and 4.3 nm.

The second stack portion 830 having a second substantially linear response that is different than the second substantially linear response of first stack portion 730 of MR element 700 may also result in the second stack portion 830 having a second sensitivity level (i.e., rate of change in resistance) to changes in magnetic field strengths over a second range of magnetic field strengths that is different than a second sensitivity level of the second stack portion 730 over a similar range of magnetic fields strengths as the first range of magnetic field strengths. In embodiments, the second stack portion 830 may have a second sensitivity level that is substantially the same as a second sensitivity level of the second stack portion 730, but over a different range of magnetic field strengths, for example. As discussed above, in embodiments, the second range of magnetic field strengths may be based upon the at least one characteristic selected to result in the second stack portion (e.g., 830) having the second substantially linear response.

In embodiments, the MR element 800 is provided in a magnetic field sensor (e.g., 1500, shown in FIG. 15, as will be discussed), and the MR element 800 is configured to generate the first and second substantially linear responses discussed above. Additionally, in embodiments, the first and second substantially linear responses have substantially zero offset with respect to an expected response of the MR element 800 at an applied magnetic field strength of about zero Oersteds (i.e., the MR element 800 is annealed for a substantially zero offset). The foregoing may, for example, result in the MR element 800 having substantially no offset, for example, when experiencing an applied magnetic field having a magnetic field strength of about zero Oersteds. Additionally, the foregoing may result in the linear range of the MR element 800 being substantially evenly distributed about zero Oersteds, as will be further discussed below.

Figure 9:
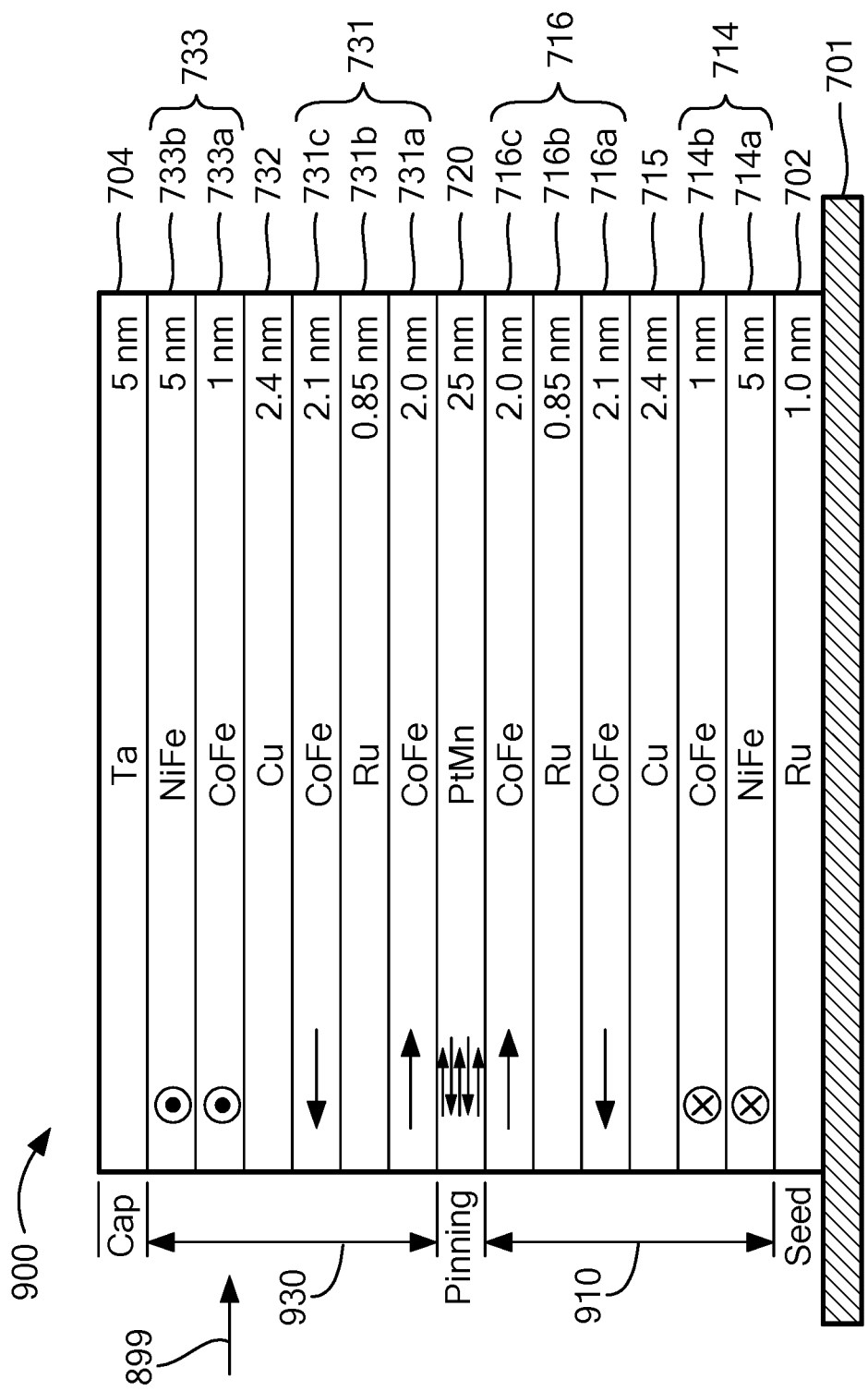
FIG. 9 is a block diagram showing layers of a third example magnetoresistance element according to the disclosure.

Referring to FIG. 9, in which like elements of FIG. 7 are shown having like reference designations, a third example MR element 900 includes a first stack portion 910 and a second stack portion 930. The first stack portion 910 has first and second opposing surfaces, with the first surface of the first stack portion 910 disposed over seed layer 702 and the seed layer 702 disposed between the first stack portion 910 and the substrate 701 on which the MR element 900 is deposited upon. Additionally, the second stack portion 930 has first and second opposing surfaces, with the first surface of the second stack portion 930 disposed over pinning layer 720 and the pinning layer 720 disposed between the first stack portion 910 and the second stack portion 930. Cap layer 704 is disposed over the second surface of the second stack portion 930.

The first stack portion 910 includes a first plurality of layers (here, 6 layers), i.e., fewer layers than first stack portion 710 of MR element 700 shown in FIG. 7 and first stack portion 810 of MR element 800 shown in FIG. 8. The first plurality of layers includes free layer structure 714, spacer layer 715 and pinned layer structure 716. The free layer structure 714 includes first free layer 714a and second free layer 714b. Additionally, the pinned layer structure 716 includes first pinned layer 716a, second pinned layer 716c and spacer layer 716b.

The free layer structure 714 is disposed over the seed layer 702 and the spacer layer 715 is disposed over the free layer structure 714. Additionally, the pinned layer structure 716 is disposed over the spacer layer 715.

The second stack portion 930 includes a second plurality of layers (here, 6 layers), i.e., a same number of layers as the first plurality of layers of first stack portion 910 in the illustrated embodiment. The second plurality of layers includes pinned layer structure 731, spacer layer 732 and free layer structure 733. The pinned layer structure 731 includes first pinned layer 731a, second pinned layer 731c and spacer layer 731b. Additionally, the free layer structure 733 includes first free layer portion 733a and second free layer portion 733b.

The pinned layer structure 731 is disposed over the pinning layer 720 and the spacer layer 732 is disposed over the pinned layer structure 731. Additionally, the free layer structure 733 is disposed over the spacer layer 732.

Similar to first stack portion 810 in MR element 800 of FIG. 8, the first stack portion 910 in MR element 900 has a first substantially linear response corresponding to an applied magnetic field over a first magnetic field strength range. Additionally, similar to second stack portion 830 in MR element 800 of FIG. 8, the second stack portion 1130 in MR element 900 has a second substantially linear response that is different than the first substantially linear response, the second substantially linear response corresponding to the applied magnetic field over a second magnetic field strength range. The MR element 900 has a maximum response axis to magnetic fields (e.g., the applied magnetic field) which is parallel to the substrate surface (e.g., a first surface of the substrate 701) over which the MR element 900 is disposed, as indicated by arrow 899.

The first stack portion 910 has at least one characteristic selected to result in the first stack portion 910 having the first substantially linear response. Additionally, the second stack portion 930 in MR element 900 has at least one characteristic selected to result in the second stack portion 930 having the second substantially linear response. As discussed in figures above, the at least one characteristic may include: materials, layer thickness and an ordering of one or more of the layers in the first and second stack portions 910, 930. Additionally, the at least one characteristic may also include a number of layers in the first and second stack portions 910, 930.

In the illustrated embodiment, materials and/or layer thicknesses of the first and second free layers 714a, 714b of free layer structure 714 in the first stack portion 910 may, for example, correspond to the at least one characteristic selected to result in the first stack portion 910 having the first substantially linear response. For example, the first and second free layer layers 714a, 714b may have materials and/or layer thickness selected to result in the free layer structure 714 being a substantially unbiased free layer which, in turn, may result in the first stack portion 910 having the first substantially linear response.

Additionally, in embodiments, the number of layers in the first and second stack portions 910, 930 may be selected alone, or in combination with materials, layer thickness and an ordering of one or more of the layers in the first and second stack portions 910, 930 to result in the first and second substantially linear responses. In other words, the at least one characteristic selected to result in the first and second substantially linear responses may include the number of layers in the first and second stack portions 910, 930 and materials, layer thickness and an ordering of one or more of the layers in the first and second stack portions 910, 930.

In some embodiments, the first stack portion 910 has a same or similar first substantially linear response as the first substantially linear response of the first stack portion 810 in MR element 800 of FIG. 8 despite comprising a different number of layers than the first stack portion 810. Additionally, in some embodiments, the second stack portion 930 has a same or similar second substantially linear response as the second substantially linear response of the second stack portion 830 in MR element 800 of FIG. 8 despite comprising a different number of layers than the second stack portion 830. For example, materials, layer thickness and/or an ordering of one or more of the layers in the first stack portion 910 may be selected to result in the first stack portion 910 having a same or similar substantially linear response as the first substantially linear response of the first stack portion 810. In other words, materials, layer thickness and/or an ordering of one or more of the layers in the first stack portion 910 may comprise the at least one characteristic selected to result in the first stack portion 910 having the first substantially linear response.

It is understood that the first stack portion 910 may also have a first substantially linear response that is different from the first substantially linear response of the first stack portion 810. Additionally, it is understood that the first stack portion 910 having a first substantially linear response that is different than the first substantially linear response of first stack portion 810 may, for example, result in the first stack portion 910 having a first sensitivity level (i.e., rate of change in resistance) to changes in magnetic field strengths over a first range of magnetic field strengths that is different than a first sensitivity level of the first stack portion 810 over a similar range of magnetic fields strengths as the first range of magnetic field strengths.

Figure 10:
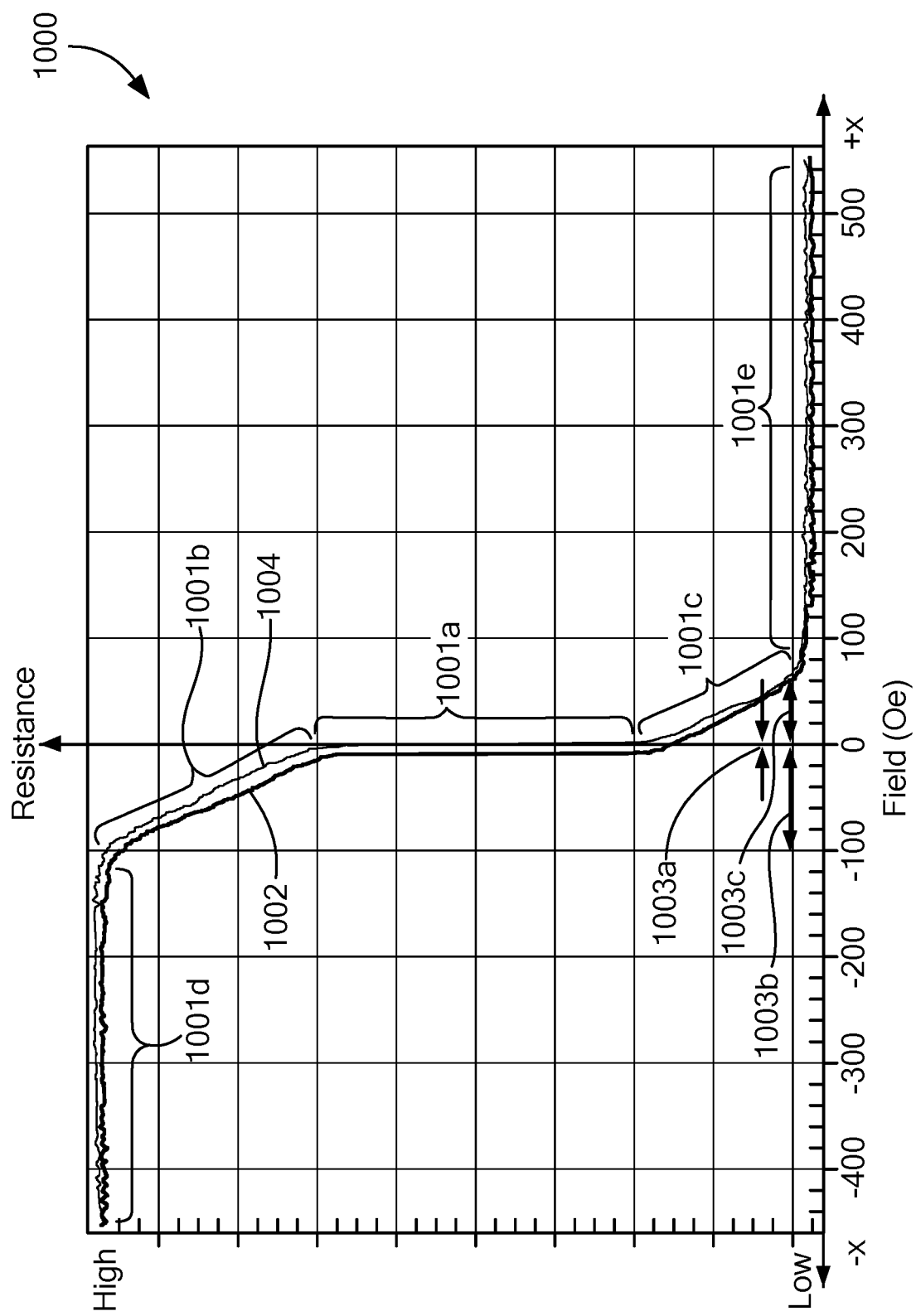
FIG. 10 is a plot illustrating first example response characteristics of the magnetoresistance element of FIG. 9.

Referring now to FIG. 10, a plot 1000 shows curves 1002, 1004 representative of first example response characteristics of the MR element 900 of FIG. 9 as it is exposed to magnetic fields of varying strengths in a transverse direction relative to the maximum response axis 899 of the MR element 900. The plot 1000 has a horizontal axis with a scale in magnetic field strength units (here, Oersteds (Oe)) and a vertical axis with a scale in resistance units (here, Ohms). Similar to plots 300 and 500 shown in FIGS. 3 and 5, respectively, positive magnetic field strength units (e.g., +X) in plot 1000 may correspond to a magnetic field experienced by the MR element 900 in a first direction, such as in response to a first direction of motion (e.g., rotation) by an object (e.g., ring magnet 1510, shown in FIG. 15). Additionally, negative magnetic field strength units (e.g., −X) in plot 1000 may correspond to a magnetic field experienced by the MR element 900 in a second direction that is opposite from the first direction, such as in response to a second direction of motion by the object that is opposite from the first direction of motion of the object.

Curve 1002 corresponds to a response characteristic of the MR element 900 as it is exposed to a magnetic field that sweeps from a positive magnetic field strength value (e.g., 600 Oe) to a negative magnetic field strength value (e.g., −500 Oe), e.g., from the first direction of motion to the second direction of motion. Additionally, curve 1004 corresponds to a response characteristic of the MR element 900 as it exposed to a magnetic field that sweeps a negative magnetic field strength value (e.g., −500 Oe) to a positive magnetic field strength value (e.g., 600 Oe), e.g., from the second direction of motion to the first direction of motion.

Curves 1002, 1004 have a first substantially linear region 1001a and a second substantially linear region (here, a second substantially linear region including substantially linear sub-regions 1001b, 1001c). Curves 1002, 1004 also have first and second saturation regions 1001d, 1001e. As is illustrated, sub-region 1001b of the second substantially linear region is separated from sub-region 1001c of the second substantially linear region by the first substantially linear region 1001a.

A first end of the first substantially linear region 1001a occurs at a point at which the first substantially linear region 1001a has a slope that deviates from an average slope of a sub-region of the second substantially linear region with which it is associated, for example, sub-region 1001b, by a predetermined amount (e.g., about five percent). Additionally, a second opposing end of the first substantially linear region 1001a occurs at a point at which the first substantially linear region 1001a has a slope that deviates from the average slope of a sub-region of the second substantially linear region with which it is associated, for example, sub-region 1001c, by about predetermined amount (e.g., about five percent). The first and second substantially linear regions (i.e., regions 1001a, 1001b, 1001c) correspond to an operational range of the MR element 900 in the illustrated embodiment in which the MR element 900 has a resistance that is substantially responsive to changes in magnetic field strength of the applied magnetic field.

In embodiments, the first substantially linear region 1001a corresponds to the first substantially linear response of the first stack portion 910 of MR element 900 discussed above in connection with FIG. 9, with the first substantially linear response corresponding to an applied magnetic field over a first magnetic field strength range 1003a (here, between about −5 Oe and about 5 Oe, i.e., a limited range of magnetic field strengths).

Additionally, in embodiments, the second substantially linear region (i.e., sub-regions 1001b, 1001c) corresponds to the second substantially linear response of the second stack portion 930 of MR element 900 discussed above in connection with FIG. 9, with the second substantially linear response corresponding to the applied magnetic field over a second magnetic field strength range (here, a second magnetic field strength range including sub-ranges 1003b, 1003c). In the illustrated embodiment, sub-range 1003b comprises magnetic field strengths between about −5 Oe and about −100 Oe). Additionally, in the illustrated embodiment, sub-range 1003c comprises magnetic field strengths between about 5 Oe and about 80 Oe).

As discussed above, the second substantially linear response of second stack portion 930 is different than the first substantially linear response of first stack portion 910. In the illustrated embodiment, the second substantially linear response occurs over a second range of magnetic field strengths (here, sub-ranges 1003b, 1003c) that is different than the first range of magnetic field strengths 1003a. In embodiments, the MR element 900 has a respective substantially linear response in each of the sub-regions 1001b, 1001c of the second substantially linear region associated with the second substantially linear response, with the substantially linear responses of the MR element 900 in sub-regions 1001b, 1001c (e.g., fourth and fifth substantially linear responses) comprising the second substantially linear response of the second substantially linear region.

The first substantially linear response of the first stack portion 910 results in the MR element 900 having a first sensitivity level (i.e., a first rate of change in resistance) to changes in magnetic field strength when the applied magnetic field is within the first range of magnetic field strengths 1003a. The first sensitivity level may be determined, for example, by observing an average slope of curves 1002, 1004 in first substantially linear region 1001a. Additionally, the second substantially linear response of the second stack portion 930 results in the magnetoresistance element having a second sensitivity level (i.e., a second rate of change in resistance) to changes in magnetic field strength when the applied magnetic field is within the second range of magnetic field strengths (here, sub-ranges 1003b, 1003c). The second sensitivity level may be determined, for example, by observing an average slope of curves 1002, 1004 in the second substantially linear region (i.e., sub-regions 1001b, 1001c of the second substantially linear region).

The second sensitivity level is reduced in comparison to the first sensitivity level in the illustrated embodiment. It follows that the MR element 900 has a higher sensitivity to changes in magnetic field strength in the first substantially linear region 1001a (i.e., over a small or limited range a magnetic fields) than it does to changes in magnetic field strength in the second substantially linear region (i.e., sub-regions 1001b, 1001c, which comprise a more expansive range of magnetic fields than region 1001a). The first sensitivity level of the MR element 900 in the illustrated embodiment (e.g., resulting in the MR element 900 having a resistance that substantially varies at a magnetic field strength of about zero) may, for example, be given by rotation of free layer 714 or other layers of the first stack portion 910 of MR element 900. Additionally, the first sensitivity level of the MR element 900 may be due to the lack of a biasing part (e.g., layer 712, shown in FIG. 7) in the MR element 900. The illustrated first sensitivity level of the MR element 900 may, for example, be desirable in embodiments in which an absolute field sensor is not needed, but it is desirable for the MR element 900 (e.g., an output of the MR element 900) to switch at a certain threshold or range of magnetic field strengths. In other embodiments, the first sensitivity level may have a reduced sensitivity (i.e., a reduced slope in region 1001a) from that which is shown. Additionally, in other embodiments, the first sensitivity level may be reduced in comparison to the second sensitivity level.

In embodiments, MR element 900 has a respective sensitivity level to changes in magnetic field strength in the applied magnetic field in each of the sub-regions 1001b, 1001c of the second substantially linear region, with the sensitivity levels of the MR element 900 in the sub-regions 1001b, 1001c (e.g., fourth and fifth sensitivity levels) comprising the second sensitivity level of the second substantially linear region.

Additionally, in embodiments, at least one characteristic (e.g., layer thicknesses of one or more layers) of the first and second stack portions 910, 930 may be selected to tune or alter one or more regions of the curves 1002, 1004, similar to the at least one characteristic selected to provide the first and second substantially linear responses of the first and second stack portions 710, 730 of MR element 700 discussed above in connection with FIG. 7, for example.

As illustrated, unlike prior art MR element 400 of FIG. 4, for example, in which the first and second stack portions 410, 430 behave antisymmetrically (i.e., substantially equal and opposite) to an applied magnetic field, resulting in the MR element 400 having a single substantially linear response over a single substantially linear region 401a, as shown in plot 500, the first and second stack portions 910, 930 of the MR element 900 have a first and second different, respective substantially linear responses to the applied magnetic field. As a result of the foregoing, the MR element 900 has a first substantially linear response over a first substantially linear region 1001a and a second substantially linear response that is different than the first substantially linear response over a second substantially linear region (here, sub-regions 1001b, 1001c) that is different than the first substantially linear region 1001a. In embodiments, the first and second substantially linear responses of MR element 900 are provided at least in part from pinning layer 720, more particularly the crystal structure coming from the PtMn growth of pinning layer 720. This is contrast to the MR element 400 of FIG. 4 in which Ru spacer layers 413, 434 provide for the single substantially linear response of MR element 400 in embodiments, for example, due to the Ru spacer layers 413, 434 stabilizing free layers 414, 433.

As also illustrated, MR element 900 has a reduced offset compared to the prior art MR element 400 and to the prior art MR element 200, as depicted by curves 1002, 1004 which are less horizontally offset with an intersection of the vertical and horizontal axes of plot 1000, than curves 502, 504 shown in plot 500 of FIG. 5 and curves 304, 304 shown in plot 300 of FIG. 3. As a result of the foregoing, the range of magnetic field strengths to which the MR element 900 is responsive also has a reduced offset compared the prior art MR element 400 and to the prior art MR element 200.

In embodiments, the increased operational range of the MR element 900 may also provide for increased offset drift toleration by the MR element 900, such as that which may occur due to temperature, age and/or a misalignment or misplacement between the MR element and an object (i.e., a magnetic field) sensed by the MR element 900, for example. In particular, due to the increased operational range of MR element 900 (i.e., a greater range of magnetic fields that may be sensed by the MR element 900), MR element 900 may be able to sense magnetic fields that would otherwise not be detected by conventional MR elements (e.g., MR element 200), making offset drift may be more tolerable. In general, a MR element according to the disclosure having a first operational range may have an increased offset drift tolerance in comparison to a conventional MR element having a second operational range that is less than the first operational range. Remaining offset errors (if any) can, for example, be corrected in signal processing circuitry coupled an output (e.g., $V_{OUT}$, shown in FIG. 14, as will be discussed) of the MR element.

In embodiments, the increased operational range of the MR element 900 may further provide for improved immunity to common field interference by the MR element 900. In particular, as is known in the art, common field interference may add an offset to a magnetic field signal (i.e., an applied magnetic field) to which an MR element (e.g., 900) may experience. The offset could cause the MR element to become saturated if the linear or operational range of the MR element is too small. In embodiments, the increased linear or operational range of the MR element 900 (and other MR elements according to the disclosure) substantially reduces (or ideally prevents) saturation of the MR element 900 when subjected to common field interference (and the offset resulting from common field interference).

Figure 11:
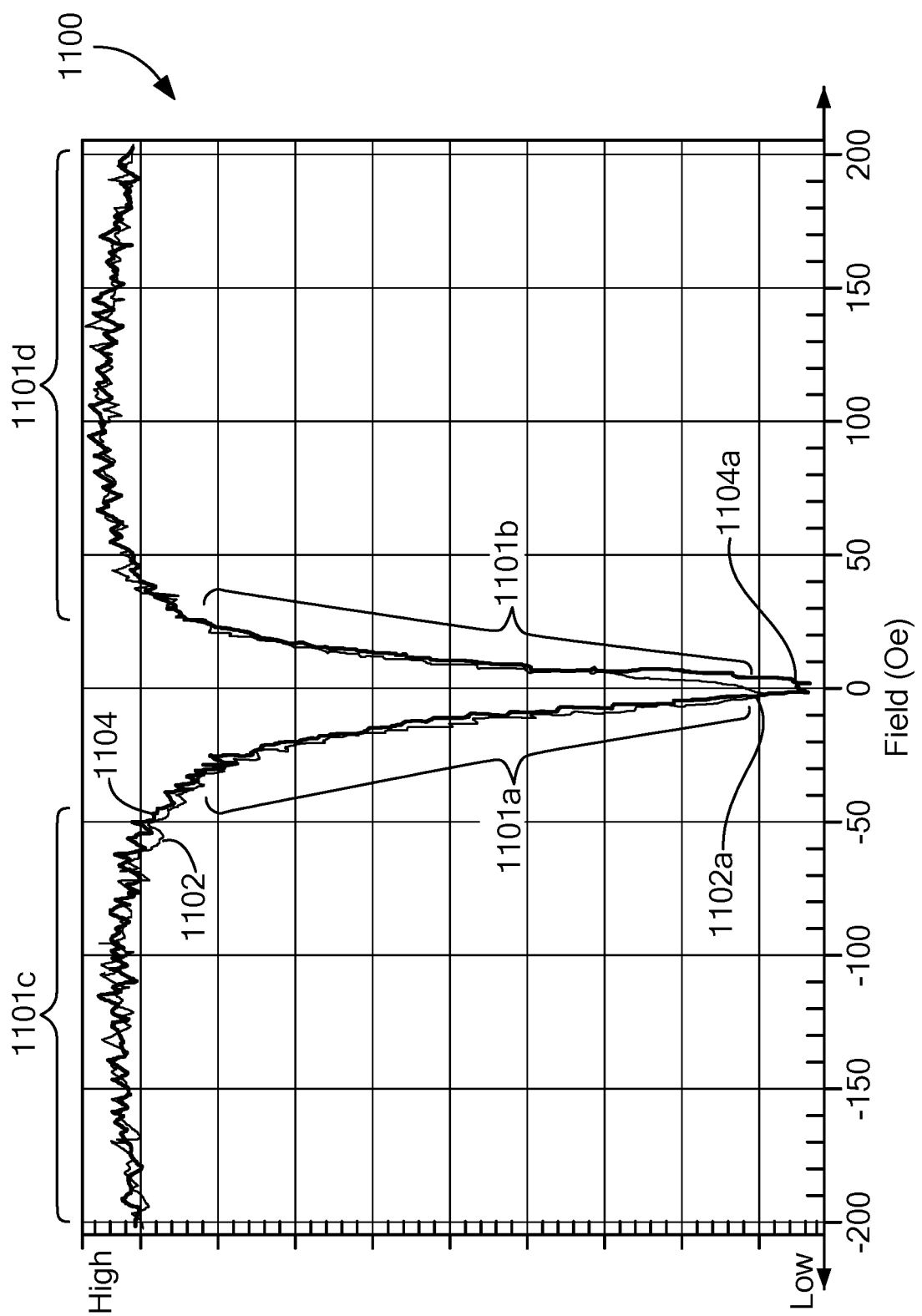
FIG. 11 is a plot illustrating second example response characteristics of the magnetoresistance element of FIG. 9.

Referring now to FIG. 11, a plot 1100 shows curves 1102, 1104 representative of second example response characteristics (i.e., transfer curves) of the MR element 900 of FIG. 9 as it is exposed to magnetic fields of varying strengths in a direction substantially parallel to the maximum response axis 899 of the MR element 900. The plot 1100 has a horizontal axis with a scale in magnetic field strength units (here, Oersteds (Oe)) and a vertical axis with a scale in resistance units (here, Ohms).

Curve 1102 corresponds to a response characteristic of the MR element 900 as it is exposed to a magnetic field that sweeps from a positive magnetic field strength value (e.g., 200 Oe) to a negative value magnetic field strength value (e.g., −200 Oe). Additionally, curve 1104 corresponds to a response characteristic of the MR element 900 as it exposed to a magnetic field that sweeps from the negative magnetic field strength value (e.g., −200 Oe) to the positive magnetic field strength value (e.g., 200 Oe).

As illustrated, the curves 1102, 1104 have first and second substantially linear regions 1101a, 1101b in which the MR element 900 characterized by curves 1102, 1104 has a relatively low resistance when exposed to lower strength magnetic fields. Additionally, the curves 1102, 1104 have first and second saturation regions 1101c, 1101d in which the MR element 900 has a relatively high resistance when exposed to a higher strength magnetic fields. In substantially linear region 1101a, the MR element 900 characterized by curves 1102, 1104 has a first substantially linear response corresponding to the applied magnetic field greater than a first threshold, or within a first magnetic field strength range. Additionally, in substantially linear region 1101b, the MR element 900 has a second substantially linear response that is different than the first substantially linear response, the second substantially linear response corresponding to the applied magnetic field less than a second threshold, or within a second magnetic field strength range. In the saturation regions 1101c, 1101d, the MR element 900 is substantially unresponsive to the applied magnetic field.

As also illustrated, the curves 1102, 1104 have respective peaks 1102a, 1104a at about zero Oersteds. Additionally, curves 1102, 1104 are substantially centered around zero Oersteds, and the substantially linear ranges 1101a, 1101b of the MR element 900 are substantially uniform in magnitude of ranges of magnetic field strengths (−Oe to +Oe). In embodiments, such corresponds to the MR element characterized by curves 1102, 1104 having a small (ideally, non-existent) offset.

In embodiments, the peaks of curves associated with MR elements according to the disclosure (similar to peaks 1102a, 1104a of curves 1102, 1104) generally appear at an amplitude corresponding to a bias field, with the bias field determined by a thickness of one or more layers (e.g., Ru spacers 713 and 734) of the MR element. However, the MR element 900 to which curves 1102, 1104 shown in FIG. 11 are associated with, for example, does not have Ru spacers (e.g., Ru spacers 713 and 734) and a biasing part. One example result of the foregoing is peaks 1102a, 1104a of curves 1102, 1104 are substantially overlapping at about zero Oersteds.

Figure 12:
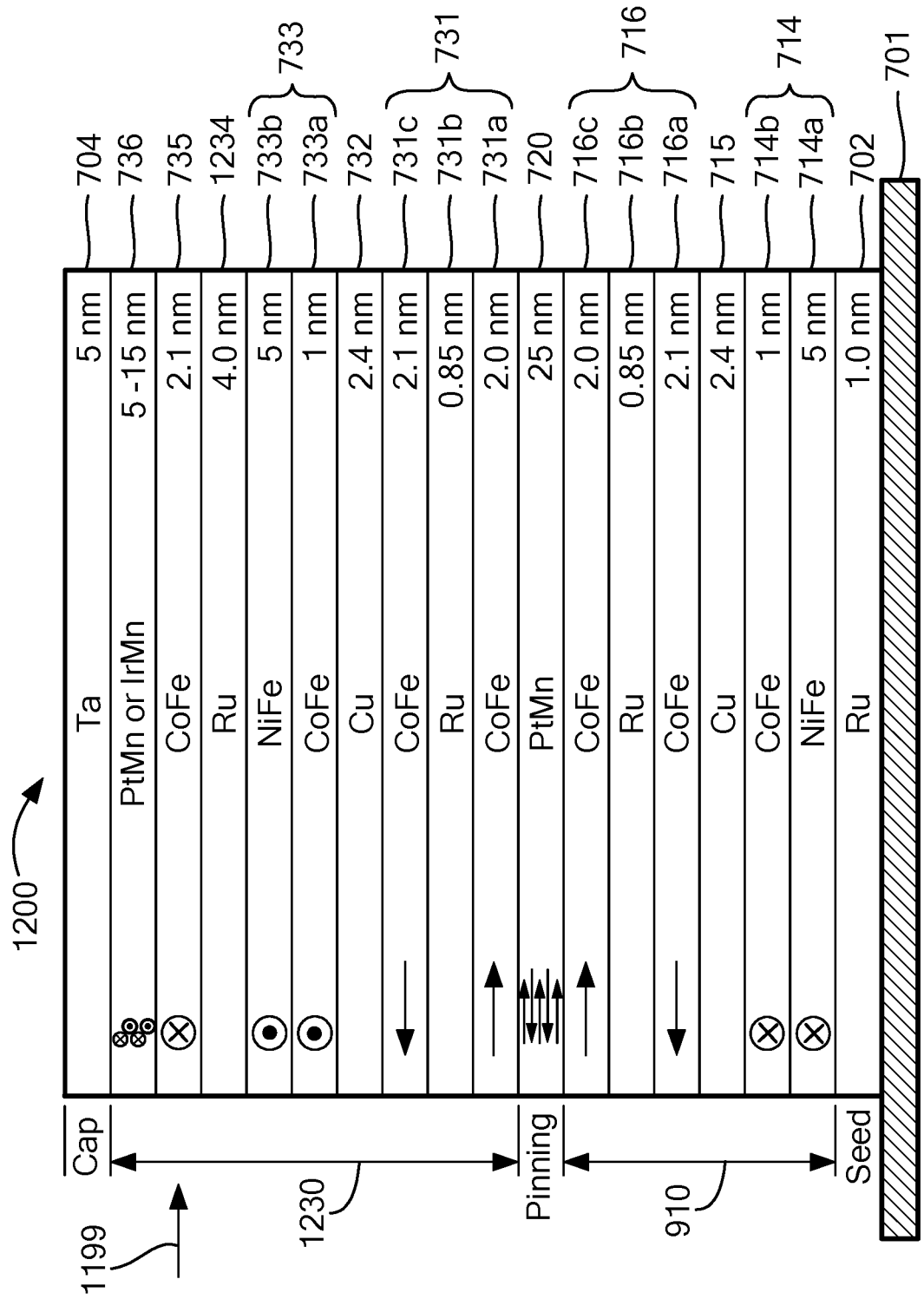
FIG. 12 is a block diagram showing layers of a fourth example magnetoresistance element according to the disclosure.

Referring to FIG. 12, in which like elements of FIGS. 8 and 11 are shown having like reference designations, a fourth example MR element 1200 includes a first stack portion 910 and a second stack portion 1230. The first stack portion 910 has first and second opposing surfaces, with the first surface of the first stack portion 910 disposed over seed layer 702 and the seed layer 702 disposed between the first stack portion 910 and the substrate on which the MR element 1200 is deposited upon. Additionally, the second stack portion 1230 has first and second opposing surfaces, with the first surface of the second stack portion 1230 disposed over pinning layer 720 and the pinning layer 720 disposed between the first stack portion 910 and the second stack portion 930. Cap layer 704 is disposed over the second surface of the second stack portion 1230.

The first stack portion 910 (i.e., a same first stack portion as the first stack portion of MR element 900) includes a first plurality of layers (here, 6 layers). Additionally, the second stack portion 1230 includes a second plurality of layers (here, 9 layers), i.e., a different number of layers as the first plurality of layers.

The second plurality of layers of second stack portion 1230 includes pinned layer structure 731, spacer layer 732 and free layer structure 733. The second plurality of layers also includes a spacer layer 1234, pinned layer 735 and pinning layer 736. The pinned layer structure 731 includes first pinned layer 731a, second pinned layer 731c and spacer layer 731b. Additionally, free layer structure 733 includes first free layer 733a and second free layer 733b.

The pinned layer structure 731 is disposed over the pinning layer 720 and the spacer layer 732 is disposed over the pinned layer structure 731. Additionally, the free layer structure 733 is disposed over the spacer layer 732 and the spacer layer 1234 is disposed over the free layer structure 733. Further, the pinned layer 735 is disposed over the spacer layer 1234 and the pinning layer 736 is disposed over the pinned layer 735. Spacer layer 1234, which may be similar to spacer layer 734 of MR element 700 shown in FIG. 7 but having a thickness that is different than a thickness of the spacer layer 734, may be a nonmagnetic spacer layer comprising one or more nonmagnetic materials (e.g., Ru).

The first stack portion 910 in the MR element 1200 has a first substantially linear response corresponding to an applied magnetic field over a first magnetic field strength range. Additionally, the second stack portion 1230 in the MR element 1200 has a second substantially linear response that is different than the first substantially linear response, the second substantially linear response corresponding to the applied magnetic field over a second magnetic field strength range. The MR element 1200 has a maximum response axis to magnetic fields (e.g., the applied magnetic field) which is parallel to the substrate surface (e.g., a first surface of the substrate 701) over which the MR element 1200 is disposed, as indicated by arrow 1199.

The first stack portion 910 has at least one characteristic selected to result in the first stack portion 910 having the first substantially linear response. Additionally, the second stack portion 1230 has at least one characteristic selected to result in the second stack portion 1230 having the second substantially linear response.

In the illustrated embodiment, the thickness of spacer layer 1234 in second stack portion 1230 may, for example, correspond to the at least one characteristic selected to result in the second stack portion 1230 having the second substantially linear response. For example, the spacer layer 1234 may have a thickness selected (here, about 4 nm) to result in the second stack portion 1230 having an antiferromagnetic partial bias which, in turn, may result in the second stack portion 1230 having the second substantially linear response.

Figure 13:
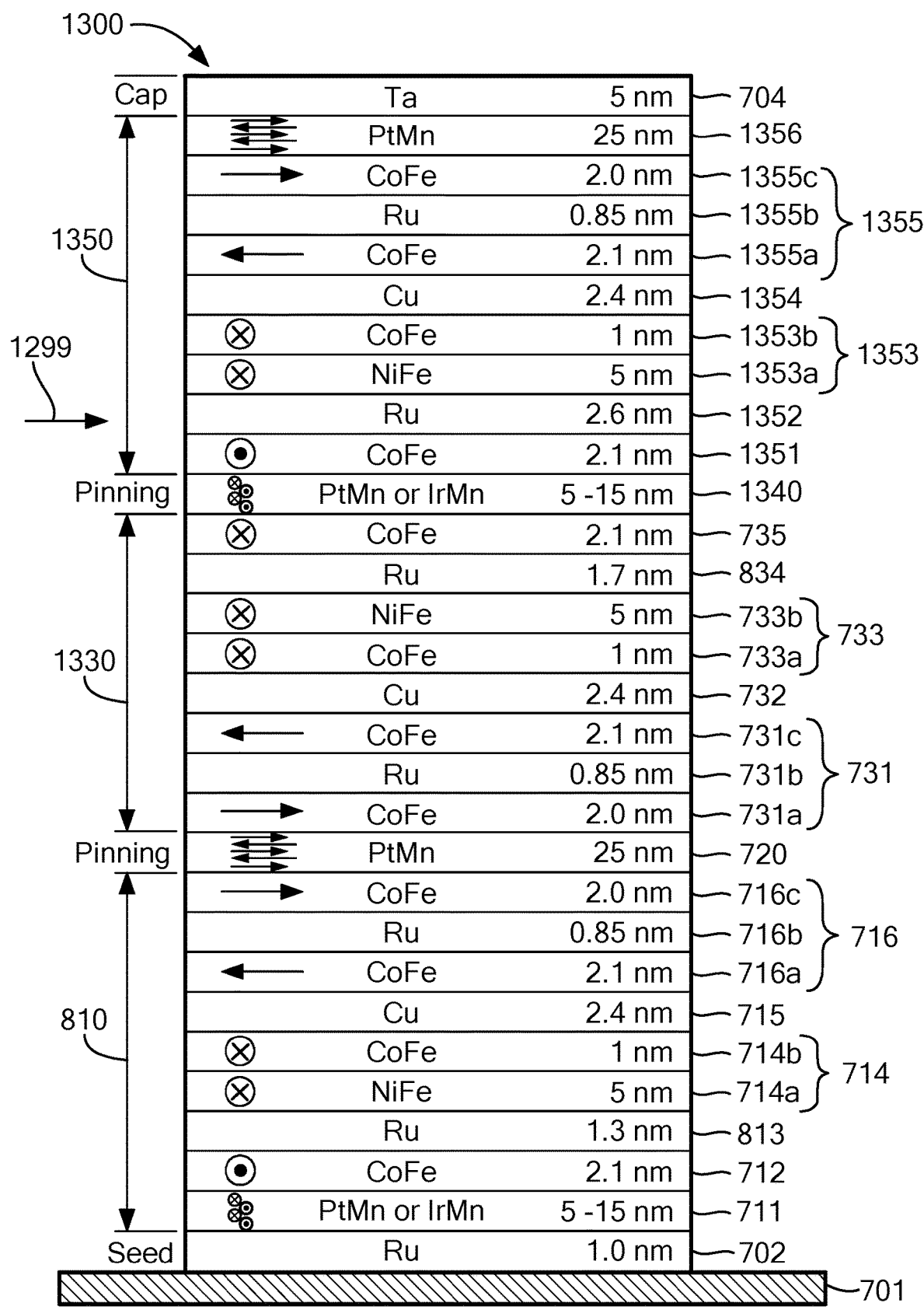
FIG. 13 is a block diagram showing layers of a fifth example magnetoresistance element according to the disclosure.

Referring to FIG. 13, in which like elements of FIG. 8 are shown having like reference designations, a fifth example MR element 1300 includes a first stack portion 810, a second stack portion 1330 and a third stack portion 1350, i.e., an additional stack portion over the MR elements discussed in figures above. The first stack portion 810 has first and second opposing surfaces, with the first surface of the first stack portion 810 disposed over the seed layer 702 and the seed layer 702 disposed between the first stack portion 810 and the substrate 701 on which the MR element 1300 is deposited upon. Additionally, the second stack portion 1330 has first and second opposing surfaces, with the first surface of the second stack portion 1330 disposed over pinning layer 720 and the pinning layer 720 disposed between the first stack portion 810 and the second stack portion 1330. Further, the third stack portion 1350 has first and second opposing surfaces, with the first surface of the third stack portion disposed over a pinning layer 1340 and the pinning layer 1340 disposed between the second stack portion 1330 and the third stack portion 1350. Cap layer 704 is disposed over the second surface of the third stack portion 1350.

The first stack portion 810 (i.e., a same stack portion as the first stack portion of MR element 800 of FIG. 8) includes a first plurality of layers (here, 9 layers). Additionally, the second stack portion 1330 includes a second plurality of layers (here, 8 layers), i.e., a different number of layers than the first plurality of layers. Further, the third stack portion 1350 includes a third plurality of layers (here, 9 layers), i.e., a same number of layers as the first plurality of layers and a different number of layers than the second plurality of layers.

The second plurality of layers of the second stack portion 1330 includes pinned layer structure 731, spacer layer 732 and free layer structure 733. The second plurality of layers also includes a spacer layer 834 and pinned layer 735. The pinned layer structure 731 includes first pinned layer 731a, second pinned layer 731c and spacer layer 731b. Additionally, free layer structure 733 includes first free layer 733a and second free layer 733b.

The pinned layer structure 731 is disposed over the pinning layer 720 and the spacer layer 732 is disposed over the pinned layer structure 731. Additionally, the free layer structure 733 is disposed over the spacer layer 732 and the spacer layer 834 is disposed over the free layer structure 733. Further, the pinned layer 735 is disposed over the spacer layer 834.

The third plurality of layers of third stack portion 1350 includes a pinned layer 1351, a spacer layer 1352 and a free layer structure 1353. The third plurality of layers also includes a spacer layer 1354, a pinned layer structure 1355 and a pinning layer 1356. The free layer structure 1353, which may be the same as or similar to free layer structure 714 in the first stack portion 810 in some embodiments, includes first free layer 1353a and second free layer 1353b. Additionally, the pinned layer structure 1355, which may be the same as or similar to pinned layer structure 716 in first stack portion 810 in some embodiments, includes first pinned layer 1355a, second pinned layer 1355c and spacer layer 1355b.

In embodiments, pinned layer 1351 may be a ferromagnetic pinned layer, spacer layer 1352 may be a nonmagnetic spacer layer and free layer structure 1353 may be an unbiased free layer. Additionally, in embodiments, spacer layer 1354 may be a nonmagnetic spacer layer, pinned layer structure 1355 may include an SAF pinned layer structure or layer and pinning layer 1356 may be an antiferromagnetic pinning layer 1356. First free layer 1353a of free layer structure 1353 may be a ferromagnetic free layer and second free layer 1353b of free layer structure 1353 may be a ferromagnetic free layer. Additionally, first pinned layer 1355a of pinned layer structure 1355 may be ferromagnetic pinned layer, second pinned layer 1355c of pinned layer structure 1355 may be a ferromagnetic pinned layer, and spacer layer 1355b of pinned layer structure 1355 may be a nonmagnetic spacer layer.

The first stack portion 810 has a first substantially linear response corresponding to an applied magnetic field over a first magnetic field strength range. Additionally, the second stack portion 1330 has a second substantially linear response that is different than the first substantially linear response. The second substantially linear response corresponds to the applied magnetic field over a second magnetic field strength range. The third stack portion 1350 has a third substantially linear response that is different from both the first substantially linear response and the second substantially linear response. The third substantially linear response corresponds to an applied magnetic field between, or overlapping with, the first magnetic field strength range and the second magnetic field strength range. In one embodiment, the first substantially linear response has a first bias amplitude at about 100 Oe, the second substantially linear response has a second bias amplitude of about 10 Oe and the third substantially linear response has a third bias amplitude of about 50 Oe (i.e., between the first and second bias amplitudes). In embodiments, the respective bias amplitudes correspond to magnetic field strengths at which the stack portions of the MR element are most responsive or sensitive to changes in magnetic field strength.

Similar to MR elements discussed in figures above, each of the stack portions 810, 1330, 1350 in MR element 1300 has at least one characteristic selected to result in the stack portions 810, 1330, 1350 having their respective substantially linear responses (e.g., first, second, third, etc. substantially linear responses, like those which occur in regions 601a, 601b, 601c shown in plot 600 of FIG. 6) to the applied magnetic field.

In the illustrated embodiment, the thickness of spacer layer 813 in first stack portion 810 may, for example, correspond to the at least one characteristic selected to result in the first stack portion 810 having the first substantially linear response. For example, the spacer layer 813 may have a thickness selected (here, about 1.3 nm) to result in the first stack portion 810 having a first predetermined bias (e.g., a "strong" bias of about 200 Oe) which, in turn, may result in the first stack portion 810 having the first substantially linear response.

Additionally, in the illustrated embodiment, the thickness T2 of spacer layer 834 in second stack portion 1330 may correspond to the at least one characteristic selected to result in the second stack portion 1330 having the second substantially linear response. For example, the spacer layer 834 may have a thickness T2 selected to be a particular value (e.g., about 1.7 nm) to result in the second stack portion 1330 having a second predetermined bias (e.g., a "very weak" bias of less than about 10 Oe) which, in turn, may result in the second stack portion 1330 having the second substantially linear response.

Further, in the illustrated embodiment, the thickness of spacer layer 1352 in third stack portion 1350 may correspond to the at least one characteristic selected to result in the third stack portion 1350 having the third substantially linear response. For example, the spacer layer 1352 may have a thickness selected (here, about 2.6 nm) to result in the third stack portion 1350 having a third predetermined bias (e.g., a "moderate" bias of about 70 Oe) which, in turn, may result in the third stack portion 1350 having the third substantially linear response.

It is understood that other characteristics (e.g., materials, layer thicknesses, etc.) of the first, second and third stack portions 810, 1330, 1350 may additionally or alternatively be selected to result in the first, second and third stack portions 810, 1330, 1350 having their respective first, second and third substantially linear responses.

While MR elements including two or three so-called "stack portions" are shown in FIGS. 7, 8, 9, 12 and 13, it is understood that MR elements according to the disclosure may include more than three stack portions in some embodiments. Additionally, it is understood that the MR elements shown in FIGS. 7, 8, 9, 12 and 13 are but five of many potential configurations of MR elements in accordance with the disclosure. As one example, at least one of the stack portions (e.g., 1350) of MR element 1300 may include a greater number of layers or a fewer number of layers than that which is shown.

Additionally, while particular materials and thicknesses of layers in MR elements according to the disclosure are shown in FIGS. 7, 8, 9, 12 and 13, it is understood that the materials and thicknesses of some layers may be different than that which is shown, for example, to provide the first, second, third, etc. substantially linear responses of the first, second, third, etc. stack portions in the MR elements.

Further, while particular sequences of layers in MR elements according to the disclosure are shown in FIGS. 7, 8, 9, 12 and 13, it is understood that there can be other interposing layers, for example, other spacer layers, between any two or more of the layers shown, for example, to provide the first, second, third, etc. substantially linear responses of the first, second, third, etc. stack portions in the MR elements. Also, there can be other layers above or below the layers shown in FIGS. 7, 8, 9, 12 and 13. It is also understood that the MR elements can be formed in a variety of sizes and shapes. For example, the MR elements can be formed in a yoke shape such at that shown in FIG. 15 through a manufacturing process, for example, in which the various layers of the MR elements are deposited, patterned and annealed.

Figure 14:
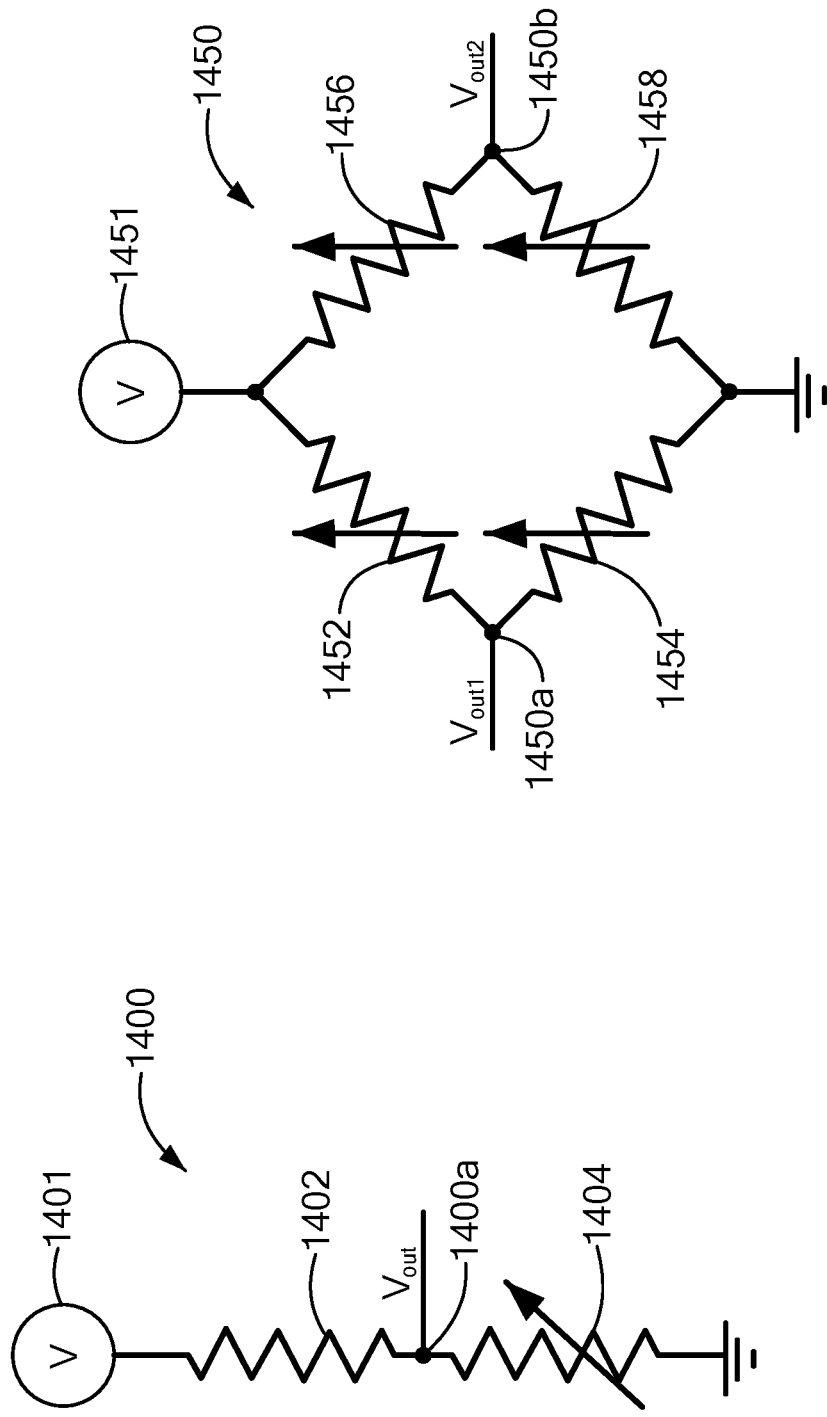
FIG. 14 is a block diagram showing an example resistor divider arrangement that may include magnetoresistance elements according to the disclosure.
Figure 15:
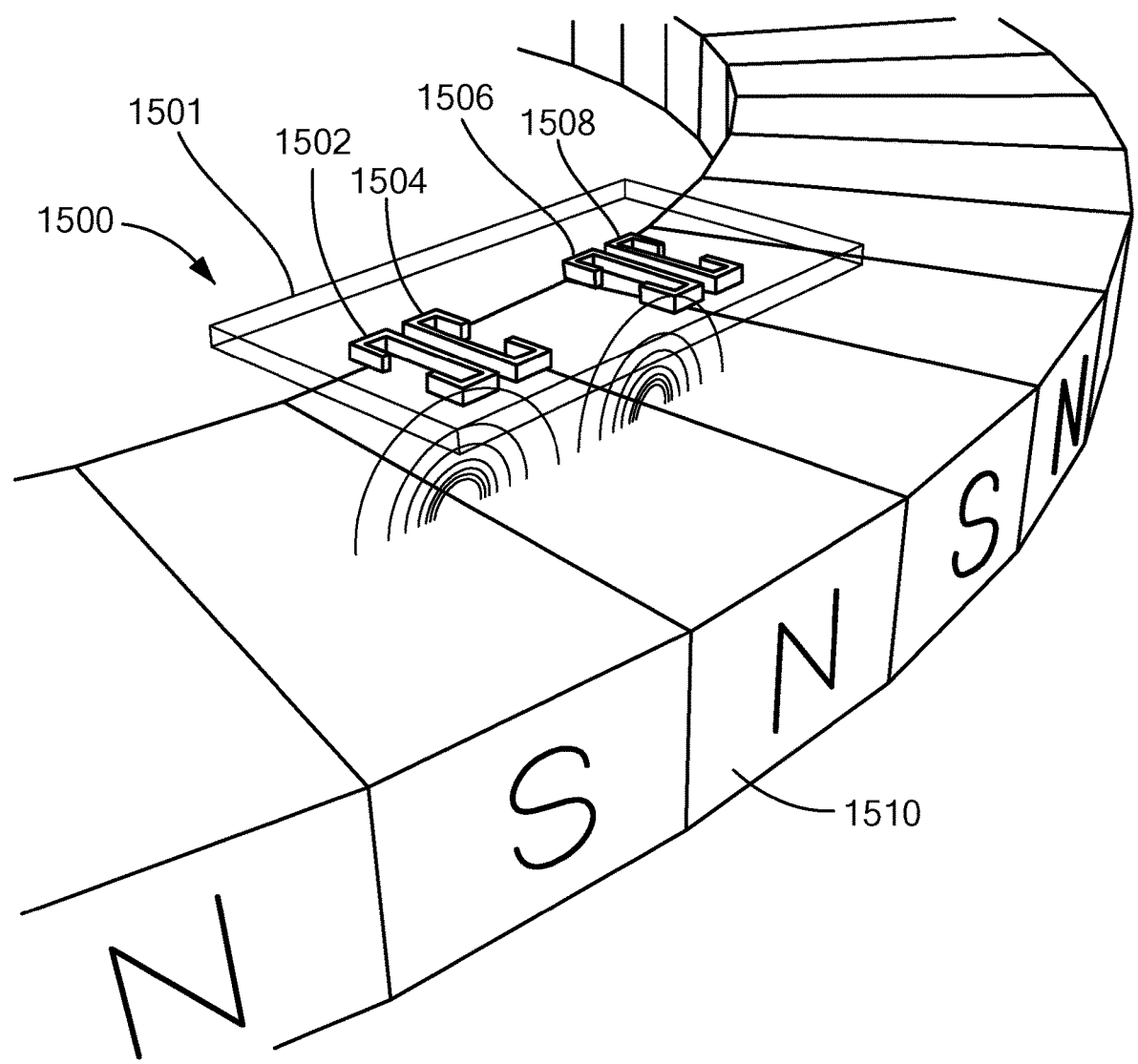
FIG. 15 is a block diagram of an example magnetic field sensor that may include magnetoresistance elements according to the disclosure.

It is also understood that the MR elements in accordance with the disclosure may be coupled in a variety of arrangements, for example, a resistor divider arrangement, as shown in FIG. 14, or a bridge arrangement, as shown in FIG. 14A, which will be described below. Further, it is understood that the MR elements in accordance with the disclosure may be used in a variety of applications, including, but not limited to current sensors responsive to an electrical current, proximity detectors responsive to proximity of a ferromagnetic object, for example, ferrous gear teeth, and magnetic field sensors responsive to a magnetic field external to the magnetic field sensor. One example magnetic field sensor is shown in FIG. 15, which will also be described below.

Referring to FIG. 14, a resistor divider 1400 includes a resistor 1402 and an MR element 1404, which may be the same as or similar to MR elements described in connection with figures above (e.g., 800, shown in FIG. 8) that are fabricated as a material stack. The resistor divider 1400 is coupled to a voltage source 1401 and the resistor 1402 and the MR element 1404 may be driven by the voltage source 1401.

An output voltage ($V_{OUT}$) may be generated at the node 1400a formed between the resistor 1402 and the MR element 1404 in response to an applied magnetic field (e.g., a magnetic field as may be generated in response to motion of an object, such as ring magnet 1510, shown in FIG. 15, as will be discussed). In particular, changes in the applied magnetic field may cause the resistance of the MR element 1404 to change. As the resistance of the MR element 1404 changes, the output voltage at node 1400a may also change. The output voltage may have a magnitude indicative of the applied magnetic field. In embodiments, the resistor 1402 can be a substantially fixed resistor. Additionally, in embodiments, the resistor 1402 can be an MR element (i.e., a second MR element).

Referring to FIG. 14A, a bridge arrangement (e.g., a Wheatstone bridge circuit) 1450 includes MR elements 1452, 1454, 1456, 1458, one or more which may be the same as or similar to MR elements described in connection with figures above (e.g., 800, shown in FIG. 8). The bridge 1450 is coupled to a voltage source 1451 and each of magnetoresistance elements 1452, 1454, 1456, 1458 may be driven by the voltage source 1451.

A first output voltage ($V_{OUT1}$) may be generated at first voltage node 1450a formed between magnetoresistance elements 1452, 1454 in response to an applied magnetic field. Additionally, a second output voltage ($V_{OUT2}$) may be generated at a second voltage node 1450b formed between magnetoresistance elements 1456, 1458 in response to the applied magnetic field. In particular, as the resistance of the MR elements 1452, 1454, 1456, 1458 changes in response to the applied magnetic field, at least one of the first output voltage generated at the first voltage node 1450a and the second output voltage generated at the second voltage node 1450b may also change. A voltage difference between the first output voltage (e.g., a first magnetic field signal) and the second output voltage (e.g., a second magnetic field signal) may be indicative of the applied magnetic field. In embodiments, the bridge 1450 may include at least one substantially fixed resistor, and at least one of the MR elements 1452, 1454, 1456, 1458 in bridge 1450 may be replaced by the at least one substantially fixed resistor.

As illustrated above, the resistor divider 1400 of FIG. 14 and the bridge arrangement 1450 of FIG. 14A can provide an output signal (e.g., a magnetic field signal) that is indicative of an applied magnetic field experienced by the MR elements (e.g., 1404, shown in FIG. 14). It is understood that the resistor divider 1400 and the bridge arrangement 1450 are but two of many potential arrangements of MR elements according to the disclosure.

Referring to FIG. 15, an example magnetic field sensor 1500 including a plurality of MR elements (here, four MR elements 1502, 1504, 1506, 1508) is shown. The MR elements 1502, 1504, 1506, 1508, which can be the same as or similar to MR elements described in connection with figures above (e.g., 800, shown in FIG. 8), are each formed in the shape of a yoke and disposed over a common substrate 1501 in the illustrated embodiment. In embodiments, the MR elements 1502, 1504, 1506, 1508 can be coupled in resistor divider arrangements that may be the same as or similar to the resistor divider 1400 shown in FIG. 14. Additionally, in embodiments, the MR elements 1502, 1504, 1506, 1508 can be coupled in bridge arrangements (e.g., a Wheatstone bridge) that may be the same as or similar to bridge arrangement 1450 shown in FIG. 14A. It is understood that other configurations of the MR elements 1502, 1504, 1506, 1508 are, of course, possible. Additionally, it is understood that other electronic components (not shown), for example, amplifiers, analog-to-digital converters (ADC), and processors, i.e., an electronic circuit, can be disposed over the substrate 1501 and coupled to one or more of the MR elements 1502, 1504, 1506, 1508, for example, to process signals (i.e., magnetic field signals) produced by the MR elements 1502, 1504, 1506, 1508.

In the illustrated embodiment, the magnetic field sensor 1500 is disposed proximate to a moving magnetic object, for example, a ring magnet 1510 having alternative north and south magnetic poles. The ring magnet 1510 is subject to motion (e.g., rotation) and the MR elements 1502, 1504, 1506, 1508 of the magnetic field sensor 1500 may be oriented such that maximum response axes of the MR elements 1502, 1504, 1506, 1508 are aligned with a magnetic field (e.g., an applied magnetic field) generated by the ring magnet 1510. In embodiments, the maximum responses axes of the MR elements 1502, 1504, 1506, 1508 may also be aligned with a magnetic field (e.g., a local magnetic field) generated by a magnet (not shown) disposed proximate to or within the magnetic field sensor 1500. With such a back-biased magnet configuration, motion of the ring magnet 1510 can result in variations of the magnetic field sensed by the MR elements 1502, 1504, 1506, 1508.

In embodiments, the MR elements 1502, 1504, 1506, 1508 are driven by a voltage source (e.g., 1451, shown in FIG. 14A) and configured to generate one or more magnetic field signals (e.g., $V_{out1}$, $V_{out2}$, shown in FIG. 14A) in response to motion of the ring magnet 1510, e.g., in a first direction of motion and in a second direction of motion that is different than the first direction of motion. Additionally, in embodiments, one or more electronic components (e.g., an ADC) (not shown) on the magnetic field sensor 1500 are coupled to receive the magnetic fields signals and configured to generate an output signal indicative of position, proximity, speed and/or direction of motion of the ring magnet 1510, for example. In some embodiments, the ring magnet 1510 is coupled to a target object, for example, a cam shaft in an engine, and a sensed speed of motion of the ring magnet 1510 is indicative of a speed of motion of the target object. The output signal (e.g., an output voltage) of the magnetic field sensor 1500 generally has a magnitude related to a magnitude of the magnetic field experienced by the MR elements 1502, 1504, 1506, 1508.

In embodiments in which the MR elements 1502, 1504, 1506, 1508 are provided as MR elements according to the disclosure (e.g., 800, shown in FIG. 8), the magnetic field sensor 1500 may have improved sensing accuracy over embodiments in which the magnetic field sensor 1500 includes conventional MR elements, for example, due to the increased operational range of magnetoresistance elements according to the disclosure in comparison to conventional magnetoresistance elements. In particular, due to the increased operational range of magnetoresistance elements according to the disclosure in comparison to conventional magnetoresistance elements, the magnetic field sensor 1500 may be able to more accurately sense a wider (or increased) range of magnetic field strengths than would otherwise be possible. For example, magnetic field strengths that would otherwise saturate conventional MR elements may be detected by MR elements according to the disclosure due to the increased operational range. This may provide for an increased number of applications in which MR elements according to the disclosure may be suitable (e.g., due to the increased range of magnetic field strengths which may be accurately detected using MR elements according to the disclosure).

Additionally, in embodiments in which the MR elements 1502, 1504, 1506, 1508 are provided as MR elements according to the disclosure (e.g., 800, shown in FIG. 8), and the magnetic field sensor 1500 includes electronic components (e.g., ADCs) coupled to receive magnetic field signals from the MR elements 1502, 1504, 1506, 1508 and configured to generate the output signal of the magnetic field sensor 1500, operational requirements of the electronic components (e.g., so-called "front end electronics" or "signal processing electronics") may, for example, be reduced in comparison to embodiments in which the magnetic field sensor 1500 includes conventional magnetoresistance elements.

For example, as is known, an ADC has a dynamic range corresponding to a range of signal amplitudes or strengths which the ADC can resolve (i.e., process). If an analog input signal has an amplitude that is greater than an upper threshold of the dynamic range, or an amplitude that is less than a lower threshold of the dynamic range, the ADC may not be able to accurately convert the analog signal into a corresponding digital signal. As discussed above, MR elements according to the disclosure have at least a first substantially linear response resulting in a first sensitivity level to changes in magnetic field strength and a second substantially linear response resulting in a second sensitivity level to changes in magnetic field strength. As also discussed above, at least one characteristic in the at least first and second stack portions of the MR elements according to the disclosure may be selected to provide the first and second substantially linear responses, and the first and second sensitivity levels. In other words, the first and second sensitivity levels of the MR elements may be selected based upon the at least one characteristic selected in the first and second stack portions of the MR elements.

In embodiments, the first and second sensitivity levels of the MR elements according to the disclosure may be selected to be reduced in comparison to the single sensitivity level of conventional MR elements and, as a result, an output of MR elements according to the disclosure (e.g., $V_{OUT}$, shown in FIG. 14) may increase more gradually or at a small rate (and have a reduced upper threshold) in comparison to an output of conventional MR elements. It follows than an ADC coupled to receive an output of MR elements according to the disclosure may have a dynamic range requirement which is reduced in comparison to a range requirement of an ADC coupled to receive an output of conventional MR elements. As a result of the foregoing, in embodiments in which the magnetic field sensor 1500 includes MR elements according to the disclosure, the magnetic field sensor 1500 may be able to use ADCs that have a reduced dynamic range (and that may be less costly) in comparison to embodiments in which the magnetic field sensor 1500 includes conventional MR elements.

It is understood that the dynamic range of an ADC is but one example operational parameter of the ADC which may benefit from the various characteristics associated with MR elements according to the disclosure. It is also understood than an ADC is but one example electrical component that may be used in the magnetic field sensor 1500, and which may benefit from the various characteristics associated with MR elements according to the disclosure.

In embodiments, MR elements according to the disclosure may also provide for a magnetic field sensor 1500 having a reduced number of electrical components (e.g., signal processing components) compared, for example, to a magnetic field sensor 1500 including conventional MR elements. For example, in embodiments in which the magnetic field sensor 1500 includes conventional MR elements and is configured to sense applied magnetic fields having a plurality of magnetic field strength ranges (e.g., −10 G to 10 G, −100 G to 100 G and −300 G to 300 G), the magnetic field sensor 1500 may require a corresponding plurality of ADCs. In contrast, in embodiments in which the magnetic field sensor 1500 includes MR elements according to the disclosure and is configured to sense the plurality of magnetic field strength ranges, the magnetic field sensor 1500 may include a fewer or reduced number of ADCs than the plurality of magnetic field strength ranges. In one embodiment, the foregoing is due to MR elements according to the disclosure having an increased operational range compared to conventional MR elements. In particular, with MR elements according to the disclosure as signals (e.g., magnetic field signals) become larger, the signals may be reduced (or even muted in some embodiments) but still usable for signal processing (e.g., due to the MR elements not being forced into saturation).

While the magnetic field sensor 1500 is shown and described as a motion detector to motion rotation of the ring magnet 1510 in the illustrated embodiment, it is understood that other magnetic field sensors, for example, current sensors, may include one or more of the MR elements according to the disclosure.

Additionally, while the MR elements 1502, 1504, 1506, 1508 are shown and described as formed in the shape of a yoke, it is understood that in some embodiments the MR element may instead be formed in the shape of a straight bar or a number of other shapes. For example, for a GMR element, the stack portions (e.g., first and second stack portions) of the GMR element may form a yoke shape. In contrast, for a TMR element, in some embodiments, selected portions of the TMR element (e.g., free layers of the stack portions) may have a yoke shape and remaining portions of the TMR element may have another shape (e.g., a straight bar). In some embodiments, one or more dimensions (e.g., a length, width and height) of the yoke or other shaped MR element may be based upon a number of layers and/or a thickness of the layers in the MR element.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A magnetoresistance element deposited upon a substrate, comprising:
   a first stack portion having opposing first and second surfaces and comprising a first plurality of layers, the first stack portion having a first substantially linear response corresponding to an applied magnetic field over a first magnetic field strength range;
   a second stack portion having opposing first and second surfaces and comprising a second plurality of layers, wherein the first surface of the second stack portion is disposed over the second surface of the first stack portion and the second stack portion has a second substantially linear response that is different than the first substantially linear response, the second substantially linear response corresponding to the applied magnetic field over a second magnetic field strength range; and
   a third stack portion having opposing first and second surfaces and comprising a third plurality of layers, wherein the first surface of the third stack portion is disposed over the second surface of the second stack portion and the third stack portion has a third substantially linear response that is different than the first substantially linear response and the second substantially linear response,
   wherein the first stack portion comprises a first pinned layer structure; a first spacer layer disposed over the first pinned layer structure; and a first free layer structure disposed over the first spacer layer,
   wherein the first spacer layer is comprised of a first material having a first thickness, the first material and the first thickness selected to result in the first stack portion having the first substantially linear response.

2. The magnetoresistance element of claim 1, wherein the first magnetic field strength range includes a negative magnetic field.

3. The magnetoresistance element of claim 1, wherein the second magnetic field strength range includes a positive magnetic field.

4. The magnetoresistance element of claim 1, wherein the first magnetic field strength range overlaps with one or more portions of the second magnetic field strength range.

5. The magnetoresistance element of claim 1, wherein each of the layers of the first stack portion has a respective thickness and the thickness of at least one of the layers of the first stack portion is selected to result in the first stack portion having the first substantially linear response.

6. The magnetoresistance element of claim 1, wherein each of the layers of the second stack portion has a respective thickness and the thickness of at least one of the layers of the second stack portion is selected to result in the second stack portion having the second substantially linear response.

7. The magnetoresistance element of claim 1, wherein an ordering of the first plurality of layers in the first stack portion is selected to result in the first stack portion having the first substantially linear response, and wherein an ordering of the second plurality of layers in the second stack portion is selected to result in the second stack portion having the second substantially linear response.

8. The magnetoresistance element of claim 1, wherein the first and second plurality of layers comprise a same number of layers.

9. The magnetoresistance element of claim 1, wherein the first and second plurality of layers comprise a different number of layers.

10. The magnetoresistance element of claim 1, wherein the magnetoresistance element is one of a giant magnetoresistance (GMR) element, a magnetic tunnel junction (MTJ) element and a tunneling magnetoresistance (TMR) element.

11. The magnetoresistance element of claim 1, wherein the magnetoresistance element is provided in a magnetic field sensor.

12. The magnetoresistance element of claim 1, wherein the first substantially linear response of the first stack portion results in the magnetoresistance element having a first sensitivity level to changes in magnetic field strength in response to the applied magnetic field being within the first magnetic field strength range,
   wherein the second substantially linear response of the second stack portion results in the magnetoresistance element having a second sensitivity level to changes in the magnetic field strength in response to the applied magnetic field being within the second magnetic field strength range, the second sensitivity level being different in comparison to the first sensitivity level,
   wherein the third substantially linear response of the third stack portion results in the magnetoresistance element having a third sensitivity level to changes in the magnetic field strength in response to the applied magnetic field being within the third magnetic field strength range, the third sensitivity level being different in comparison to the first and second sensitivity levels.

13. The magnetoresistance element of claim 1, wherein the second stack portion comprises a second pinned layer structure; a second spacer layer disposed over the second pinned layer structure; and a second free layer structure disposed over the second spacer layer, wherein the second spacer layer is comprised of a second material having a second thickness, the second material and the second thickness selected to result in the second stack portion having the second substantially linear response.

14. The magnetoresistance element of claim 13, wherein the first and second pinned layer structures include one respective pinned layer.

15. The magnetoresistance element of claim 13, wherein the first and second pinned layer structures each comprise a respective synthetic antiferromagnetic (SAF) structure.

16. The magnetoresistance element of claim 13, wherein the first and second spacer layers are comprised of Ruthenium (Ru).

17. The magnetoresistance element of claim 16, wherein the second selected thickness of the second spacer layer is in a range between about 1.6 nanometers (nm) to about 1.8 nm, about 2.2 nm to about 2.4 nm, about 2.9 nm to about 3.1 nm, or about 3.5 nm to about 3.7 nm.

18. The magnetoresistance element of claim 16, wherein the first selected thickness of the first spacer layer is about 1.3 nm, and wherein the second selected thickness of the second spacer layer is about 1.7 nm.

19. A magnetic field sensor, comprising:
a magnetoresistance element configured to generate first, second and third substantially linear responses to an applied magnetic field, wherein the first, second and third substantially linear responses have substantially zero offset with respect to an expected response of the magnetoresistance element at an applied magnetic field strength of about zero Oersteds,
wherein the magnetoresistance element comprises:
  a first stack portion having opposing first and second surfaces and comprising a first plurality of layers, the first stack portion having the first substantially linear response;
  a second stack portion having opposing first and second surfaces and comprising a second plurality of layers, wherein the first surface of the second stack portion is disposed over the second surface of the first stack portion and the second stack portion has the second substantially linear response that is different than the first substantially linear response; and
  a third stack portion having opposing first and second surfaces and comprising a third plurality of layers, wherein the first surface of the third stack portion is disposed over the second surface of the second stack portion and the third stack portion has a third substantially linear response that is different than the first substantially linear response and the second substantially linear response;
  a first electroconductive layer, the first electroconductive layer being in direct contact with the first surface of the second stack portion and being in direct contact with second surface of the first stack portion; and
  a second electroconductive layer, the second electroconductive layer being in direct contact with the first surface of the third stack portion and being in direct contact with second surface of the second stack portion,
wherein the first electroconductive layer is a pinning layer, and
wherein the second electroconductive layer is a pinning layer.

20. The magnetic field sensor of claim 19, wherein the first electroconductive layer comprises platinum manganese (PtMn).

21. The magnetic field sensor of claim 19, wherein the first and second substantially linear responses are provided at least in part from the first electroconductive layer.

22. The magnetic field sensor of claim 19, wherein the first substantially linear response of the first stack portion results in the magnetoresistance element having a first sensitivity level to changes in magnetic field strength in response to the applied magnetic field being within the first magnetic field strength range,
wherein the second substantially linear response of the second stack portion results in the magnetoresistance element having a second sensitivity level to changes in the magnetic field strength in response to the applied magnetic field being within the second magnetic field strength range, the second sensitivity level being different in comparison to the first sensitivity level,
wherein the third substantially linear response of the third stack portion results in the magnetoresistance element having a third sensitivity level to changes in the magnetic field strength in response to the applied magnetic field being within the third magnetic field strength range, the third sensitivity level being different in comparison to the first and second sensitivity levels.

23. The magnetic field sensor of claim 19, wherein the first magnetic field strength range overlaps with one or more portions of the second magnetic field strength range.

24. The magnetic field sensor of claim 19, wherein each of the layers of the first stack portion has a respective thickness and the thickness of at least one of the layers of the first stack portion is selected to result in the first stack portion having the first substantially linear response.

25. The magnetic field sensor of claim 19, wherein each of the layers of the second stack portion has a respective thickness and the thickness of at least one of the layers of the second stack portion is selected to result in the second stack portion having the second substantially linear response.

26. The magnetic field sensor of claim 19, wherein an ordering of the first plurality of layers in the first stack portion is selected to result in the first stack portion having the first substantially linear response, and wherein an ordering of the second plurality of layers in the second stack portion is selected to result in the second stack portion having the second substantially linear response.

27. The magnetic field sensor of claim 19, wherein the first and second plurality of layers comprise a same number of layers.

28. The magnetic field sensor of claim 19, wherein the first and second plurality of layers comprise a different number of layers.

29. A magnetoresistance element deposited upon a substrate, comprising:
  a first stack portion having opposing first and second surfaces and comprising a first plurality of layers, the first stack portion having a first substantially linear response corresponding to an applied magnetic field over a first magnetic field strength range;
  a second stack portion having opposing first and second surfaces and comprising a second plurality of layers, wherein the first surface of the second stack portion is disposed over the second surface of the first stack portion and the second stack portion has a second substantially linear response that is different than the first substantially linear response, the second substantially linear response corresponding to the applied magnetic field over a second magnetic field strength range;

a third stack portion having opposing first and second surfaces and comprising a third plurality of layers, wherein the first surface of the third stack portion is disposed over the second surface of the second stack portion and the third stack portion has a third substantially linear response that is different than the first substantially linear response and the second substantially linear response;

a first electroconductive layer, the first electroconductive layer being in direct contact with the first surface of the second stack portion and being in direct contact with second surface of the first stack portion; and a second electroconductive layer, the second electroconductive layer being in direct contact with the first surface of the third stack portion and being in direct contact with second surface of the second stack portion, wherein the first electroconductive layer is a pinning layer, and wherein the second electroconductive layer is a pinning layer.

30. The magnetoresistance element of claim 29, wherein the first electroconductive layer comprises platinum manganese (PtMn).

31. The magnetoresistance element of claim 29, wherein the first and second substantially linear responses are provided at least in part from the first electroconductive layer.

32. The magnetoresistance element of claim 29, wherein the first magnetic field strength range overlaps with one or more portions of the second magnetic field strength range.

33. The magnetoresistance element of claim 29, wherein each of the layers of the first stack portion has a respective thickness and the thickness of at least one of the layers of the first stack portion is selected to result in the first stack portion having the first substantially linear response.

34. The magnetoresistance element of claim 29, wherein each of the layers of the second stack portion has a respective thickness and the thickness of at least one of the layers of the second stack portion is selected to result in the second stack portion having the second substantially linear response.

35. The magnetoresistance element of claim 29, wherein an ordering of the first plurality of layers in the first stack portion is selected to result in the first stack portion having the first substantially linear response, and wherein an ordering of the second plurality of layers in the second stack portion is selected to result in the second stack portion having the second substantially linear response.

36. The magnetoresistance element of claim 29, wherein the first and second plurality of layers comprise a same number of layers.

37. The magnetoresistance element of claim 29, wherein the first and second plurality of layers comprise a different number of layers.

38. A magnetoresistance element deposited upon a substrate, comprising:

a first stack portion having opposing first and second surfaces and comprising a first plurality of layers, the first stack portion having a first substantially linear response corresponding to an applied magnetic field over a first magnetic field strength range, wherein the first stack portion comprises:

a first pinned layer structure;

a first free layer structure in direct contact with a cap layer; and a first spacer layer in contact with the first pinned layer structure and the first free layer structure;

a second stack portion having opposing first and second surfaces and comprising a second plurality of layers, wherein the first surface of the first stack portion is disposed over the second surface of the second stack portion and the second stack portion has a second substantially linear response that is different than the first substantially linear response, the second substantially linear response corresponding to the applied magnetic field over a second magnetic field strength range, the second stack portion comprises:

a second pinned layer structure;

a second free layer structure in direct contact with a seed layer; and a second spacer layer in contact with the second pinned layer structure and the second free layer structure.

39. The magnetoresistance element of claim 38, further comprising an electroconductive layer, the electroconductive layer being in direct contact with the first surface of the second stack portion and being in direct contact with second surface of the first stack portion, wherein the electroconductive layer is a pinning layer.

* * * * *